(12) United States Patent
Choi et al.

(10) Patent No.: US 11,957,044 B2
(45) Date of Patent: Apr. 9, 2024

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Jongwon Choi, Yongin-si (KR); Sukekazu Aratani, Hwaseong-si (KR); Kum Hee Lee, Suwon-si (KR); Banglin Lee, Suwon-si (KR); Hyeonho Choi, Seoul (KR); Seungyeon Kwak, Suwon-si (KR); Yoonhyun Kwak, Seoul (KR); Sangdong Kim, Seongnam-si (KR); Jiwhan Kim, Suwon-si (KR); Chul Baik, Seoul (KR); Yongsuk Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 864 days.

(21) Appl. No.: 16/120,916

(22) Filed: Sep. 4, 2018

(65) Prior Publication Data

US 2019/0074457 A1 Mar. 7, 2019

(30) Foreign Application Priority Data

Sep. 5, 2017 (KR) .................. 10-2017-0113560
Sep. 3, 2018 (KR) .................. 10-2018-0104722

(51) Int. Cl.
*C07F 15/00* (2006.01)
*C09K 11/06* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC ...... C09K 11/06; C09K 2211/182–188; C09K 2211/1033; C09K 2211/1037;
(Continued)

(56) References Cited

U.S. PATENT DOCUMENTS 6,465,115 B2 10/2002 Shi et al.
6,596,415 B2 7/2003 Shi et al.
(Continued)

FOREIGN PATENT DOCUMENTS

CN 1875026 A 12/2006
CN 105481906 A 4/2016
(Continued)

OTHER PUBLICATIONS

Machine Translation of Chen et al. (CN 108276452 A) from Espacenet.com. (Year: 2018).*

(Continued)

*Primary Examiner* — Jennifer A Boyd
*Assistant Examiner* — Rachel Simbana
(74) *Attorney, Agent, or Firm* — CANTOR COLBURN LLP

(57) ABSTRACT

An organometallic compound represented by Formula 1:

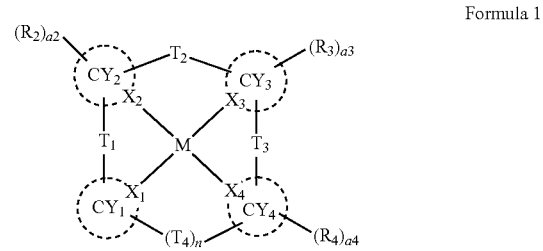

Formula 1 wherein, in Formula 1, groups and variables are the same as described in the specification.

19 Claims, 3 Drawing Sheets

(51) Int. Cl.
  *H10K 50/11* (2023.01)
  *H10K 50/12* (2023.01)
  *H10K 50/15* (2023.01)
  *H10K 50/16* (2023.01)
  *H10K 50/17* (2023.01)
  *H10K 50/18* (2023.01)
  *H10K 85/30* (2023.01)
  *H10K 101/10* (2023.01)
  *H10K 102/00* (2023.01)

(52) U.S. Cl.
  CPC ............... *C09K 2211/1033* (2013.01); *C09K 2211/1037* (2013.01); *C09K 2211/1044* (2013.01); *C09K 2211/1092* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02); *H10K 2102/3026* (2023.02); *H10K 2102/3035* (2023.02)

(58) Field of Classification Search
  CPC .... C09K 2211/1044; C09K 2211/1092; C09K 2211/185; H01L 51/0087; H01L 51/0077–0089; H01L 51/0091–0092; C07F 5/00; C07F 5/003; C07F 5/06–069; C07F 7/00; C07F 7/003; C07F 7/22–28; C07F 9/00; C07F 9/005; C07F 15/0086; H10K 85/341; H10K 85/346
  See application file for complete search history.

(56) References Cited

U.S. PATENT DOCUMENTS

| | | | |
|---|---|---|---|
| 7,442,797 B2 | 10/2008 | Itoh et al. | |
| 10,214,551 B2 | 2/2019 | Kottas et al. | |
| 10,381,580 B2 | 8/2019 | Xia et al. | |
| 2001/0019782 A1 | 9/2001 | Igarashi et al. | |
| 2006/0134461 A1 | 6/2006 | Huo et al. | |
| 2007/0103060 A1* | 5/2007 | Itoh | C07D 213/74 313/504 |
| 2008/0145526 A1* | 6/2008 | Mao | G01N 33/6839 546/10 |
| 2009/0079340 A1* | 3/2009 | Kinoshita | H10K 85/346 548/103 |
| 2013/0082245 A1 | 4/2013 | Kottas et al. | |
| 2013/0116755 A1* | 5/2013 | Anemian | H05B 33/00 607/88 |
| 2015/0097169 A1* | 4/2015 | Xia | C07F 15/0033 257/40 |
| 2015/0115250 A1 | 4/2015 | Ma et al. | |
| 2016/0013431 A1 | 1/2016 | Choi et al. | |
| 2020/0203637 A1* | 6/2020 | Yam | C07F 1/00 |
| 2022/0093880 A1 | 3/2022 | Choi et al. | |

FOREIGN PATENT DOCUMENTS

| | | | | |
|---|---|---|---|---|
| CN | 105505378 A | * | 4/2016 | ......... C07F 15/0033 |
| CN | 105505378 A | | 4/2016 | |
| CN | 108276452 A | * | 7/2018 | ......... C07F 15/0033 |
| JP | 2000003782 A | | 1/2000 | |
| JP | 2008103535 A | | 5/2008 | |
| JP | 2008239759 A | * | 10/2008 | ............ C09K 11/06 |
| JP | 2009267244 A | * | 11/2009 | |
| JP | 2013023500 A | | 2/2013 | |
| JP | 2014507444 A | | 3/2014 | |
| JP | 2017039715 A | | 2/2017 | |
| KR | 2013-0043459 A | | 4/2013 | |
| KR | 1020140111166 A | | 9/2014 | |
| KR | 2015-0050383 A | | 5/2015 | |
| WO | 2005042444 A3 | | 5/2005 | |
| WO | 2012-116231 A2 | | 8/2012 | |
| WO | 2012-162488 A1 | | 11/2012 | |
| WO | 2012162488 A1 | | 11/2012 | |

OTHER PUBLICATIONS

Machine Translation of Ding et al. (CN 105505378 A) from Espacenet.com. (Year: 2016).*
Machine Translation of Kato et al. (JP 2008239759 A) from Espacenet.com. (Year: 2008).*
CN-105505378 A—translation (Year: 2016).*
JP-2009267244-A—translation (Year: 2009).*
JP-2008239759A—translation (Year: 2008).*
M. A. Baldo et al. "Highly efficient phosphorescent emission from organic electroluminescent devices", Nature, 1998, 395, 151 (4 pp).
M.A. Baldo et al. "Very high-efficiency green organic light-emitting devices based on electrophosphorescence", Appl. Phys. Lett. 1999, 75(3), 4 (4 pp).
Raymond C. Kwong et al. "High operational stability of electrophosphorescent devices", Applied Physics Letters 2002, 81, 162 (4 pp).
Sergey Lamansky et al. "Highly Phosphorescent Bis-Cyclometalated Iridium Complexes: Synthesis, Photophysical Characterization, and Use in Organic Light Emitting Diodes", J. Am. Chem. Soc. 2001, 123, 4304.
Sergey Lamansky et al. "Synthesis and Characterization of Phosphorescent Cyclometalated Iridium Complexes", Inorg. Chem. 2001, 40, 1704.
Wen-Jie Qi et al. "Ultrathin ziriconium silicate film with good thermal stability for alternative gate dielectric application", Applied Physics Letters, 2000, 77, 1704 (4 pp).
Extended European Search Report issued by the European Patent Office dated Jan. 7, 2019, in the examination of the European patent Application No. 18192427.5-1109.
English Abstract of CN 105481906.
English Abstract of CN 105505378.
English Abstract of JP 2008103535.
English Abstract of KR 10-20140111166.
English Translation of Office Action dated Aug. 3, 2022, issued in corresponding CN Patent Application No. 201811031517.1, 8 pp.
English Translation of Office Action dated Jul. 5, 2022, issued in JP Patent Application No. 2018-165356, 2 pp.
Office Action dated Aug. 3, 2022, issued in corresponding CN Patent Application No. 201811031517.1, 6 pp.
Office Action ddated Jul. 5, 2022, issued in JP Patent Application No. 2018-165356, 3 pp.

* cited by examiner

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application claims priority to Korean Patent Applications Nos. 10-2017-0113560, filed on Sep. 5, 2017, and 10-2018-0104722, filed on Sep. 3, 2018, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the same, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

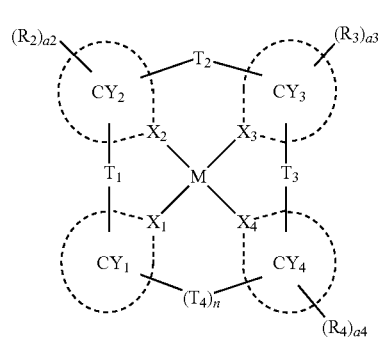

Formula 1

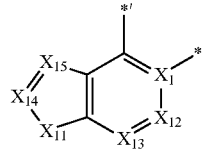

A1-1

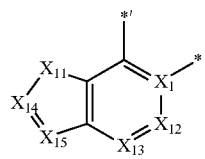

A1-2

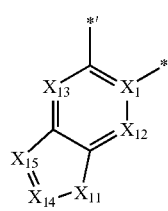

A1-3

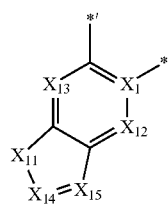

A1-4

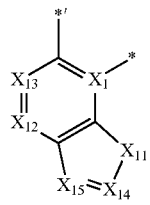

A1-5

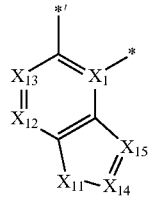

A1-6

-continued

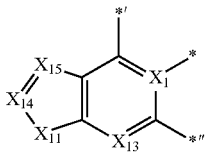
A11-1

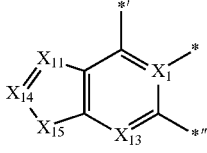
A11-2

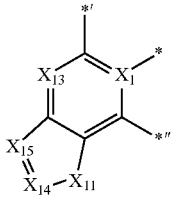
A11-3

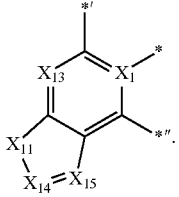
A11-4

In Formula 1, M may be a transition metal,
in Formula 1, $X_1$ may be nitrogen (N),
in Formula 1, $X_2$ to $X_4$ may each independently be carbon (C) or N,
in Formula 1, a bond between $X_1$ and M may be a coordinate bond, and one bond selected from a bond between $X_2$ and M, a bond between $X_3$ and M, and a bond between $X_4$ and M may be a coordinate bond while the remaining two bonds are each independently a covalent bond,
in Formula 1, n is 0 or 1, wherein, when n is 0, $CY_1$ and $CY_4$ may not be linked each other,
in Formula 1, i) when n is 0, $CY_1$ may be a group represented by one selected from Formulae A1-1 to A1-6, and ii) when n is 1, $CY_1$ may be a group represented by one selected from Formulae A11-1 to A11-4,
in Formulae A1-1 to A1-6 and A11-1 to A11-4,
i) $X_{11}$ may be *—N[$(L_{11})_{c11}$—$(R_{11})$]—*', *—B$(R_{11})$—*', *—P$(R_{11})$—*', *—C$(R_{11a})(R_{11b})$—*', *—Si$(R_{11a})(R_{11b})$—*', *—Ge$(R_{11a})(R_{11b})$—*', *—S—*', *—Se—*', *—O—*', *—C(=O)—*', *—S(=O)—*', *—S(=O)$_2$—*', or *—C(=S)—*', $X_{12}$ may be C($R_{12}$) or N, $X_{13}$ may be C($R_{13}$) or N, $X_{14}$ may be C($R_{14}$) or N, and $X_{15}$ may be C($R_{15}$) or N,
ii) when $X_{14}$ is C($R_{14}$) and $X_{15}$ is C($R_{15}$), $R_{14}$ and $R_{15}$ may not be linked each other,
iii) $R_{11a}$ and $R_{11b}$ may optionally be linked each other via a second linking group to form a substituted or unsubstituted $C_5$-$C_{30}$ carbocyclic group or a substituted or unsubstituted $C_1$-$C_{30}$ heterocyclic group,
in Formulae A1-1 to A1-6 and A11-1 to A11-4, * may indicate a binding site to M in Formula 1, *' may indicate a binding site to $T_1$ in Formula 1, and *'' may indicate a binding site to $T_4$ in Formula 1,
in Formula 1, $CY_2$ to $CY_4$ may each independently be selected from a $C_5$-$C_{30}$ carbocyclic group and a $C_1$-$C_{30}$ heterocyclic group, in Formula 1, $T_1$ to $T_4$ may each independently be selected from a single bond, a double bond, *—N[$(L_5)_{c5}$-$(R_5)$]—*', *—B$(R_5)$—*', *—P$(R_5)$—*', *—C$(R_5)(R_6)$—*', *—Si$(R_5)(R_6)$—*', *—Ge$(R_5)(R_6)$—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', wherein $R_5$ and $R_6$ may optionally be linked each other via a first linking group to form a substituted or unsubstituted $C_5$-$C_{30}$ carbocyclic group or a substituted or unsubstituted $C_1$-$C_{30}$ heterocyclic group,
$L_5$ and $L_{11}$ may each independently be selected from a single bond, a substituted or unsubstituted $C_5$-$C_{30}$ carbocyclic group and a substituted or unsubstituted $C_1$-$C_{30}$ heterocyclic group,
c5 and c11 may each independently be an integer from 1 to 3, wherein, when c5 is two or more, two or more of groups $L_5$ may be identical to or different from each other, and when c11 is two or more, two or more of groups $L_{11}$ may be identical to or different from each other,
$R_2$ to $R_6$, $R_{11}$ to $R_{15}$, $R_{11a}$, and $R_{11b}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$),
in Formula 1, a2 to a4 may each independently be an integer from 0 to 20,
in Formula 1, two or more selected from groups $R_2$ in the number of a2 may optionally be linked each other to form a substituted or unsubstituted $C_5$-$C_{30}$ carbocyclic group or a substituted or unsubstituted $C_1$-$C_{30}$ heterocyclic group,
in Formula 1, two or more selected from groups $R_3$ in the number of a3 may optionally be linked each other to form a substituted or unsubstituted $C_5$-$C_{30}$ carbocyclic group or a substituted or unsubstituted $C_1$-$C_{30}$ heterocyclic group,
in Formula 1, two or more selected from groups $R_4$ in the number of a4 may optionally be linked each other to form a substituted or unsubstituted $C_5$-$C_{30}$ carbocyclic group or a substituted or unsubstituted $C_1$-$C_{30}$ heterocyclic group,
in Formula 1, two or more of $R_2$ to $R_4$ may optionally be linked each other to form a substituted or unsubstituted $C_5$-$C_{30}$ carbocyclic group or a substituted or unsubstituted $C_1$-$C_{30}$ heterocyclic group,
in Formula 1, one of $R_5$ and $R_6$ and one of $R_2$ to $R_4$ may optionally be linked each other to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_7$-$C_{60}$ aryl alkyl group, the substituted $C_1$-$C_{60}$ heteroaryl group, the substituted $C_2$-$C_{60}$ alkyl heteroaryl group, the substituted $C_1$-$C_{60}$ heteroaryloxy group, the substituted $C_1$-$C_{60}$ heteroarylthio group, the $C_2$-$C_{60}$ heteroaryl alkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$;

$Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group.

Another aspect of the present disclosure provides an organic light-emitting device including:

a first electrode, a second electrode, and an organic layer disposed between the first electrode and the second electrode and including an emission layer, wherein the organic layer includes at least one of the organometallic compound.

The organometallic compound may act as a dopant in the organic layer.

Another aspect of the present disclosure provides a diagnostic composition including at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
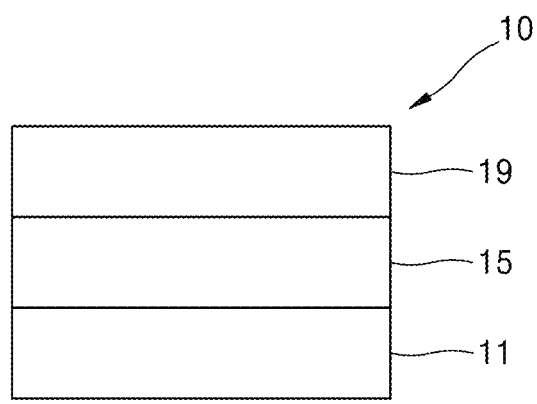
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment is represented by Formula 1:

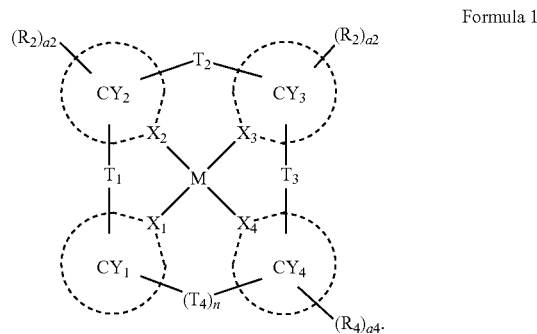

Formula 1

In Formula 1, M may be a transition metal. For example, in formula 1, M may be a first-row transition metal of the Periodic Table of Elements, a second-row transition metal of the Periodic Table of Elements, or a third-row transition metal of the Periodic Table of Elements.

For example, M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

In an embodiment, M may be Pt, Pd, or Au, but embodiments of the present disclosure are not limited thereto.

In Formula 1, $X_1$ may be N, and $X_2$ to $X_4$ may each independently be carbon (C) or nitrogen (N).

For example, in Formula 1, i) $X_2$ and $X_3$ may each independently be C, and $X_4$ may be N; ii) $X_2$ and $X_4$ may each independently be C, and $X_3$ may be N, but embodiments of the present disclosure are not limited thereto.

In Formula 1, a bond between $X_1$ and M may be a coordinate bond, and one bond selected from a bond between $X_2$ and M, a bond between $X_3$ and M, and a bond between $X_4$ and M may be a coordinate bond while the remaining two bonds may each independently be a covalent bond, and in this regard, the organometallic compound represented by Formula 1 may be electrically neutral. In this regard, for example, the organometallic compound represented by Formula 1 may be clearly distinguished from a virtual organometallic compound that is not electrically neutral, in a way that: i) in Formula 1, one bone selected from a bond between $X_1$ and M, a bond between $X_2$ and M, a bond between $X_3$ and M, and a bond between $X_4$ and M may be a covalent bond while the remaining three bonds may each independently be a coordinate bond; or ii) in Formula 1, three bonds selected from a bond between $X_1$ and M, a bond between $X_2$ and M, a bond between $X_3$ and M, and a bond between $X_4$ and M may each independently be a covalent bond while the remaining one bond may be a coordinate bond.

For example, in Formula 1, i) a bond between $X_1$ and M and a bond between $X_4$ and M may each independently be a coordinate bond, and a bond between $X_2$ and M and a bond between $X_3$ and M may each independently be a covalent bond; or ii) a bond between $X_1$ and M and a bond between $X_3$ and M may each independently be a coordinate bond, and a bond between $X_2$ and M and a bond between $X_4$ and M may each independently be a covalent bond.

In one or more embodiments, in Formula 1,
M may be Pt, Pd, or Au,
$X_4$ may be N,
a bond between $X_4$ and M may be a coordinate bond, but embodiments of the present disclosure are not limited thereto.

In Formula 1, n may be 0 or 1, wherein, when n is 0, $CY_1$ and $CY_4$ may not be linked each other.

In Formula 1, i) when n is 0, $CY_1$ may be a group represented by one selected from Formulae A1-1 to A1-6, and ii) when n is 1, $CY_1$ may be a group represented by one selected from Formulae A11-1 to A11-4. In Formulae A1-1 to A1-6 and A11-1 to A11-4, $X_{11}$ may be *—N[(L$_{11}$)$_{c11}$-(R$_{11}$)]—*', *—B(R$_{11}$)—*', *—P(R$_{11}$)—*', *—C(R$_{11a}$)(R$_{11b}$)—*', *—Si(R$_{11a}$)(R$_{11b}$)—*', *—Ge(R$_{11a}$)(R$_{11b}$)—*', *—S—*', *—Se—*', *—O—*', *—C(=O)—*', *—S(=O)—*', *—S(=O)$_2$—*', or *—C(=S)—*', $X_{12}$ may be $C(R_{12})$ or N, $X_{13}$ may be $C(R_{13})$ or N, $X_{14}$ may be $C(R_{14})$ or N, and $X_{15}$ may be $C(R_{15})$ or N:

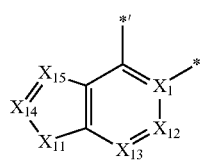

A1-1

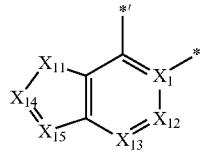

A1-2

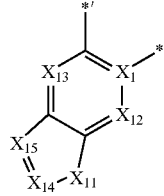

A1-3

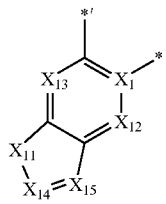

A1-4

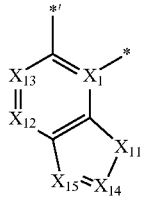

A1-5

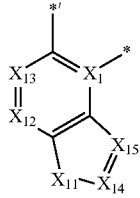

A1-6

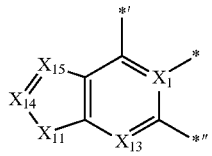

A11-1

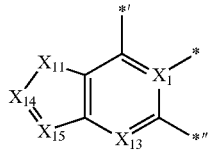

A11-2

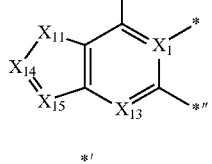

A11-3

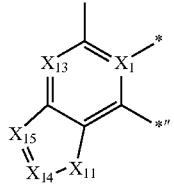

A11-4

For example, in Formulae A1-1 to A1-6 and A11-1 to A11-4, $X_{12}$ may be $C(R_{12})$, $X_{13}$ may be $C(R_{13})$, $X_{14}$ may be $C(R_{14})$, and $X_{15}$ may be $C(R_{15})$.

In an embodiment, in Formulae A1-1 to A1-6 and A11-1 to A11-4, $X_{14}$ may be $C(R_{14})$, $X_{15}$ may be $C(R_{15})$, and at least one selected from $R_{14}$ and $R_{15}$ may not be hydrogen.

In Formulae A1-1 to A1-6 and A11-1 to A11-4, when $X_{14}$ is $C(R_{14})$ and $X_{15}$ is $C(R_{15})$, $R_{14}$ and $R_{15}$ may not be linked each other. That is, in Formulae A1-1 to A1-6 and A11-1 to A11-4, when $X_{14}$ is $C(R_{14})$ and $X_{15}$ is $C(R_{15})$, $R_{14}$ and $R_{15}$ may not form a ring by linking each other.

In an embodiment, $R_{11a}$ and $R_{11b}$ may optionally be linked each other via a second linking group to form a substituted or unsubstituted $C_5$-$C_{30}$ carbocyclic group or a substituted or unsubstituted $C_1$-$C_{30}$ heterocyclic group. The second linking group may be the same as described in connection with the first linking group in the present specification.

Formulae A1-1 to A1-6 and A11-1 to A11-4 are described below.

In Formula 1, $CY_2$ to $CY_4$ may each independently be selected from a $C_5$-$C_{30}$ carbocyclic group and a $C_1$-$C_{30}$ heterocyclic group.

For example, in Formula 1, $CY_2$ to $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, a benzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

In one or more embodiments, in Formula 1, $X_2$ and $X_3$ may each independently be C, and $CY_2$ and $CY_3$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group, but embodiments of the present disclosure are not limited thereto.

In one or more embodiments, at least one selected from ring $CY_2$ to ring $CY_4$ may each independently be selected from condensed rings in which at least one 5-membered ring and at least one 6-membered ring are condensed each other, wherein the 5-membered ring may be selected from a cyclopentadiene group, a furan group, a thiophene group, a pyrrole group, a silole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the 6-membered ring may be selected from a cyclohexane group, a cyclohexene group, a benzene group, a pyridine group, a pyrimidine group, a pyrazine group, and a pyridazine group, but embodiments of the present disclosure are not limited thereto.

In one or more embodiments, in Formula 1, $CY_1$ and $CY_4$ may be identical to each other.

In one or more embodiments, in Formula 1, $CY_2$ and $CY_3$ may be identical to each other.

In Formula 1, $T_1$ to $T_4$ may each independently be selected from a single bond, a double bond, *—N[(L$_5$)$_{c5}$-(R$_5$)]—*', *—B(R$_5$)—*', *—P(R$_5$)—*', *—C(R$_5$)(R$_6$)—*', *—Si(R$_5$)(R$_6$)—*', *—Ge(R$_5$)(R$_6$)—*', *—S—*', *—Se—*', *—O—*', *—C(=O)—*', *—S(=O)—*', *—S(=O)$_2$—*', *—C(R$_5$)=—*', *=C(R$_5$)—*', *—C(R$_5$)=C(R$_6$)—*', *—C(=S)—*', and *—C≡C—*', wherein $R_5$ and $R_6$ may each independently be the same as described above, and may optionally be linked each other to form a substituted or unsubstituted $C_5$-$C_{30}$ carbocyclic group or a substituted or unsubstituted $C_1$-$C_{30}$ heterocyclic group via a single bond, a double bond, or a first linking group.

The first linking group may be selected from *—N(R$_9$)—*', *—B(R$_9$)—*', *—P(R$_9$)—*', *—C(R$_9$)(R$_{10}$)—*', *—Si(R$_9$)(R$_{10}$)—*', *—Ge(R$_9$)(R$_{10}$)—*', *—S—*', *—Se—*', *—O—*', *—C(=O)—*', *—S(=O)—*', *—S(=O)$_2$—*', *—C(R$_9$)=—*', *=C(R$_9$)—*', *—C(R$_9$)=C(R$_{10}$)—*', *—C(=S)—*', and *—C≡C—*', wherein $R_9$ and $R_{10}$ may each independently be the same as described in connection with $R_5$ in the present specification, and * and *' each independently indicate a binding site to a neighboring atom.

In an embodiment, $L_5$ and $L_{11}$ may each independently be selected from a single bond, a substituted or unsubstituted $C_5$-$C_{30}$ carbocyclic group, and a substituted or unsubstituted $C_1$-$C_{30}$ heterocyclic group.

For example, $L_5$ and $L_{11}$ may each independently be selected from:

a single bond, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyl dibenzosilolyl group, a diphenyl dibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_{31}$ to $Q_{39}$ may each independently be selected from:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CD$_2$CH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

Here, c5 and c11 indicate the number of $L_5$ and $L_{11}$, respectively, and may each independently be an integer from 1 to 3. In an embodiment, when c5 is two or more, two or more of groups $L_5$ may be identical to or different from each other, and when c11 is two or more, two or more of groups $L_{11}$ may be identical to or different from each other. For example, c5 and c11 may each independently be 1 or 2.

In an embodiment, in Formula 1, $T_1$ may be a single bond, $T_2$ may not be a single bond, and n may be 0.

In one or more embodiments, in Formula 1, at least one selected from $T_1$ to $T_4$ may each independently be selected from *—C($R_5$)($R_6$)—*', *—Si($R_5$)($R_6$)—*', and *—Ge($R_5$)($R_6$)—*', wherein $R_5$ and $R_6$ may be linked each other via a first linking group. Here, the first linking group may be the same as described above.

In Formula 1, $R_2$ to $R_6$, $R_{11}$ to $R_{15}$, $R_{11a}$, and $R_{11b}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$).

For example, $R_2$ to $R_6$, $R_{11}$ to $R_{15}$, $R_{11a}$, and $R_{11b}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ may each independently be selected from: —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CD$_2$CH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In one or more embodiments, $R_2$ to $R_6$, $R_{11}$ to $R_{15}$, $R_{11a}$, and $R_{11b}$ may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one selected from Formulae 9-1 to 9-19, a group represented by one selected from Formulae 10-1 to 10-186, and —Si($Q_3$)($Q_4$)($Q_5$) (wherein $Q_3$ to $Q_5$ may each independently be the same as described above), but embodiments of the present disclosure are not limited thereto:

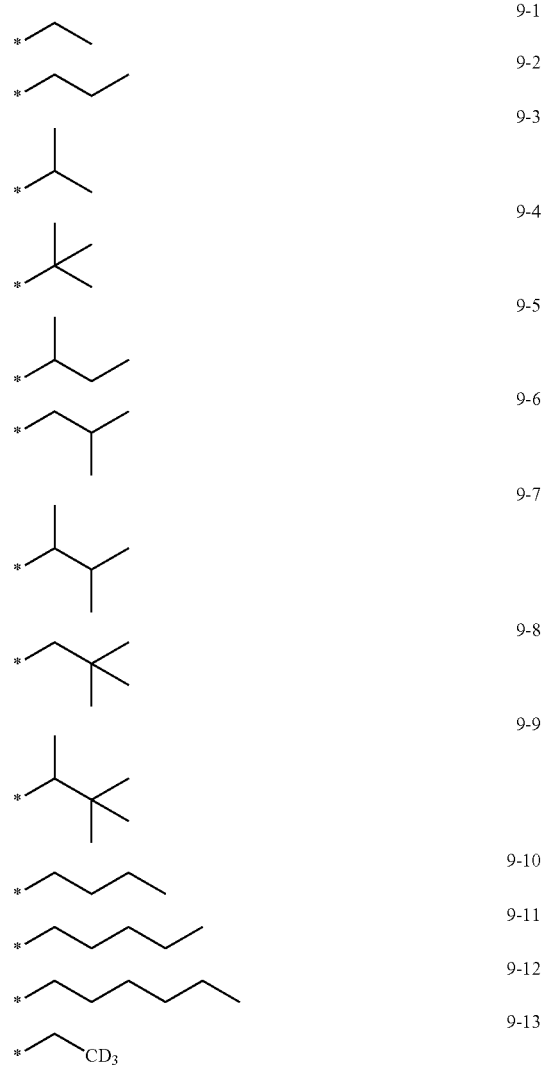

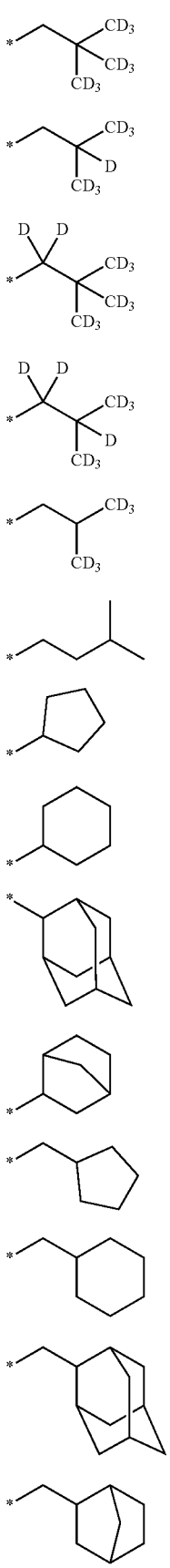
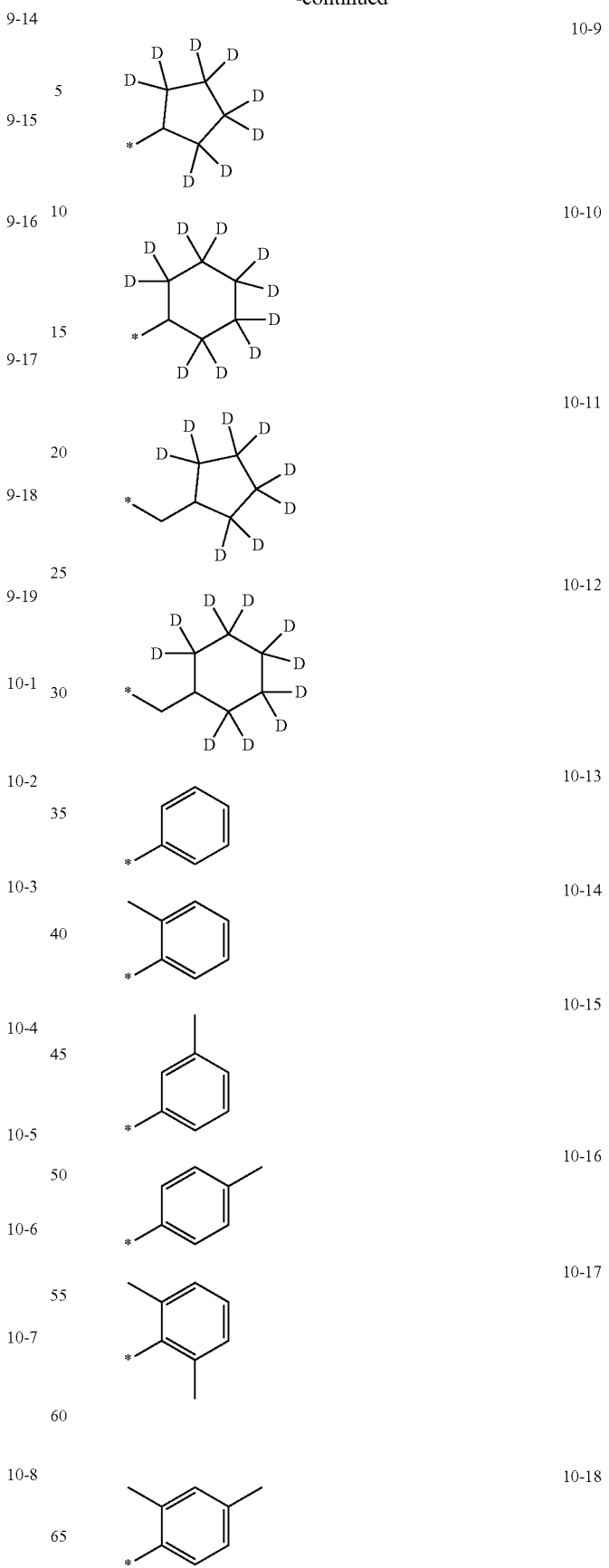

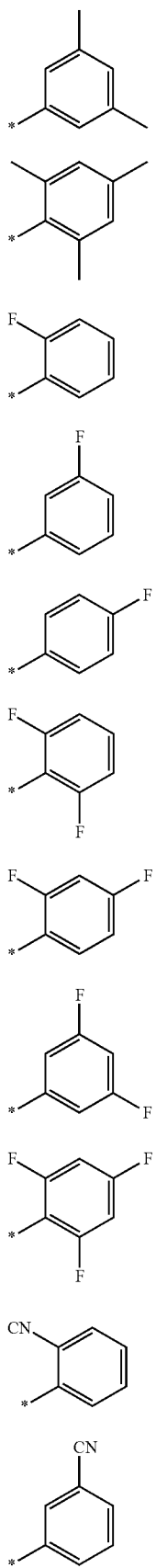
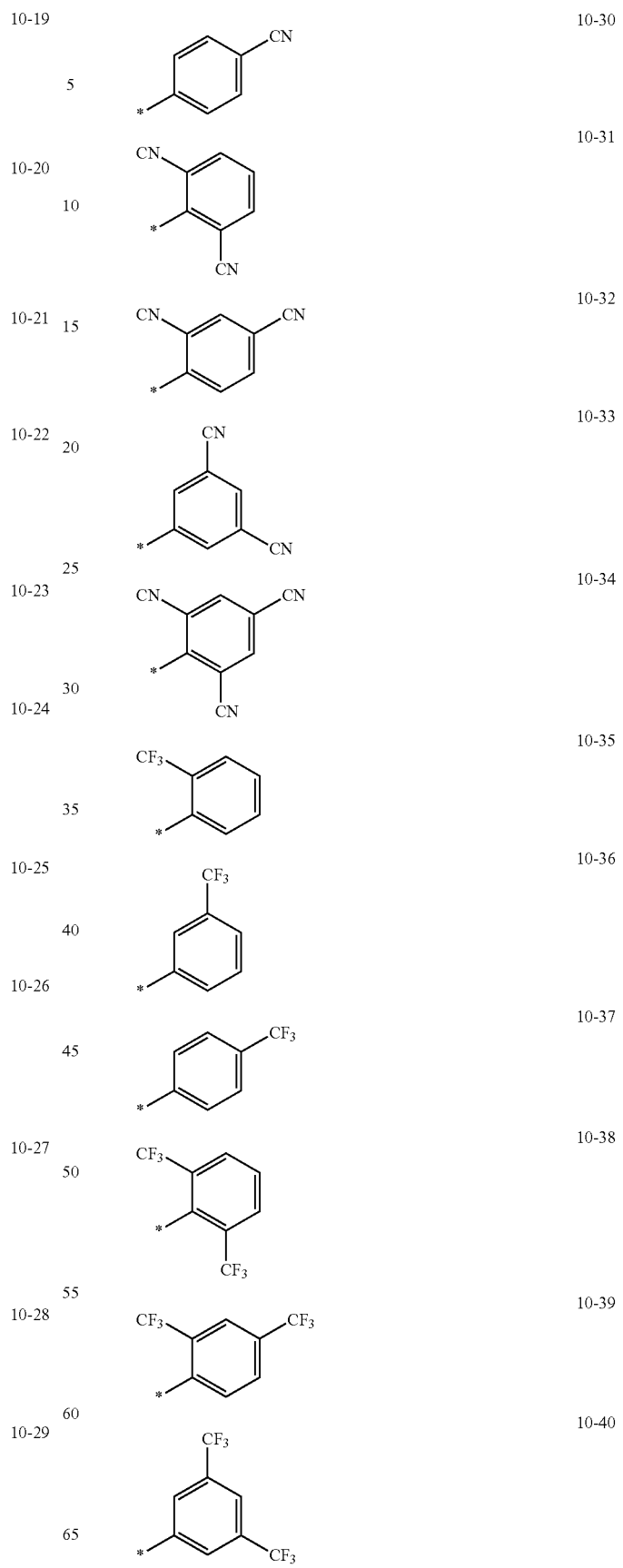

-continued
10-31 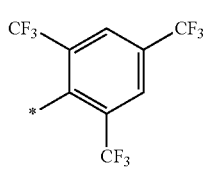
10-32 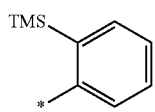
10-33 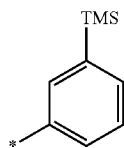
10-34 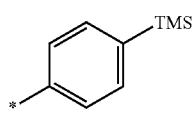
10-35 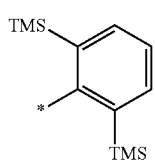
10-36 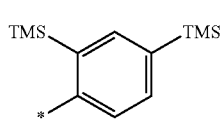
10-37 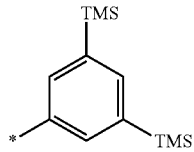
10-38 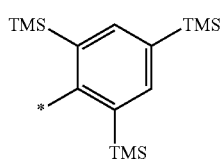
10-39 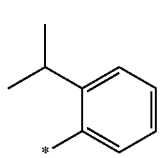
10-40 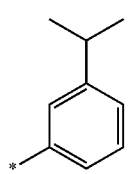
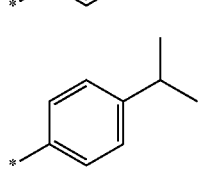
-continued
10-41 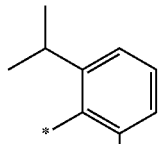
10-42 
10-43 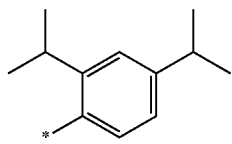
10-44 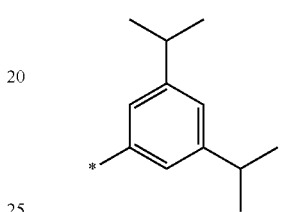
10-45 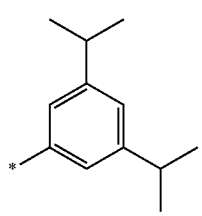
10-46 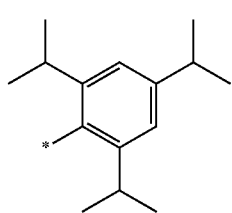
10-47 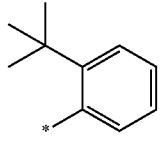
10-48 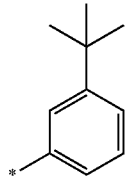
10-49
10-50 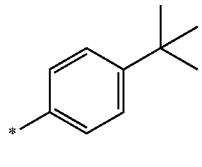
10-51 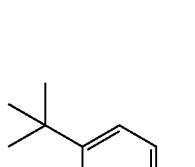
10-52
10-53
10-54
10-55
10-56
10-57
10-58
10-59 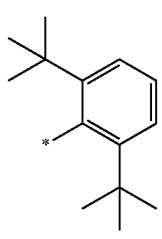

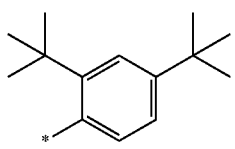
10-60
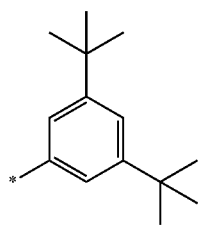
10-61
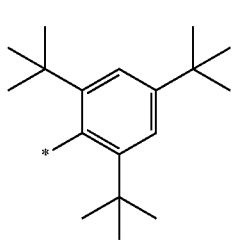
10-62
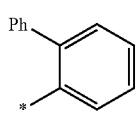
10-63
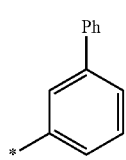
10-64
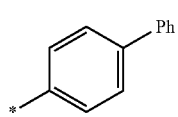
10-65
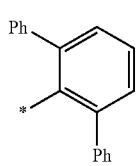
10-66
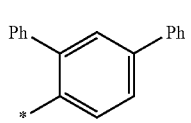
10-67
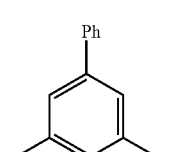
10-68
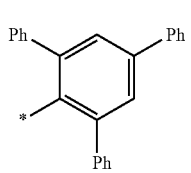
10-69
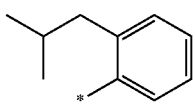
10-70
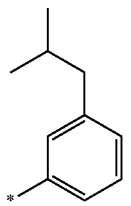
10-71
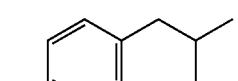
10-72
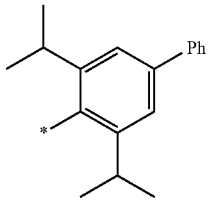
10-73
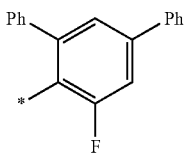
10-74
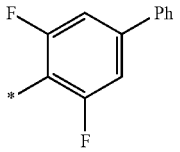
10-75
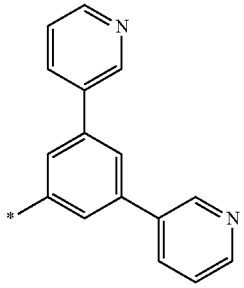
10-76
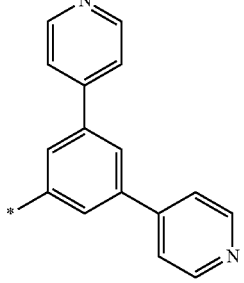
10-77

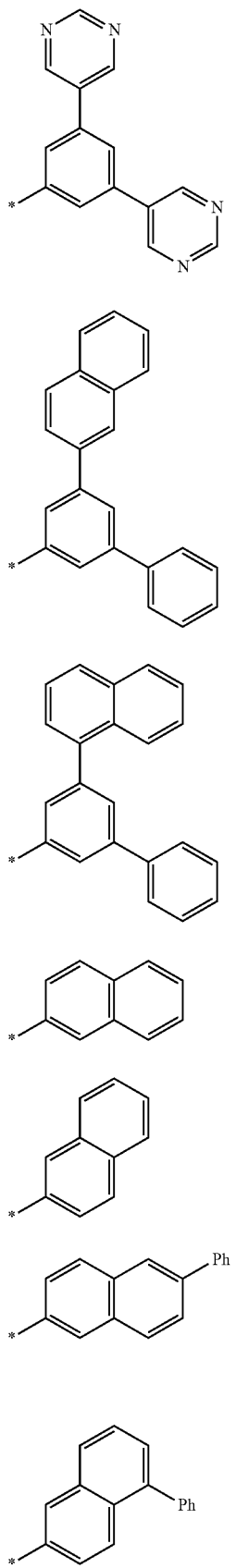
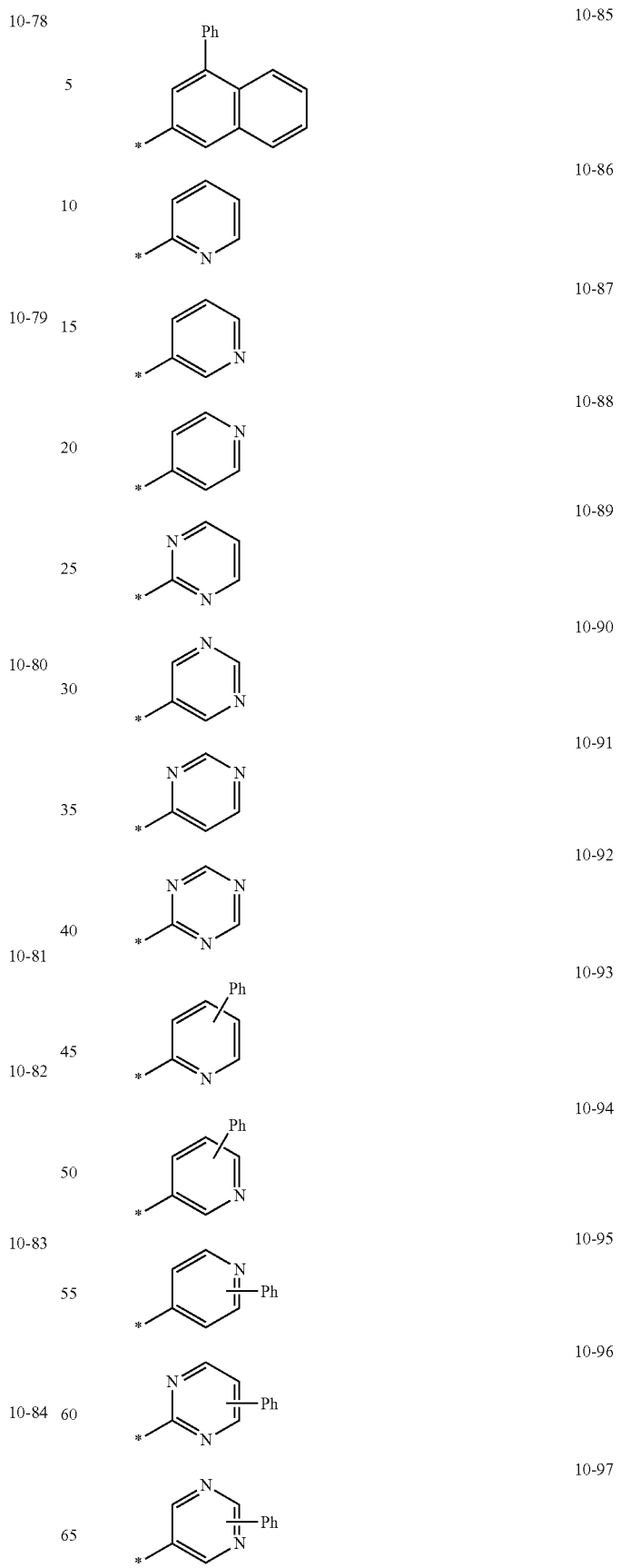

-continued
10-98 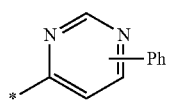
10-99 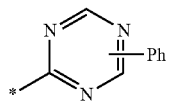
10-100 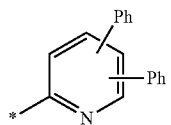
10-101 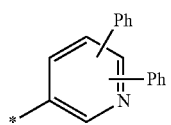
10-102 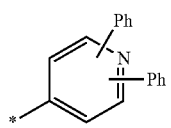
10-103 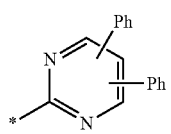
10-104 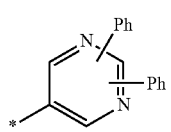
10-105 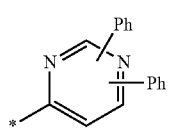
10-106 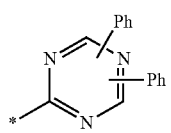
10-107 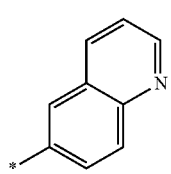
10-108 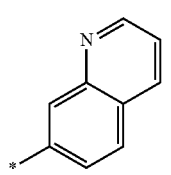
-continued
10-109 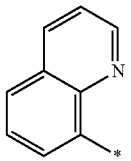
10-110 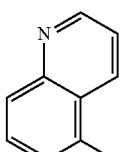
10-111 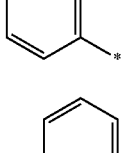
10-112 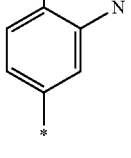
10-113 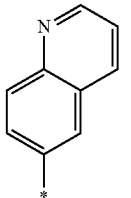
10-114 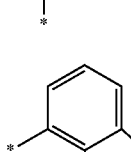
10-115 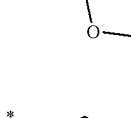
10-116 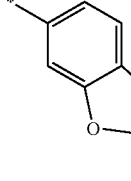

10-117 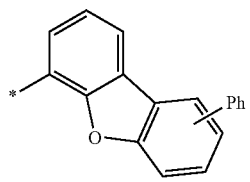
10-118 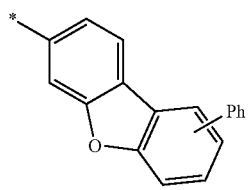
10-119 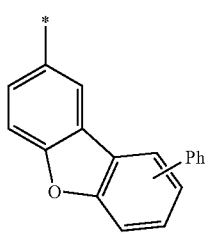
10-120 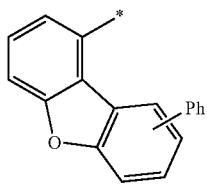
10-121 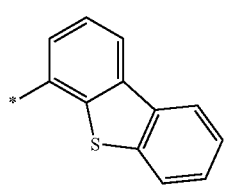
10-122 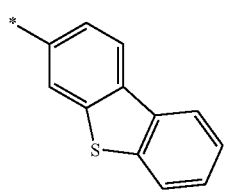
10-123 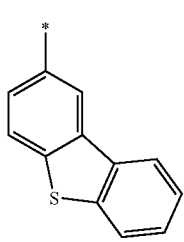
10-124 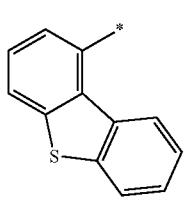
10-125 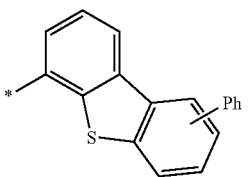
10-126 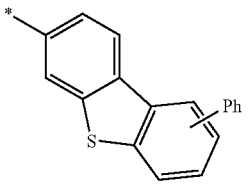
10-127 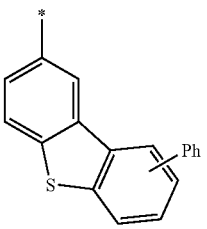
10-128 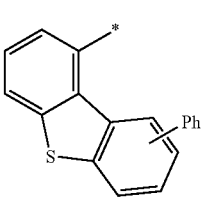
10-129 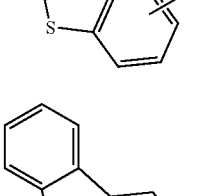
10-130 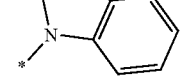
10-131 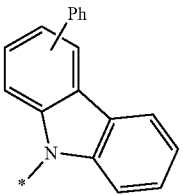
10-132 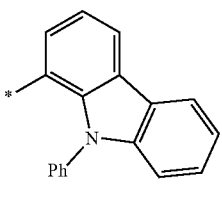
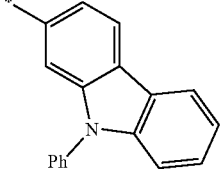

| | |
|---|---|
| 10-133 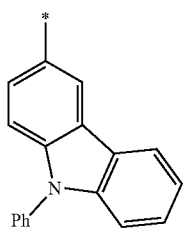 | 10-140 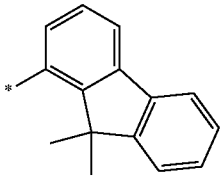 |
| 10-134 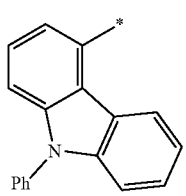 | 10-141 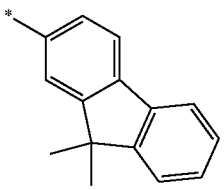 |
| 10-135 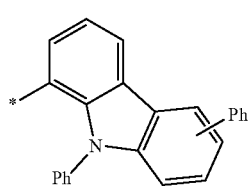 | 10-142 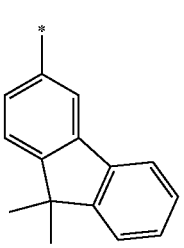 |
| 10-136 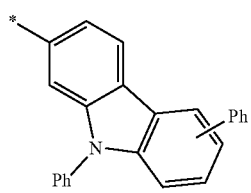 | 10-143 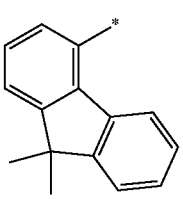 |
| 10-137 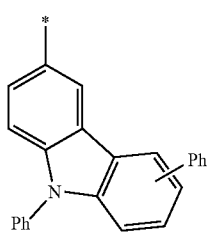 | 10-144 |
| 10-138 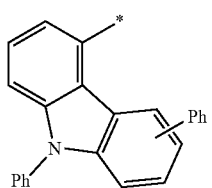 | 10-145 |
| 10-139 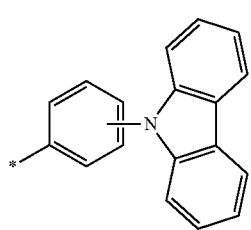 | 10-146 |

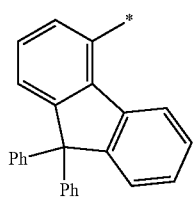
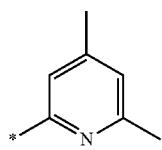
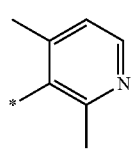
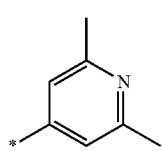
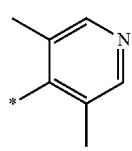
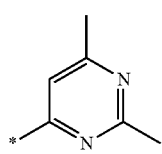
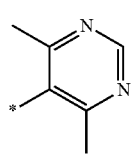
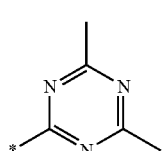
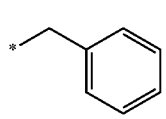
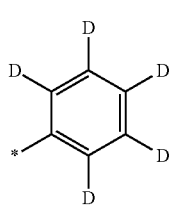
10-147
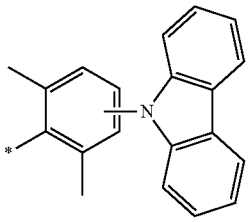
10-148
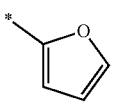
10-149
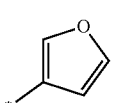
10-150
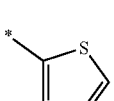
10-151
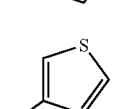
10-152
10-153
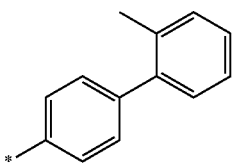
10-154
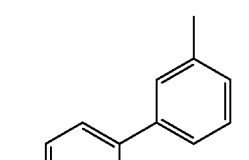
10-155
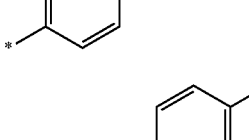
10-156
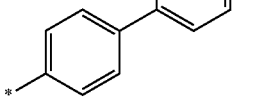
10-157
10-158
10-159
10-160
10-161
10-162
10-163
10-164
10-165
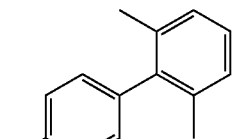
10-166
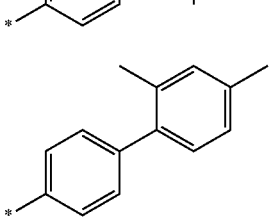

10-167 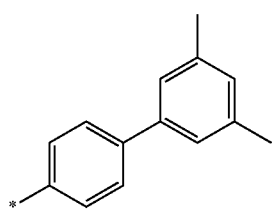
10-168 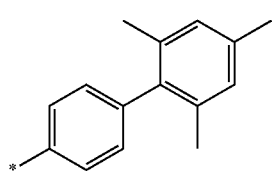
10-169 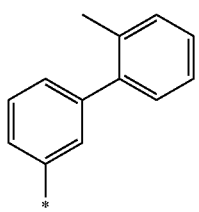
10-170 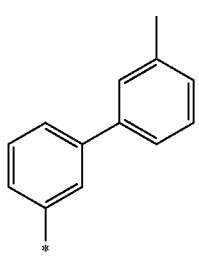
10-171 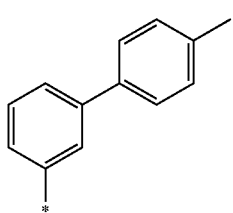
10-172 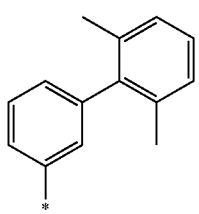
10-173 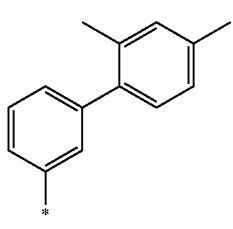
10-174 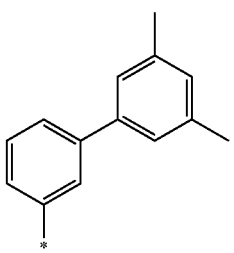
10-175 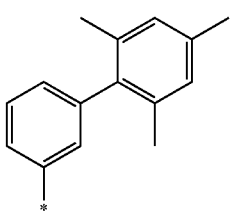
10-176 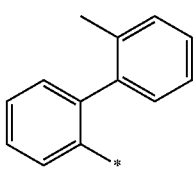
10-177 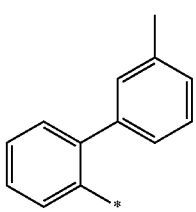
10-178 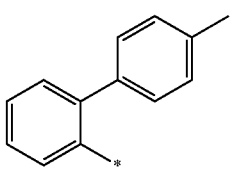
10-179 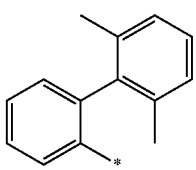
10-180 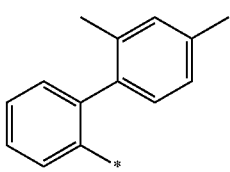
10-181 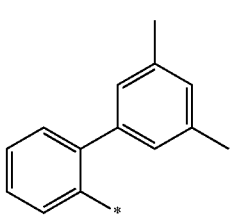

-continued

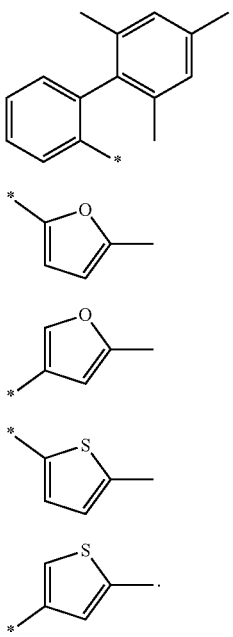

10-182

10-183

10-184

10-185

10-186

In Formulae 9-1 to 9-19 and 10-1 to 10-186, * indicates a binding site to a neighboring atom, Ph indicates a phenyl group, and TMS indicates a trimethylsilyl group.

In an embodiment, $R_5$ and $R_6$ may optionally be linked each other via a first linking group to form a substituted or unsubstituted $C_5$-$C_{30}$ carbocyclic group or a substituted or unsubstituted $C_1$-$C_{30}$ heterocyclic group, and $R_{11a}$ and $R_{11b}$ may optionally be linked each other via a second linking group to form a substituted or unsubstituted $C_5$-$C_{30}$ carbocyclic group or a substituted or unsubstituted $C_1$-$C_{30}$ heterocyclic group.

In Formula 1, a2 to a4 indicates the number of $R_2$ to $R_4$, respectively, and may each independently be an integer form 0 to 20 (for example, an integer from 0 to 4). When a2 is two or more, a plurality of groups $R_2$ may be identical to or different from each other. When a3 is two or more, a plurality of groups $R_3$ may be identical to or different from each other. When a4 is two or more, a plurality of groups $R_4$ may be identical to or different from each other.

In an embodiment, a moiety represented by

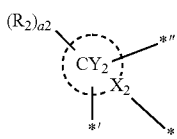

in Formula 1 may be represented by one selected from Formulae A2-1(1) to A2-1(21):

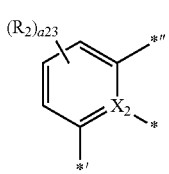

A2-1(1)

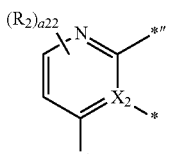

A2-1(2)

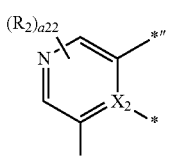

A2-1(3)

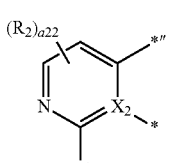

A2-1(4)

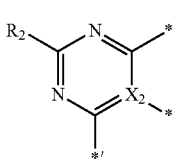

A2-1(5)

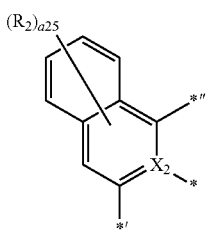

A2-1(6)

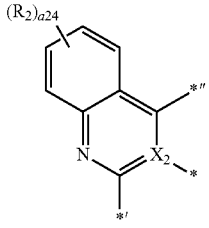

A2-1(7)

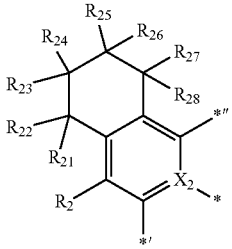

A2-1(8)

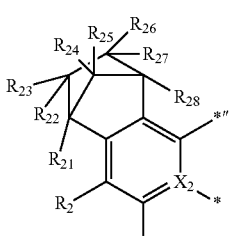

A2-1(9)

A2-1(10) 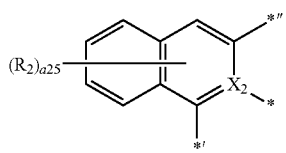

A2-1(11) 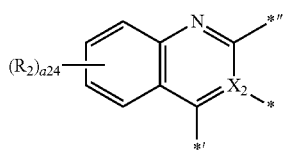

A2-1(12) 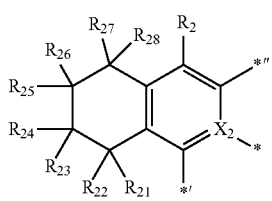

A2-1(13) 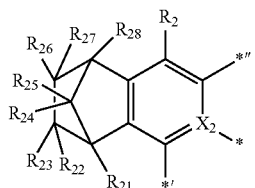

A2-1(14) 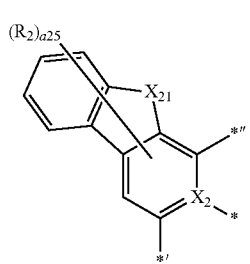

A2-1(15) 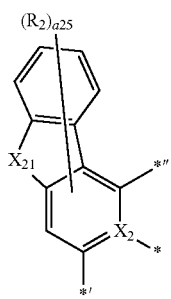

A2-1(16) 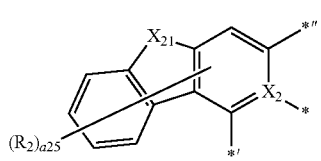

A2-1(17) 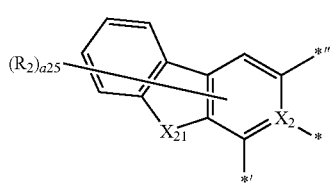

A2-1(18) 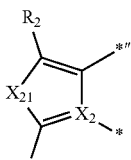

A2-1(19) 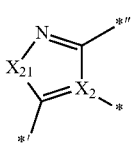

A2-1(20) 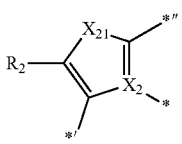

A2-1(21) 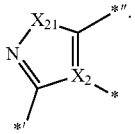

In Formulae A2-1(1) to A2-1(21), $X_2$ and $R_2$ may respectively be the same as described above, $X_{21}$ may be O, S, $N(R_{21})$, $C(R_{21})(R_{22})$, or $Si(R_{21})(R_{22})$, $R_{21}$ to $R_{28}$ may respectively be the same as described in connection with $R_2$, a25 may be an integer from 0 to 5, a24 may be an integer from 0 to 4, a23 may be an integer from 0 to 3, a22 may be an integer from 0 to 2, \* indicates a binding site to M in Formula 1, \*' indicates a binding site to $T_1$ in Formula 1, and \*" indicates a binding site to $T_2$ in Formula 1.

In one or more embodiments, a moiety represented by

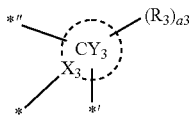

in Formula 1 may be represented by one selected from Formulae A3-1(1) to A3-1(21):

A3-1(1) 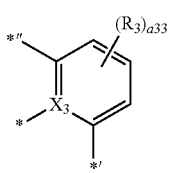

-continued
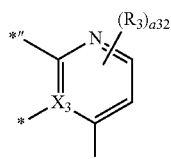
A3-1(2)
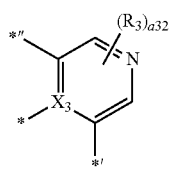
A3-1(3)
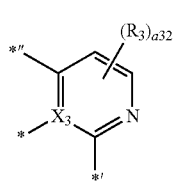
A3-1(4)
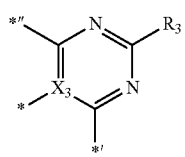
A3-1(5)
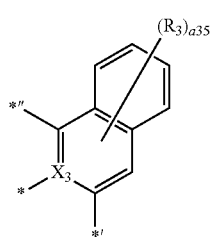
A3-1(6)
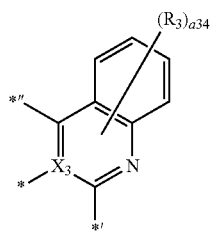
A3-1(7)
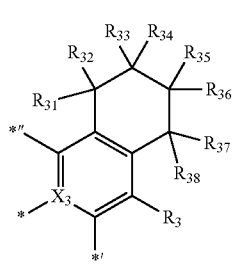
A3-1(8)
-continued
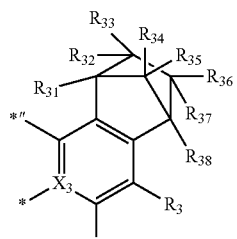
A3-1(9)
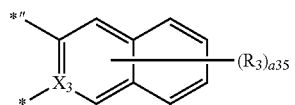
A3-1(10)
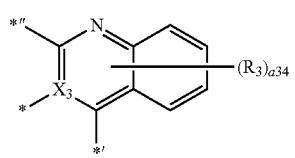
A3-1(11)
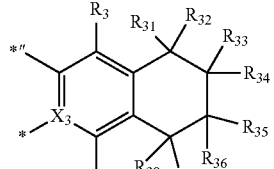
A3-1(12)
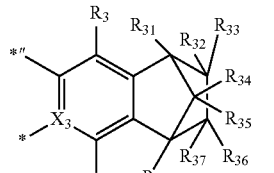
A3-1(13)
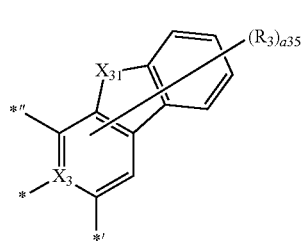
A3-1(14)
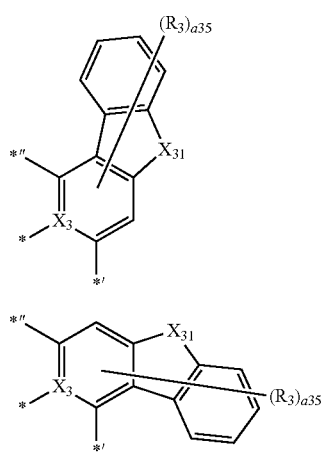
A3-1(15)
A3-1(16)

-continued

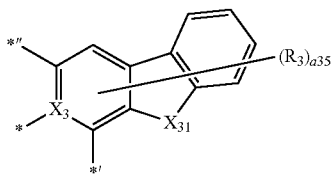
A3-1(17)

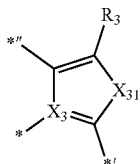
A3-1(18)

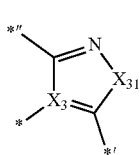
A3-1(19)

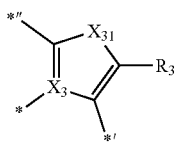
A3-1(20)

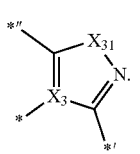
A3-1(21)

In Formulae A3-1(1) to A3-1 (21), $X_3$ and $R_3$ may respectively the same as described above, $X_{31}$ may be O, S, N($R_{31}$), C($R_{31}$)($R_{32}$), or Si($R_{31}$)($R_{32}$), $R_{31}$ to $R_{38}$ may respectively be the same as described in connection with $R_3$, a35 may be an integer from 0 to 5, a34 may be an integer from 0 to 4, a33 may be an integer from 0 to 3, a32 may be an integer from 0 to 2, \* indicates a binding site to M in Formula 1, \*' indicates a binding sit to $T_3$ in Formula 1, and \*'' indicates a binding site to $T_2$ in Formula 1.

In one or more embodiments, in Formula 1, n may be 0, and a moiety represented by

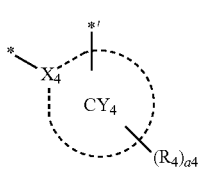

may be represented by one selected from Formulae A4-1 to A4-6, A4-1(1) to A4-1(44), and A4-2(1) to A4-2(71), or n may be 1, and a moiety represented by

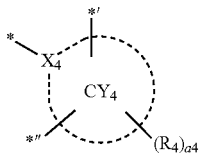

may be represented by one selected from Formulae A14-1 to A14-4 and A14-1(1) to A14-1(17):

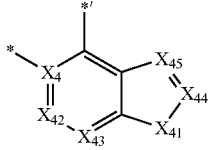
A4-1

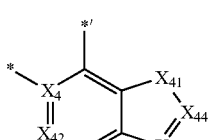
A4-2

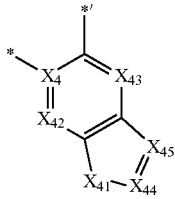
A4-3

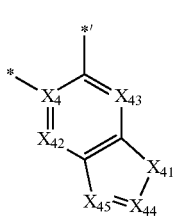
A4-4

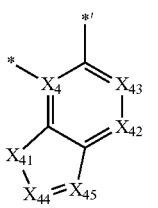
A4-5

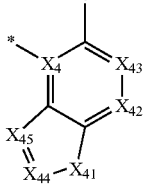
A4-6

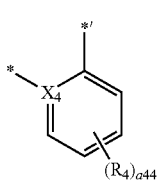
A4-1(1)

A4-1(2)
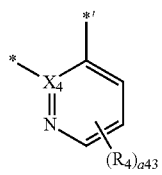
A4-1(3)
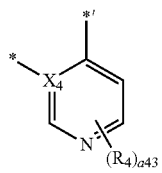
A4-1(4)
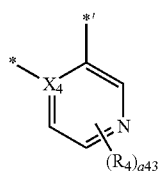
A4-1(5)
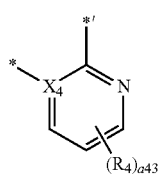
A4-1(6)
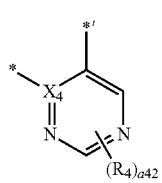
A4-1(7)
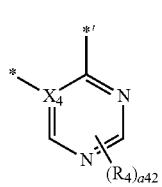
A4-1(8)
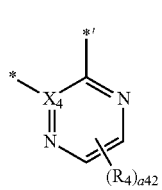
A4-1(9)
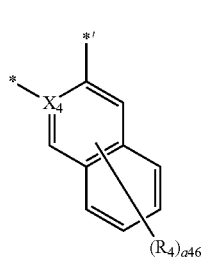
A4-1(10)
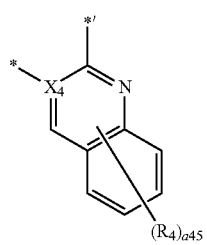
A4-1(11)
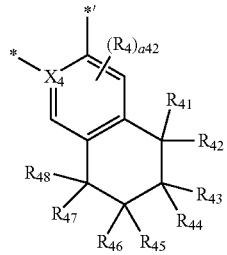
A4-1(12)
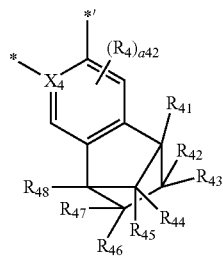
A4-1(13)
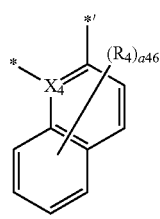
A4-1(14)
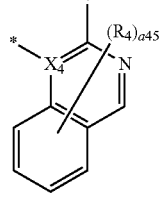
A4-1(15)
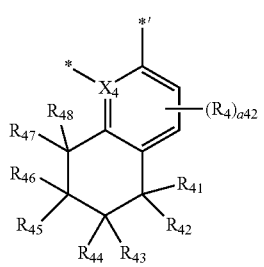

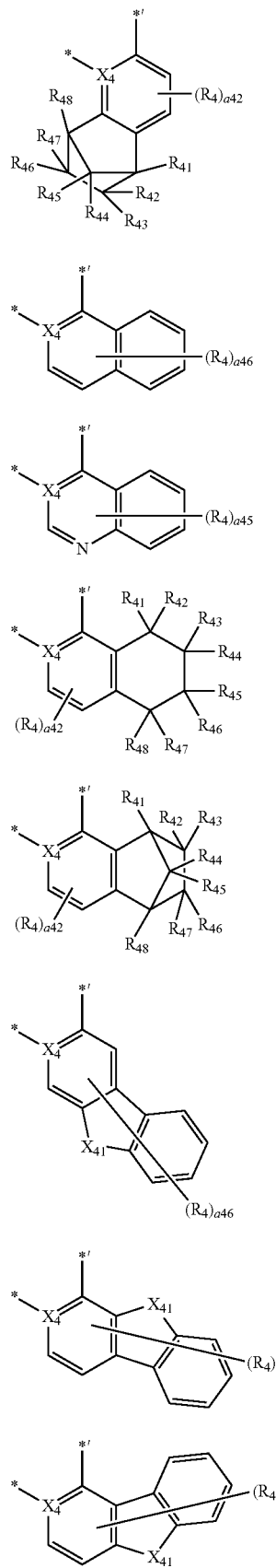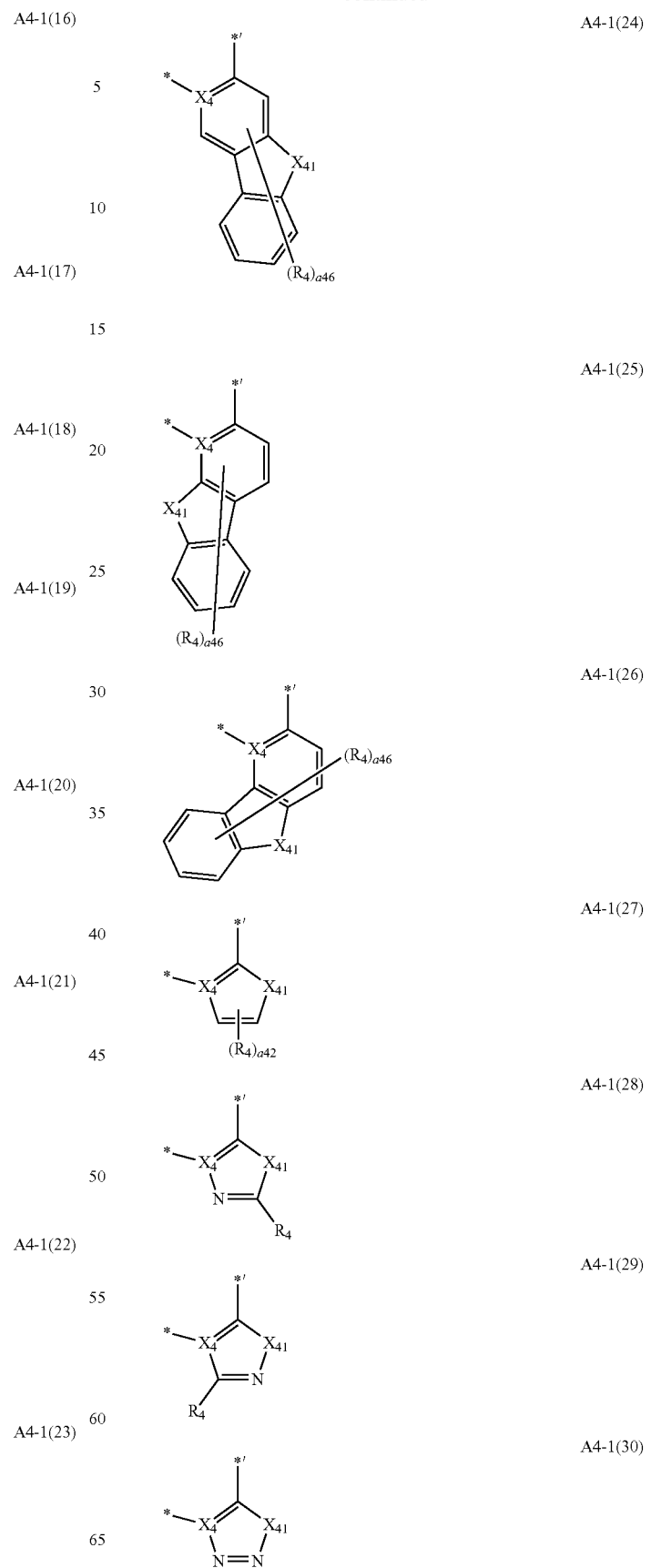

-continued
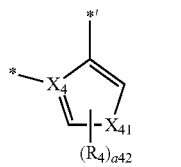 A4-1(31)
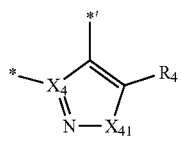 A4-1(32)
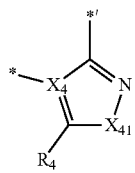 A4-1(33)
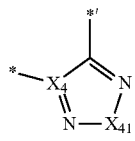 A4-1(34)
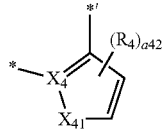 A4-1(35)
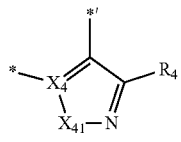 A4-1(36)
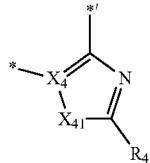 A4-1(37)
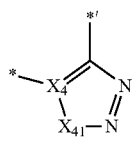 A4-1(38)
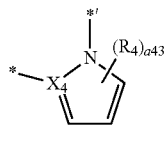 A4-1(39)
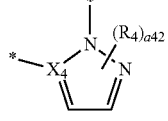 A4-1(40)
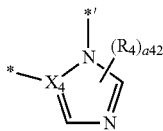 A4-1(41)
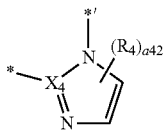 A4-1(42)
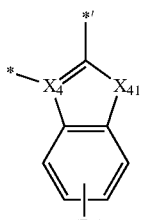 A4-1(43)
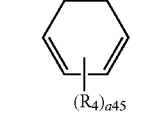 A4-1(44)
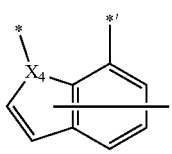 A4-2(1)
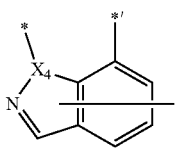 A4-2(2)
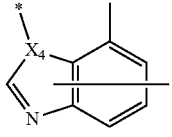 A4-2(3)
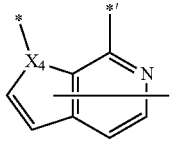 A4-2(4)
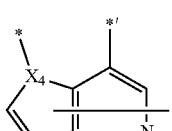 A4-2(5)
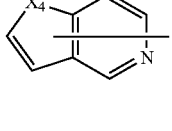

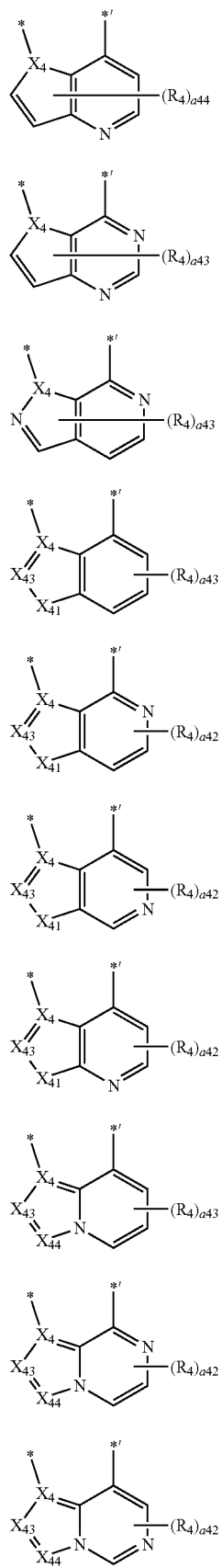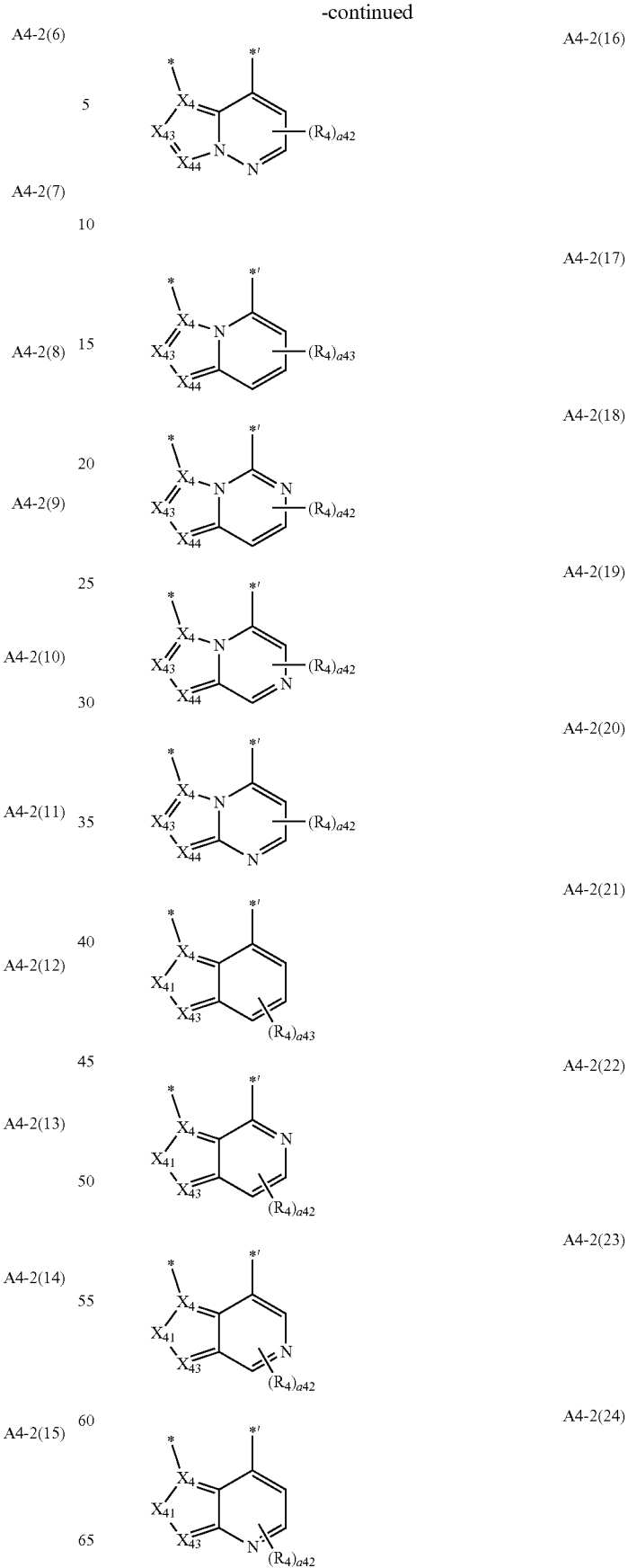

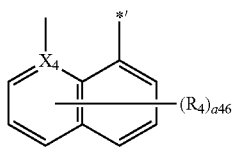 A4-2(25)
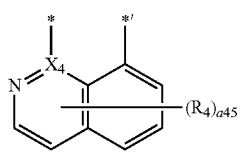 A4-2(26)
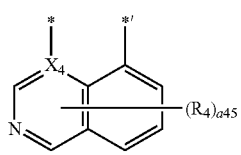 A4-2(27)
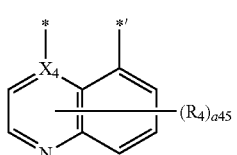 A4-2(28)
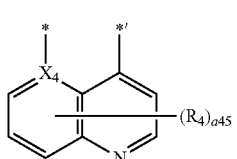 A4-2(29)
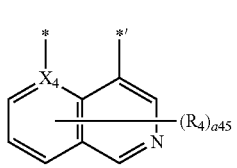 A4-2(30)
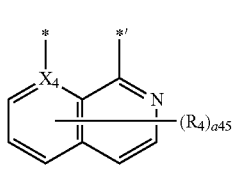 A4-2(31)
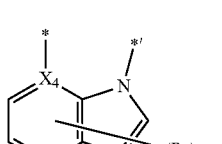 A4-2(32)
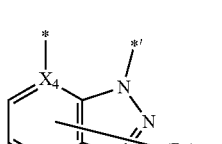 A4-2(33)
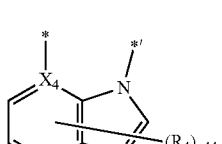 A4-2(34)
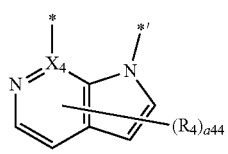 A4-2(35)
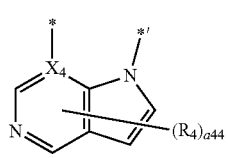 A4-2(36)
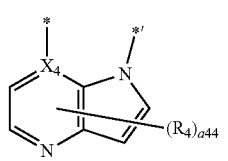 A4-2(37)
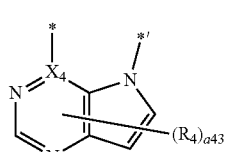 A4-2(38)
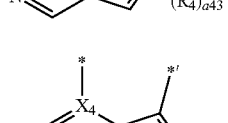 A4-2(39)
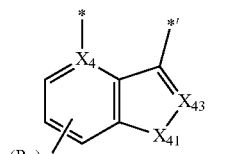 A4-2(40)
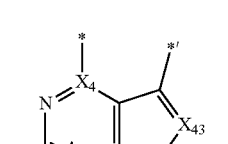 A4-2(41)
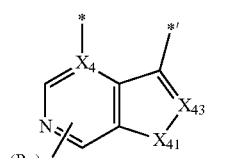 A4-2(42)
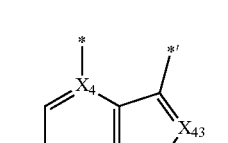 A4-2(43)

A4-2(44)
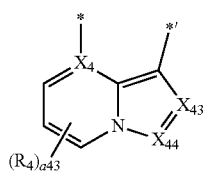
A4-2(45)
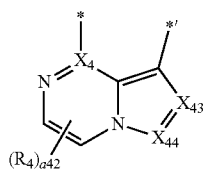
A4-2(46)
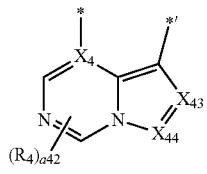
A4-2(47)
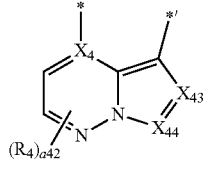
A4-2(48)
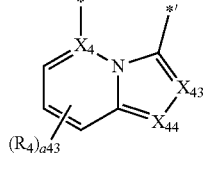
A4-2(49)
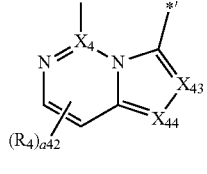
A4-2(50)
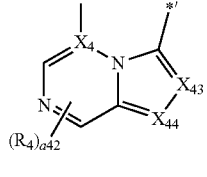
A4-2(51)
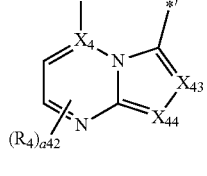
A4-2(52)
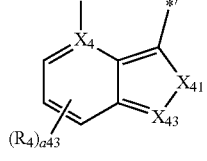
A4-2(53)
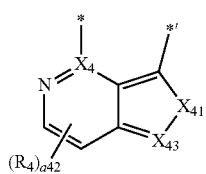
A4-2(54)
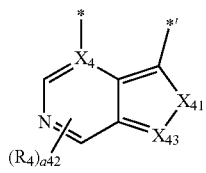
A4-2(55)
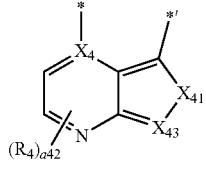
A4-2(56)
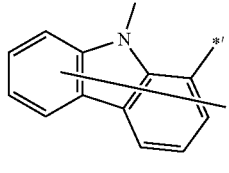
A4-2(57)
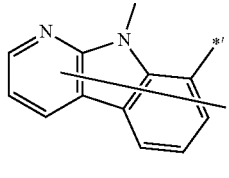
A4-2(58)
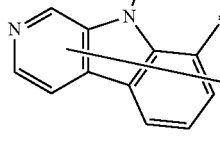
A4-2(59)
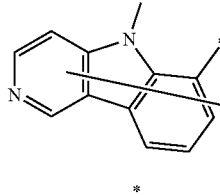
A4-2(60)
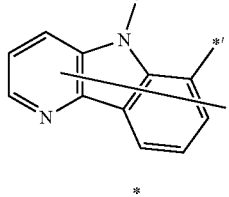
A4-2(61)
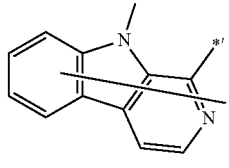

A4-2(62)
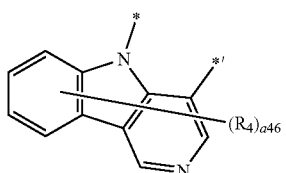
A4-2(63)
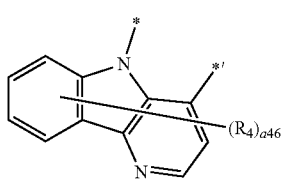
A4-2(64)
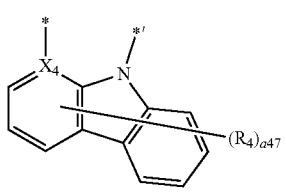
A4-2(65)
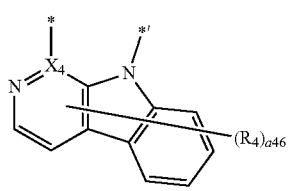
A4-2(66)
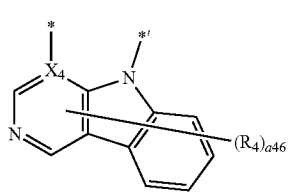
A4-2(67)
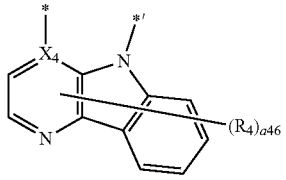
A4-2(68)
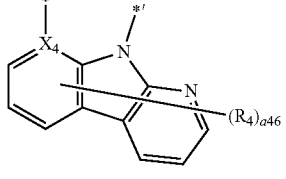
A4-2(69)
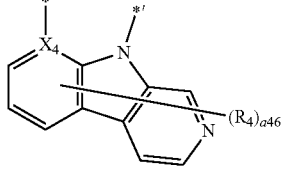
A4-2(70)
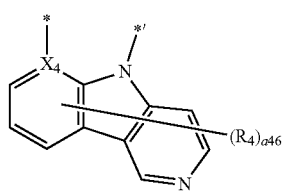
A4-2(71)
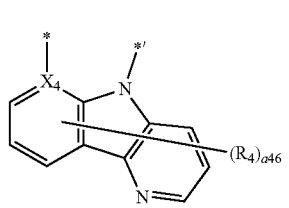
A14-1
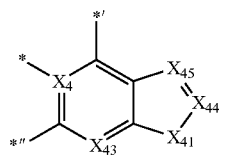
A14-2
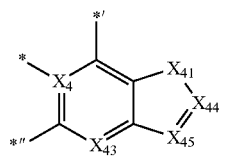
A14-3
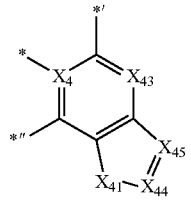
A14-4
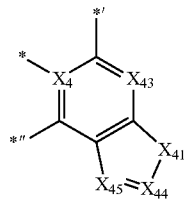
A14-1(1)
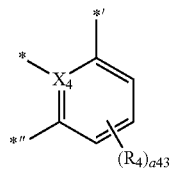
A14-1(2)
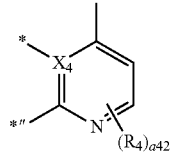

-continued
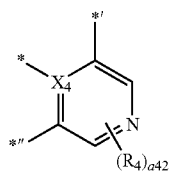
A14-1(3)
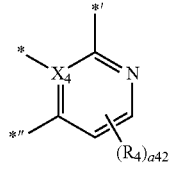
A14-1(4)
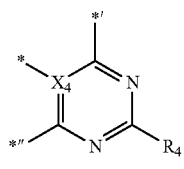
A14-1(5)
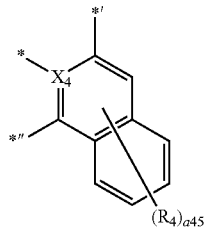
A14-1(6)
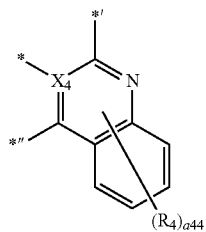
A14-1(7)
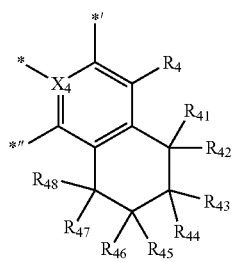
A14-1(8)
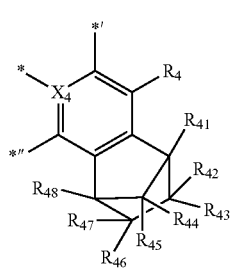
A14-1(9)
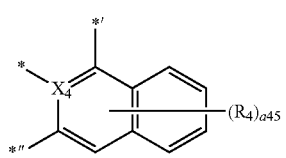
A14-1(10)
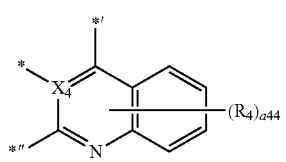
A14-1(11)
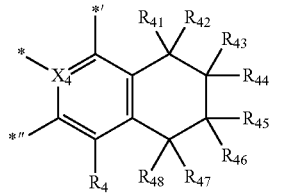
A14-1(12)
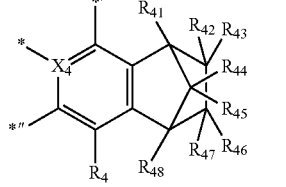
A14-1(13)
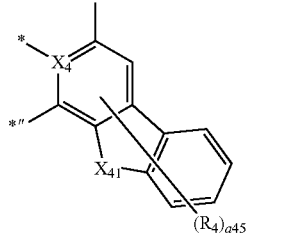
A14-1(14)
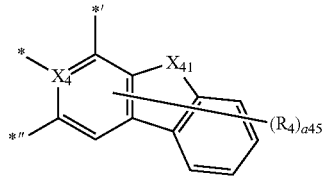
A14-1(15)
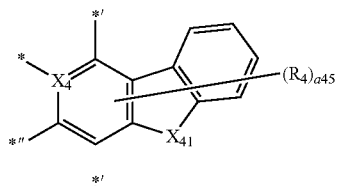
A14-1(16)
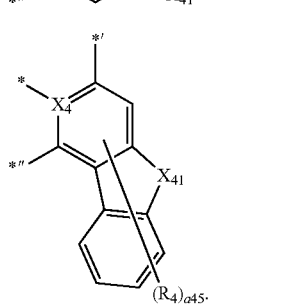
A14-1(17)

In Formulae A4-1 to A4-9, A4-1(1) to A4-1(44), A4-2(1) to A4-2(71), A14-1 to A14-4, and A14-1(1) to A14-1(17), $X_4$ and $R_4$ may respectively be the same as described above, $X_{41}$ may be O, S, $N(R_{41})$, $C(R_{41})(R_{42})$, or $Si(R_{41})(R_{42})$, $X_{42}$ may be N or $C(R_{42})$, $X_{43}$ may be N or $C(R_{43})$, $X_{44}$ may be N or $C(R_{44})$, $X_{45}$ may be N or $C(R_{45})$, $R_{41}$ to $R_{48}$ may respectively be the same as described in connection with $R_4$, a47 may be an integer from 0 to 7, a46 may be an integer from 0 to 6, a45 may be an integer from 0 to 5, a44 may be an integer from 0 to 4, a43 may be an integer from 0 to 3, a42 may be an integer from 0 to 2,

* indicates a binding site to M in Formula 1,

*' indicates a binding site to $T_3$ in Formula 1, and

*" indicates a binding site to $T_4$ in Formula 1.

In one or more embodiments, in Formula 1, $T_3$ may be a single bond, n may be 0, and a moiety represented by

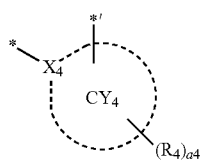

may be represented by one selected from Formulae A4-1 to A4-6, A4-1(1) to A4-1(44), and A4-2(1) to A4-2(71); or $T_3$ may not be a single bond, n may be 1, and a moiety represented by

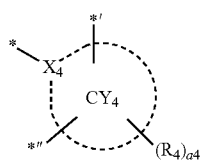

may be represented by one selected from Formulae A14-1 to A14-4 and A14-1(1) to A14-1(17), but embodiments of the present disclosure are not limited thereto.

In one or more embodiments, in Formula 1, n may be 0, a moiety represented by

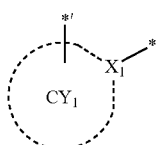

may be a group represented by one selected from Formulae CY1-1 to CY1-8 (and/or), a moiety represented by

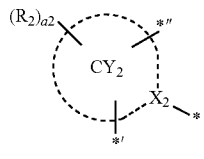

may be a group represented by one selected from Formulae CY2-1 to CY2-6 (and/or), a moiety represented by

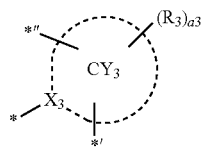

may be a group represented by one selected from Formulae CY3-1 to CY3-6 (and/or), a moiety represented by

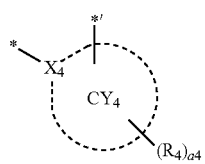

may be a group represented by one selected from Formulae CY4-1 to CY4-15, but embodiments of the present disclosure are not limited thereto:

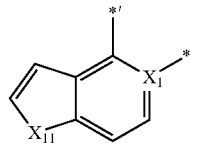

CY1-1

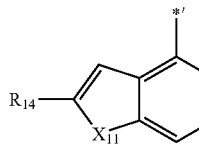

CY1-2

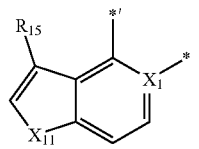

CY1-3

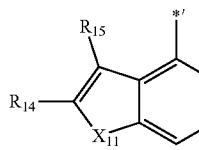

CY1-4

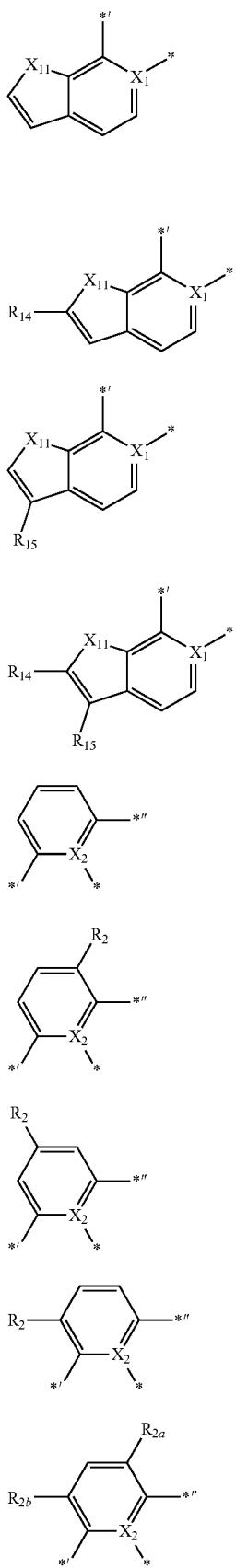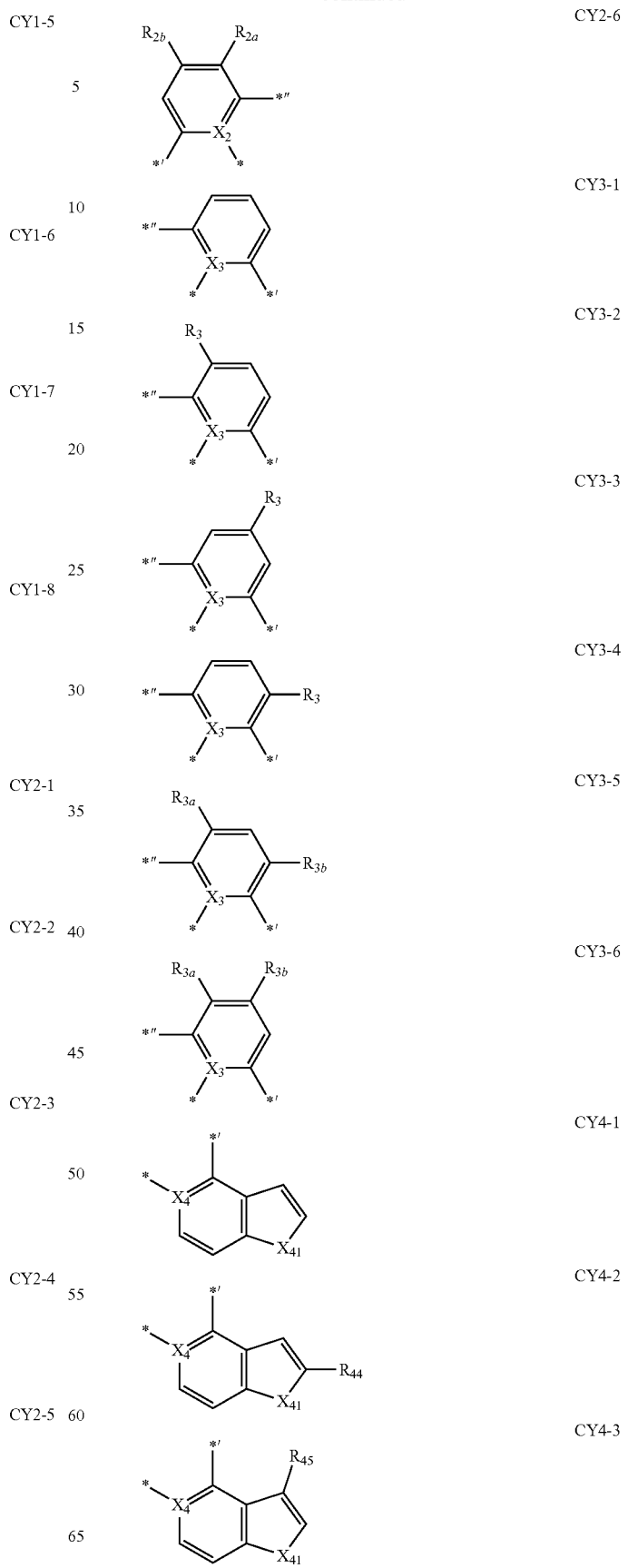

CY4-4 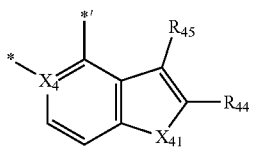

CY4-5 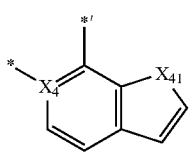

CY4-6 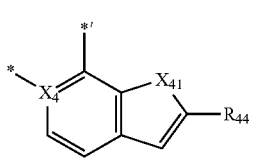

CY4-7 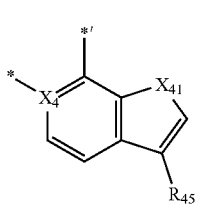

CY4-8 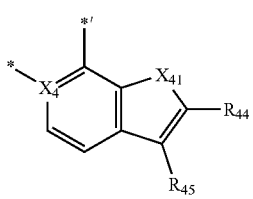

CY4-9 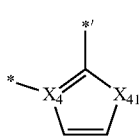

CY4-10 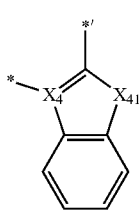

CY4-11 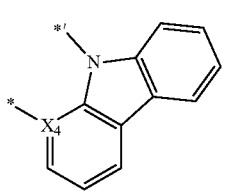

CY4-12 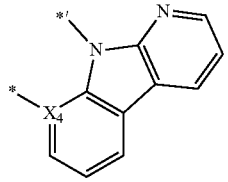

CY4-13 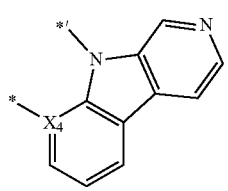

CY4-14 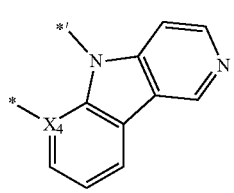

CY4-15 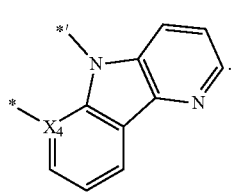

In Formulae CY1-1 to CY1-8, CY2-1 to CY2-6, CY3-1 to CY3-6, and CY4-1 to CY4-15, $X_1$ to $X_4$, $X_{11}$, $R_2$, $R_3$, $R_{14}$, and $R_{15}$ may respectively be the same as described above, $X_{41}$ may be O, S, N($R_{41}$), C($R_{41}$)($R_{42}$), or Si($R_{41}$)($R_{42}$), $R_{2a}$ and $R_{2b}$ may respectively be the same as described in connection with $R_2$, $R_{3a}$ and $R_{3b}$ may respectively be the same as described in connection with $R_3$, $R_{41}$, $R_{42}$, $R_{44}$, and $R_{45}$ may respectively be the same as described in connection with $R_4$, $R_{14}$, $R_{15}$, $R_2$, $R_{2a}$, $R_{2b}$, $R_3$, $R_{3a}$, $R_{3b}$, $R_{41}$, $R_{42}$, $R_{44}$, and $R_{45}$ may not each independently be hydrogen,

* indicates a binding site to M in Formula 1, in Formulae CY1-1 to CY1-8, *' indicates a binding site to $T_1$ in Formula 1, in Formulae CY2-1 to CY2-6, *' indicates a binding site to $T_1$ in Formula 1, and *''' indicates a binding site to $T_2$ in Formula 1, in Formulae CY3-1 to CY3-6, *' indicates a binding site to $T_3$ in Formula 1, and *''' indicates a binding site to $T_2$ in Formula 1, and in Formulae CY4-1 to CY4-15, *' indicates a binding site to $T_3$ in Formula 1.

In one or more embodiments, the organometallic compound may be represented by one selected from Formulae 1(1) to 1(6):

Formula 1(1)

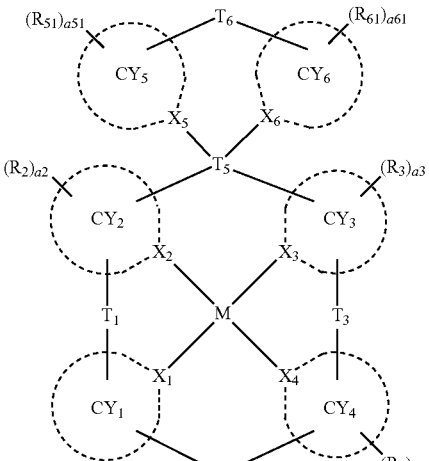

Formula 1(4)

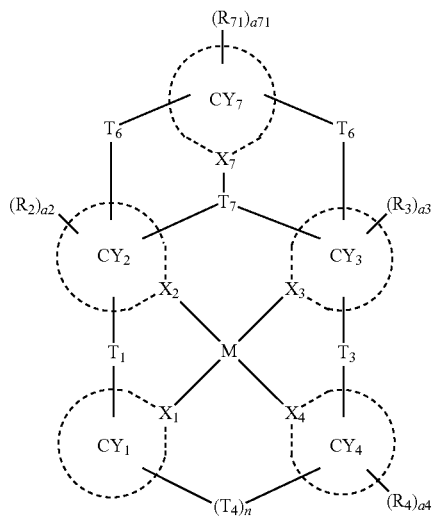

Formula 1(2)

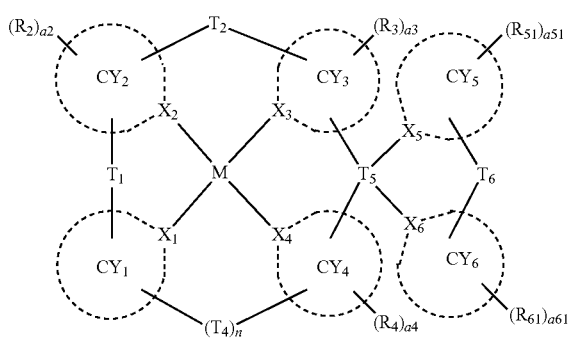

Formula 1(5)

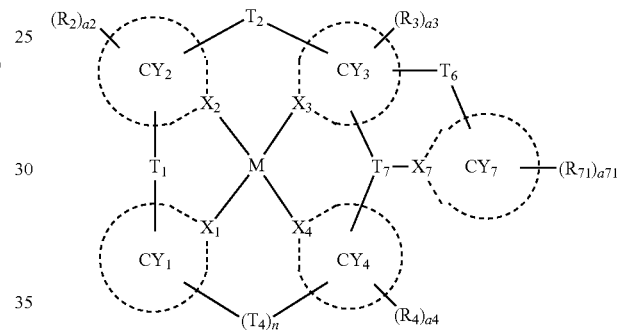

Formula 1(3)

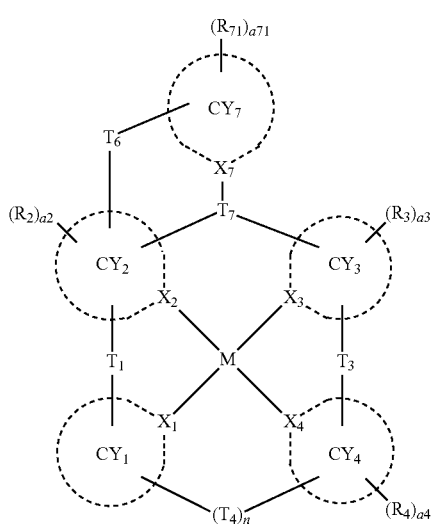

Formula 1(6)

In Formulae 1(1) to 1(6),

M, $X_1$ to $X_4$, $CY_1$ to $CY_4$, $T_1$ to $T_4$, n, $R_2$ to $R_4$, and a2 to a4 may respectively be the same as described above, $CY_5$ to $CY_7$ may each independently be a $C_5$-$C_{30}$ carbocyclic group or a $C_1$-$C_{30}$ heterocyclic group, $X_5$ to $X_7$ may each independently be C or N, $R_{51}$, $R_{61}$, and $R_{71}$ may respectively be the same as described in connection with $R_2$, a51, a61, and a71 may each independently be 0, 1, 2, or 3, $T_5$ may be C, Si, or Ge, $T_7$ may be B, N, or P, $T_6$ may be selected from a single bond, *—N[($L_7$)$_{c7}$-($R_7$)]—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—

*', *—O—*', *—C(=O)—*', *—S(=O)—*', *—S(=O)$_2$—*', *—C(R$_7$)=C(R$_8$)—*', *—C(=S)—*', and *—C≡C—*', L$_7$ and c7 may respectively be the same as described in connection with L$_5$ and c5, and R$_7$ and R$_8$ may respectively be the same as described in connection with R$_5$.

In Formulae 1(1) to 1(6), CY$_5$ and CY$_6$ may respectively be the same as described in connection with CY$_2$ to CY$_4$.

In Formula 1, i) two or more among a plurality of neighboring groups R$_2$ may optionally be linked each other to form a substituted or unsubstituted C$_5$-C$_{30}$ carbocyclic group or a substituted or unsubstituted C$_1$-C$_{30}$ heterocyclic group, ii) two or more among a plurality of neighboring groups R$_3$ may optionally be linked each other to form a substituted or unsubstituted C$_5$-C$_{30}$ carbocyclic group or a substituted or unsubstituted C$_1$-C$_{30}$ heterocyclic group, iii) two or more among a plurality of neighboring groups R$_4$ may optionally be linked each other to form a substituted or unsubstituted C$_5$-C$_{30}$ carbocyclic group or a substituted or unsubstituted C$_1$-C$_{30}$ heterocyclic group, iv) two or more selected from R$_2$ to R$_4$ may optionally be linked to form a substituted or unsubstituted C$_5$-C$_{30}$ carbocyclic group or a substituted or unsubstituted C$_1$-C$_{30}$ heterocyclic group, and v) one selected from R$_5$ and R$_6$ and one selected from R$_2$ to R$_4$ may optionally be linked to form a substituted or unsubstituted C$_5$-C$_{30}$ carbocyclic group or a substituted or unsubstituted C$_1$-C$_{30}$ heterocyclic group.

For example, in Formula 1, i) a substituted or unsubstituted C$_5$-C$_{30}$ carbocyclic group or a substituted or unsubstituted C$_1$-C$_{30}$ heterocyclic group formed by optionally linking two or more among a plurality of neighboring groups R$_2$, ii) a substituted or unsubstituted C$_5$-C$_{30}$ carbocyclic group or a substituted or unsubstituted C$_1$-C$_{30}$ heterocyclic group formed by optionally linking two or more among a plurality of neighboring groups R$_3$, iii) a substituted or unsubstituted C$_5$-C$_{30}$ carbocyclic group or a substituted or unsubstituted C$_1$-C$_{30}$ heterocyclic group formed by optionally linking two or more among a plurality of neighboring groups R$_4$, iv) a substituted or unsubstituted C$_5$-C$_{30}$ carbocyclic group or a substituted or unsubstituted C$_1$-C$_{30}$ heterocyclic group formed by optionally linking two or more selected from R$_2$ to R$_4$, and v) a substituted or unsubstituted C$_5$-C$_{30}$ carbocyclic group or a substituted or unsubstituted C$_1$-C$_{30}$ heterocyclic group formed by optionally linking one selected from R$_5$ and R$_6$ and one selected from R$_2$ to R$_4$ may each independently be selected from:

a cyclopentadiene group, a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group;

a cyclopentadiene group, a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one R$_{10a}$, but embodiments of the present disclosure are not limited thereto.

R$_{10a}$ may be the same as described in connection with R$_2$.

In the present specification, the terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" as used herein each refer to a heterocyclic group having the same backbone as that of "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group" in which at least one of carbon atoms forming the heterocyclic group is substituted with nitrogen.

The organometallic compound may be selected from Compounds 1 to 15, but embodiments of the present disclosure are not limited thereto:

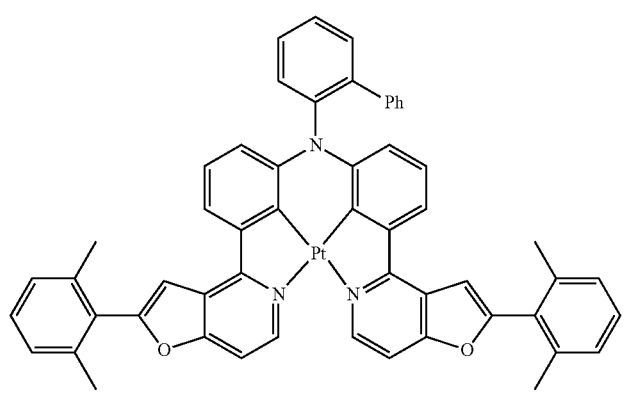

1

-continued
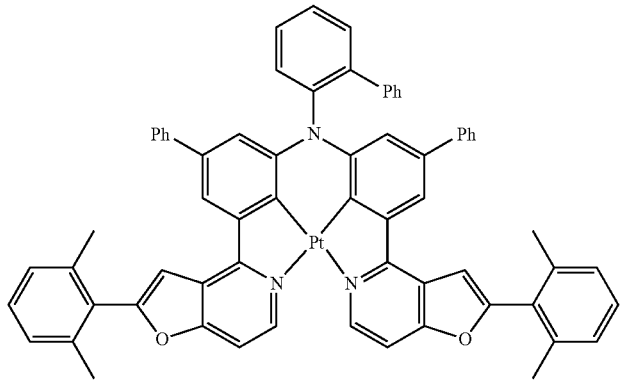
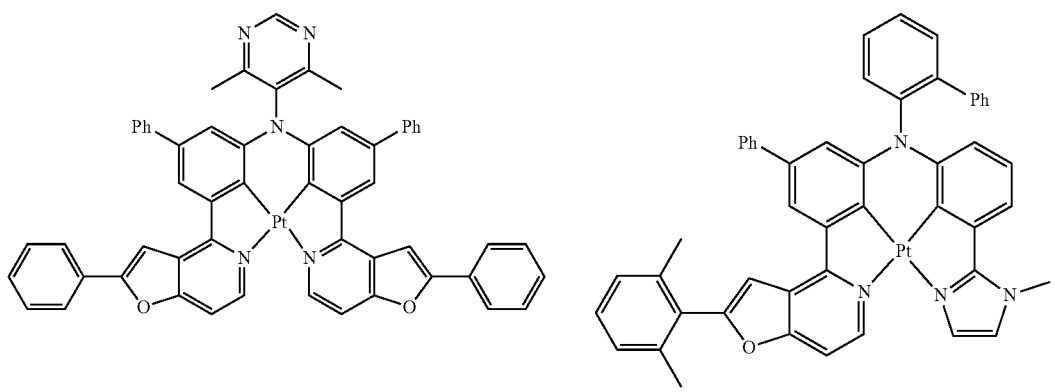
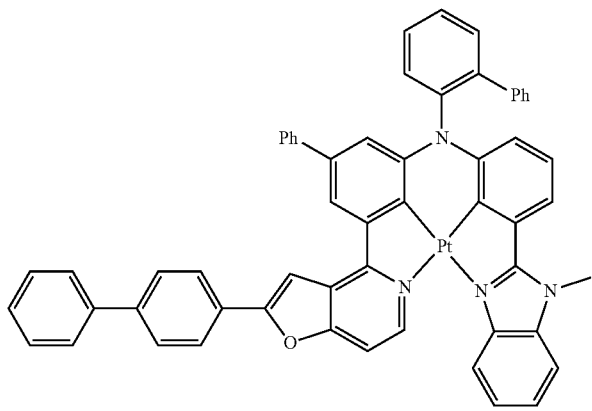
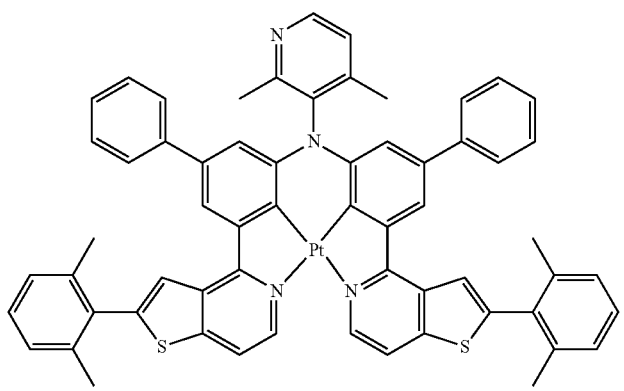

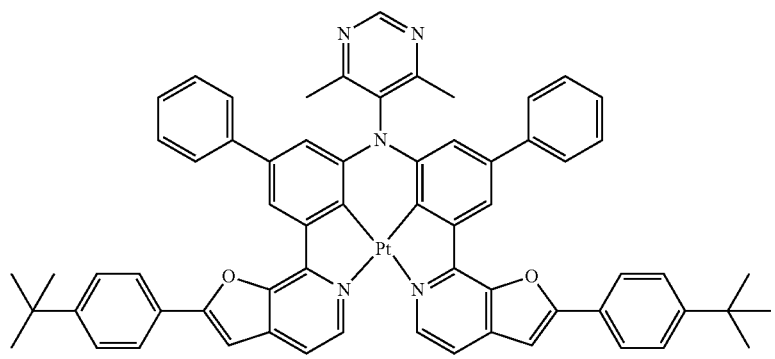
7
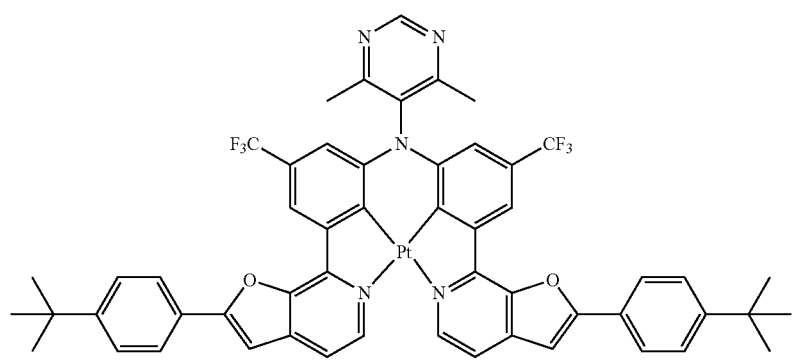
8
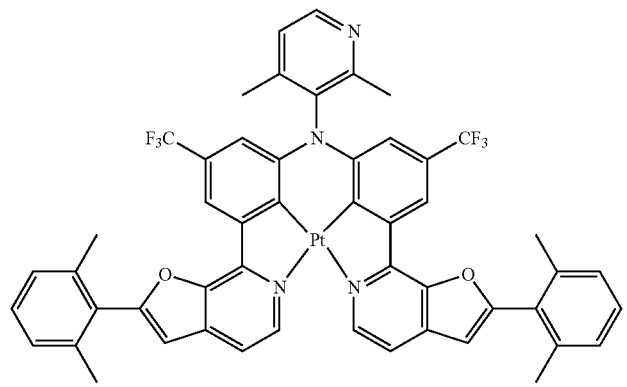
9
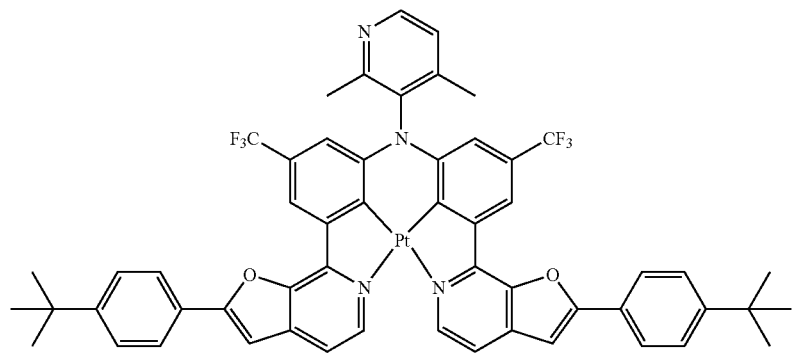
10

-continued
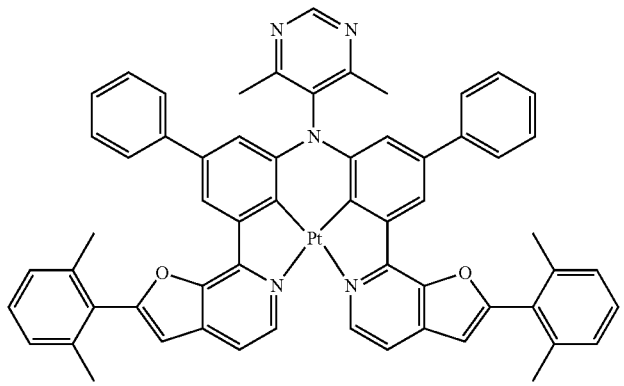
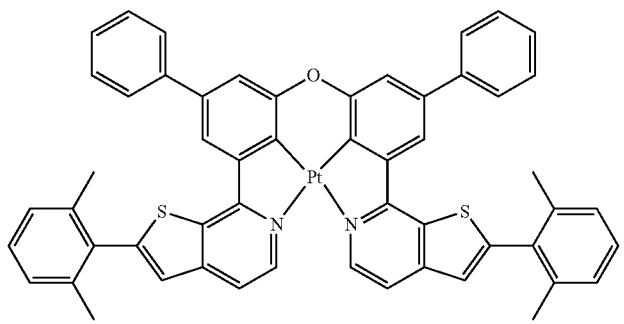
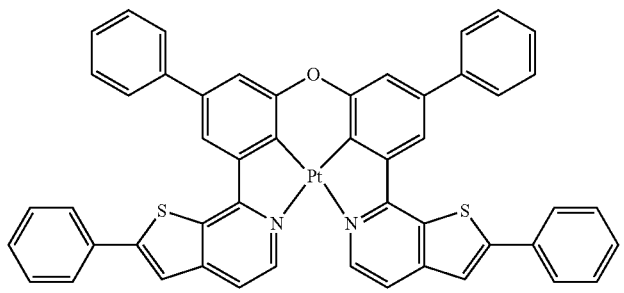
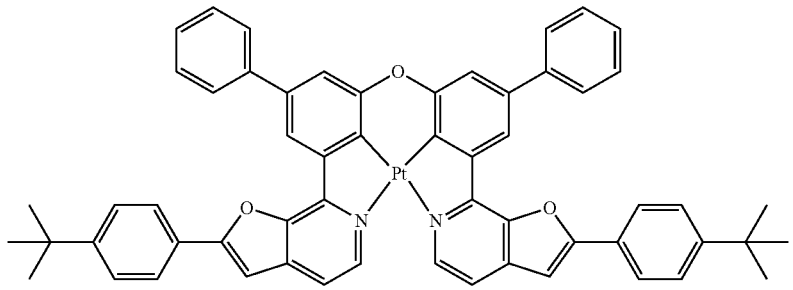
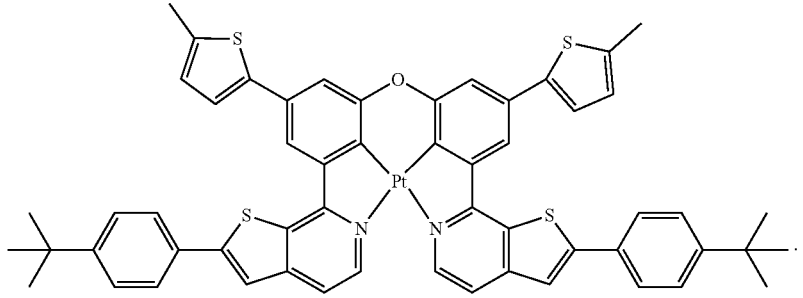

In Compounds 1 to 15, Ph indicates a phenyl group.

In Formula 1, a bond between $X_1$ and M may be a coordinate bond, two bonds selected from a bond between $X_2$ and M, a bond between $X_3$ and M, and a bond between $X_4$ and M may each independently be a covalent bond while the remaining one bond may be a coordinate bond. In this regard, the organometallic compound may become eclectically neutral, resulting in high molecular stability and thermal stability.

In Formula 1, i) when n is 0, $CY_1$ may be a group represented by one selected from Formulae A1-1 to A1-6, and ii) when n is 1, $CY_1$ may be a group represented by one selected from Formulae A11-1 to A11-4. In this regard, a difference between a singlet energy and a triplet energy of the organometallic compound may become relatively large so that most of intermolecular energy of the organometallic compound may be collected at a triplet energy level. Accordingly, an electronic device, for example, an organic light-emitting device, including the organometallic compound may provide an electroluminescence (EL) spectrum having a very stiff wave pattern (for example, a wave pattern in which the emission intensity of a short-wavelength tail at a distance of about −100 nanometers (nm) to about 0 nm (for example, at a distance of about −50 nm to about 0 nm) from the maximum emission wavelength (i.e., peak emission wavelength) in the EL spectrum is significantly reduced), and thus, an electronic device, for example, an organic light-emitting device, including the organometallic compound may have improved emission efficiency and excellent color purity.

In addition, in Formula 1, $X_1$ may be N. In Formulae A1-1 to A1-6 and A11-1 to A11-4, when $X_{14}$ is $C(R_{14})$ and $X_{11}$ is $C(R_{15})$, $R_{14}$ and $R_{15}$ may not be linked each other. Accordingly, the organometallic compound may provide, for example, excellent color purity and efficiency for the emission of red light.

For example, some of the compounds above may be evaluated in terms of highest occupied molecular orbital (HOMO), lowest unoccupied molecular orbital (LUMO), energy band gap ($E_g$), singlet ($S_1$), and triplet ($T_1$) energy levels that are calculated by using a density functional theory (DFT) of Gaussian program (that is structurally optimized at a level of B3LYP, 6-31G(d,p)), and results thereof are shown in Table 1 below:

TABLE 1

| Compound No. | HOMO (eV) | LUMO (eV) | $E_g$ (eV) | $S_1$ energy level (eV) | $T_1$ energy level (eV) |
| --- | --- | --- | --- | --- | --- |
| 1 | −4.390 | −1.628 | 2.762 | 2.146 | 1.878 |
| 2 | −4.409 | −1.683 | 2.726 | 2.150 | 1.891 |
| 3 | −4.616 | −1.963 | — | — | 1.878 |
| 4 | −4.298 | −1.480 | — | — | 1.976 |
| 5 | −4.351 | −1.750 | — | — | 1.916 |
| 6 | −4.547 | −1.770 | 2.777 | 2.165 | 1.900 |
| 7 | −4.884 | −2.011 | — | — | — |
| 13 | −4.801 | −2.115 | — | — | 1.944 |
| 14 | −4.707 | −1.976 | — | — | 1.989 |
| 15 | −4.681 | −2.041 | — | — | 1.909 |

Referring to Table 1, it is confirmed that the organometallic compound represented by Formula 1 may have such electric characteristics that are suitable for use in an electric device, for example, for use as a dopant for an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes:
a first electrode;
a second electrode; and
an organic layer that is disposed between the first electrode and the second electrode,
wherein the organic layer includes an emission layer and at least one organometallic compounds represented by Formula 1.

The organic light-emitting device may have, due to the inclusion of an organic layer including the organometallic compound represented by Formula 1, a low driving voltage, high emission efficiency, high power, high quantum emission efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this embodiment, the organometallic compound may act as a dopant, and the emission layer may further include a host (that is, an amount of the organometallic compound represented by Formula 1 is smaller than an amount of the host).

The expression "(an organic layer) includes at least one organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 may both be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode may be an anode, and the second electrode may be a cathode, and the organic layer may further include a hole transport region disposed between the first electrode and the emission layer and an electron transport region disposed between the emission layer and the second electrode, wherein the hole transport region may include a hole injection layer, a hole transport layer, an electron blocking layer, a buffer layer or any combination thereof, and the electron transport region may include a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 Angstroms per second (Å/sec) to about 100 □/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201, and a compound represented by Formula 202:

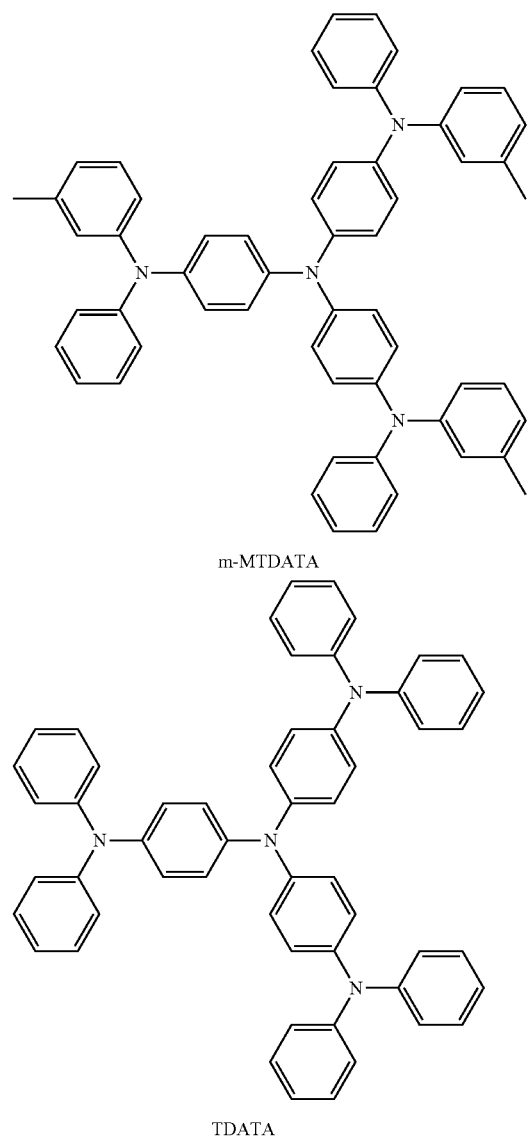

m-MTDATA

TDATA

-continued
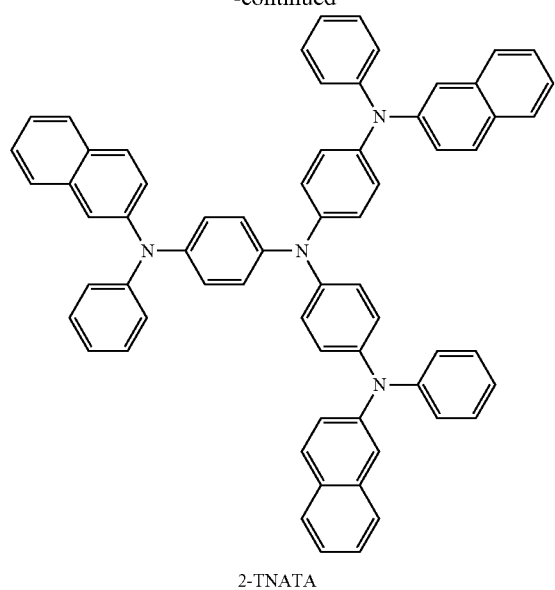
2-TNATA
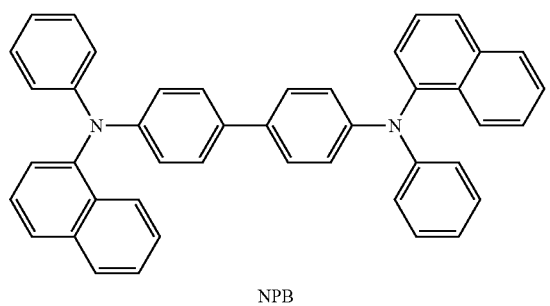
NPB
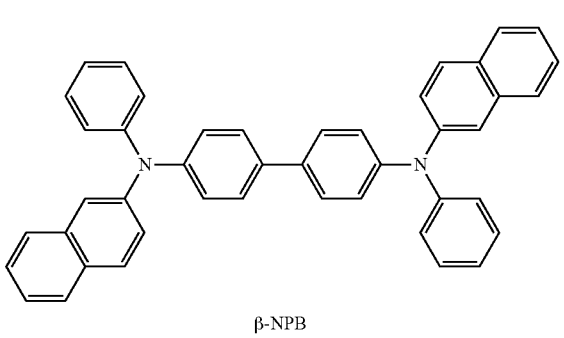
β-NPB
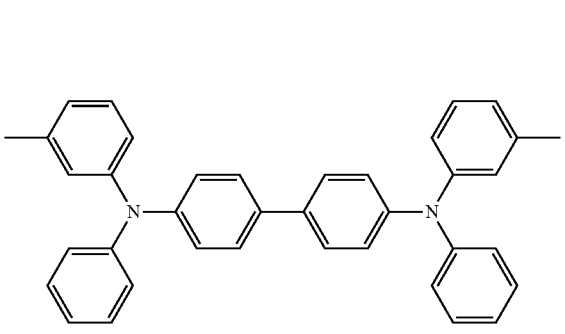
TPD
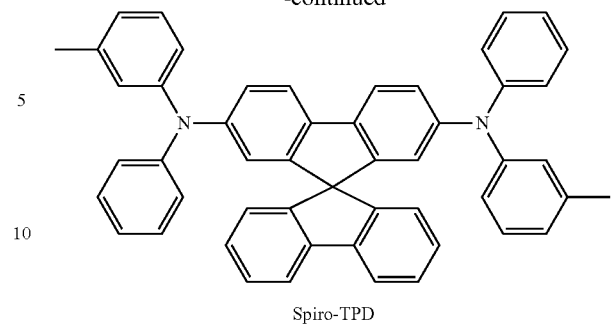
Spiro-TPD
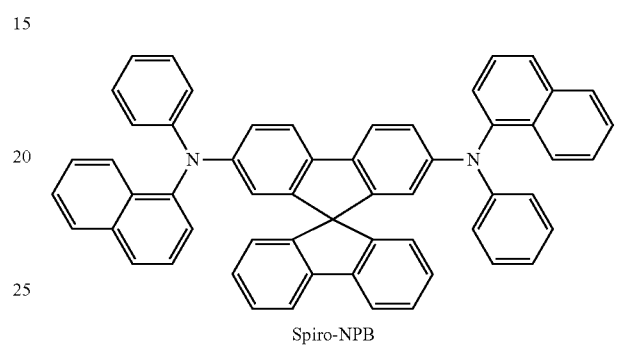
Spiro-NPB
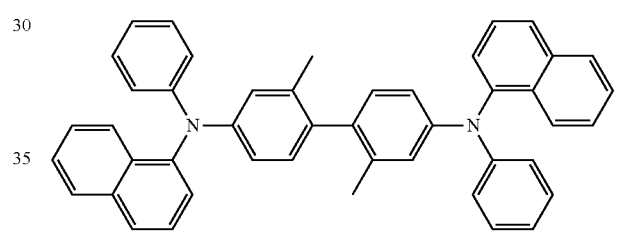
methylated NPB
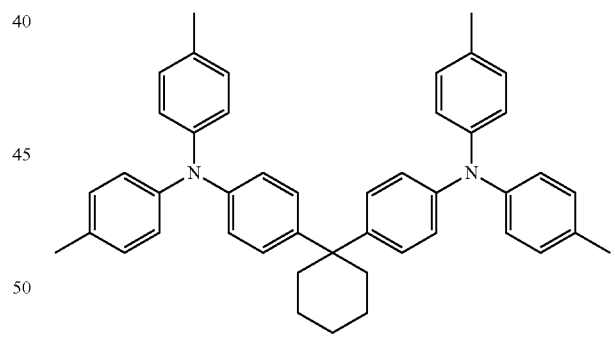
TAPC
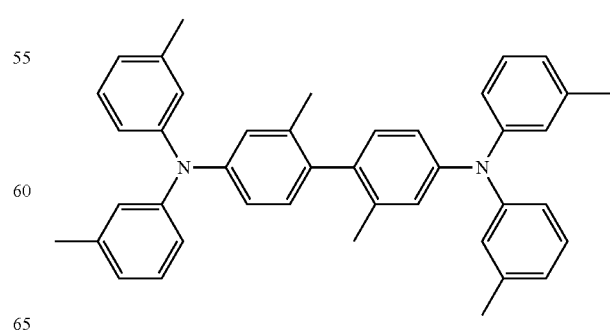
HMTPD Formula 201

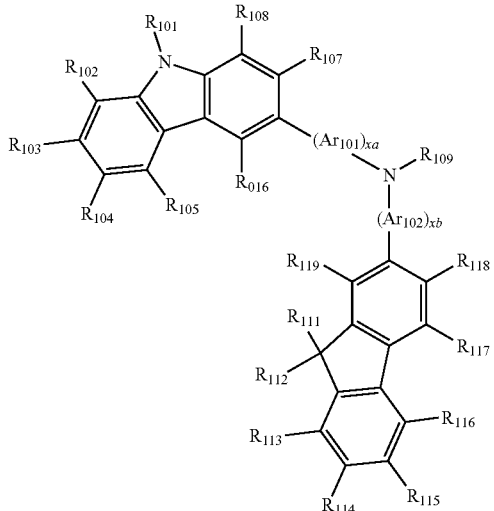

Formula 202

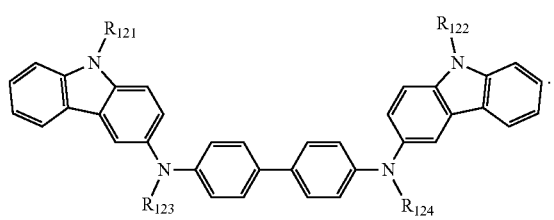

In Formula 201, $Ar_{101}$ and $Ar_{102}$ may each independently be selected from: a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group.

In Formula 201, xa and xb may each independently be an integer from 0 to 5, or may each independently be 0, 1, or 2. For example, xa is 1 and xb is 0, but xa and xb are not limited thereto.

In Formulae 201 and 202, $R_{101}$ to $R_{108}$, $R_{111}$ to $R_{119}$, and $R_{121}$ to $R_{124}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

In Formula 201, $R_{109}$ may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

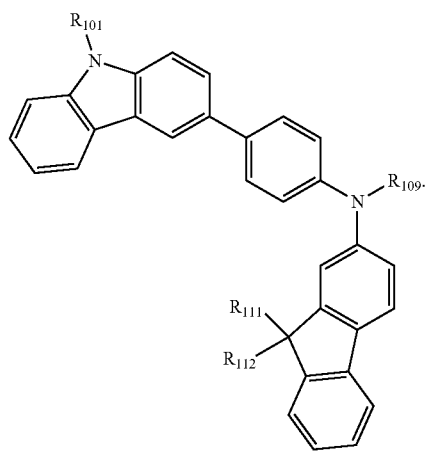

In Formula 201A, $R_{101}$, $R_{111}$, $R_{112}$, and $R_{109}$ may respectively be the same as described above.
For example, the compound represented by Formula 201, and the compound represented by Formula 202 may include compounds HT1 to HT20, but are not limited thereto:
HT1
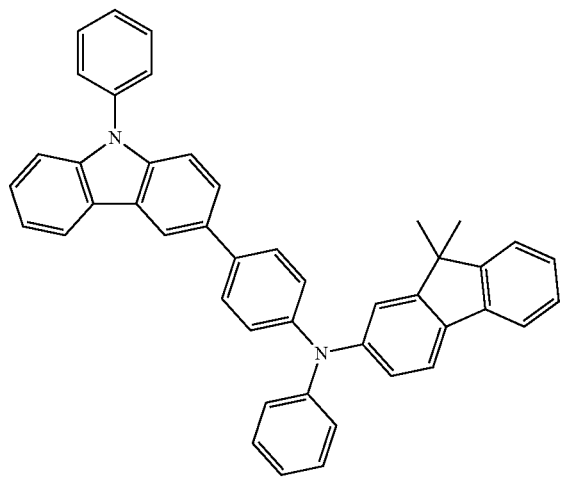
HT2
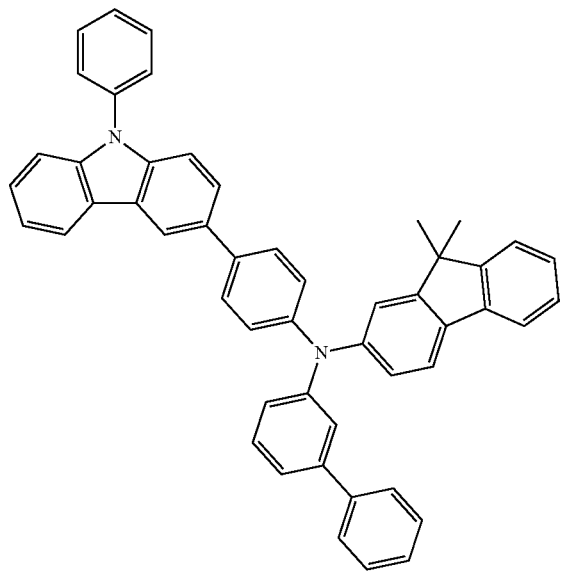
HT3
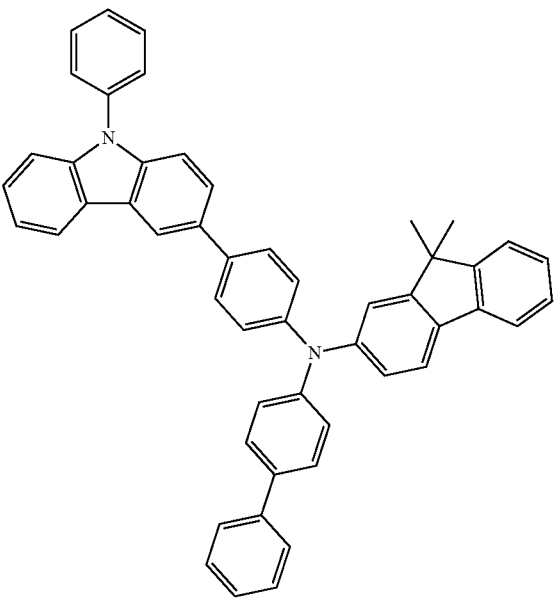
HT4
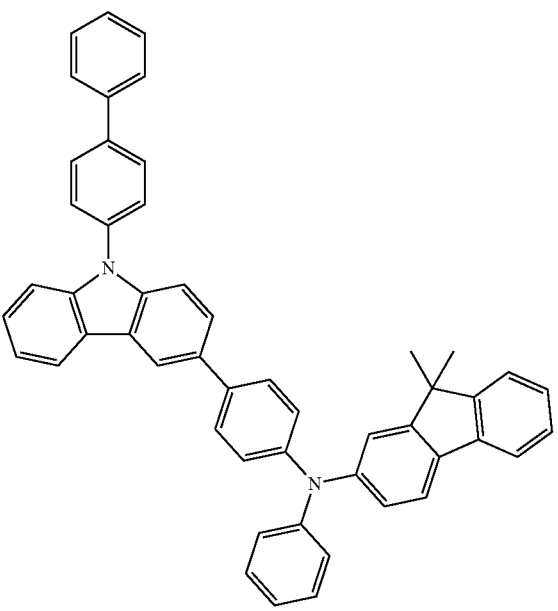

HT5
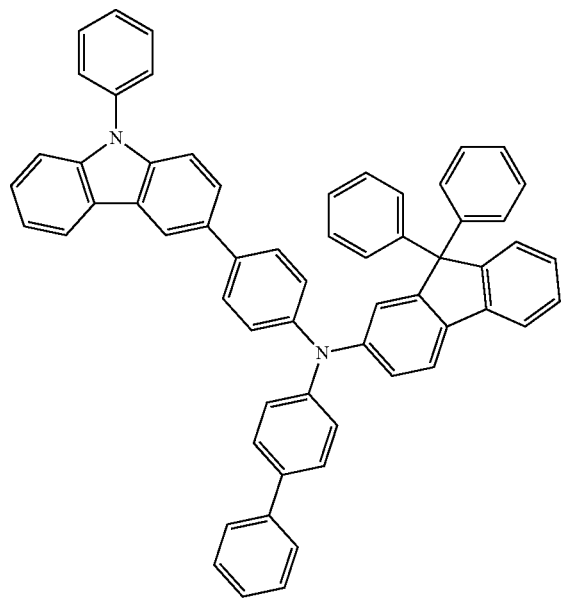
HT6
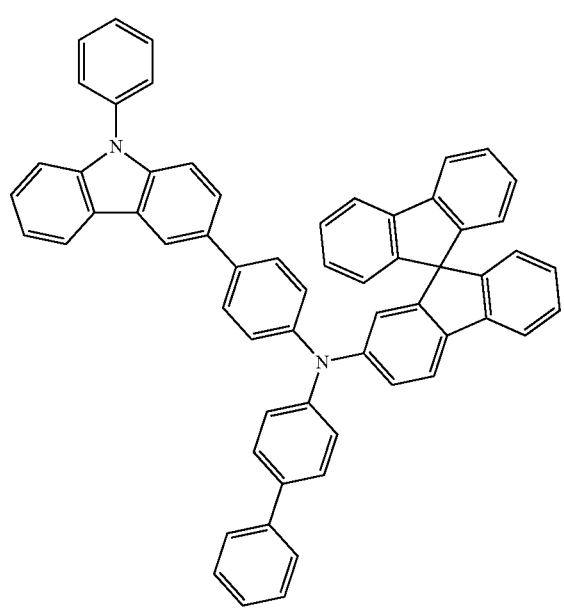
HT7
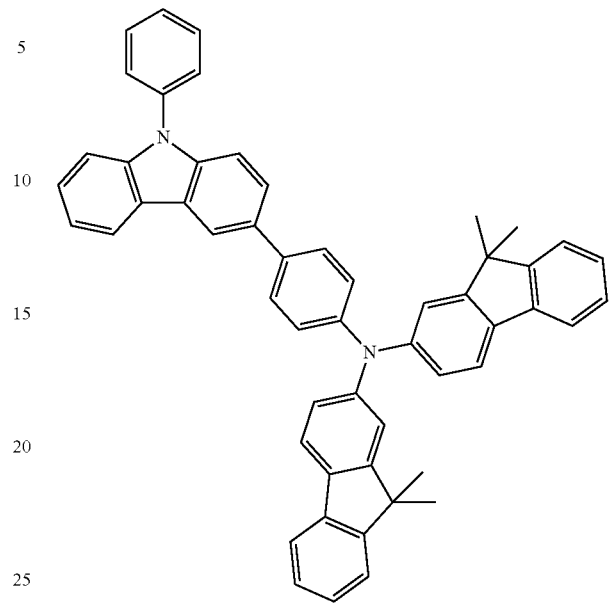
HT8
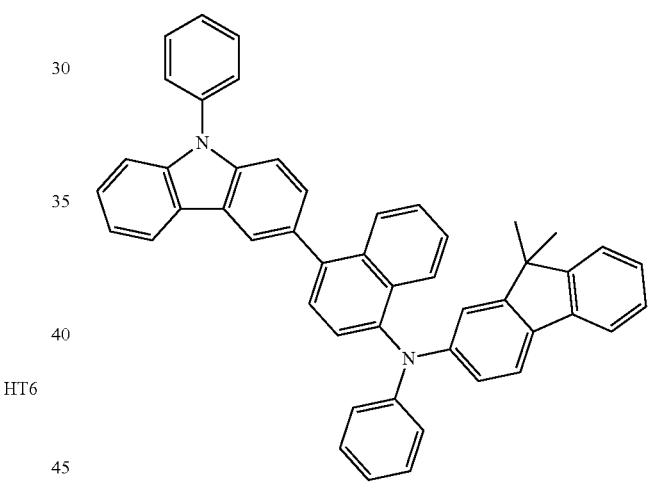
HT9
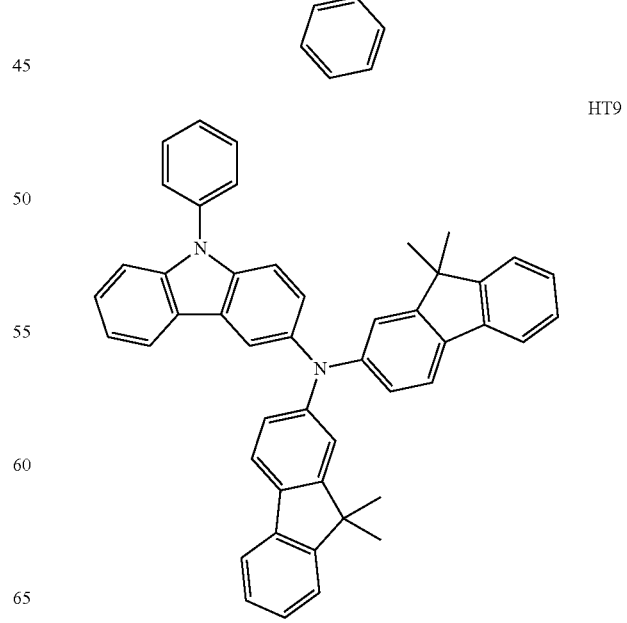

HT10
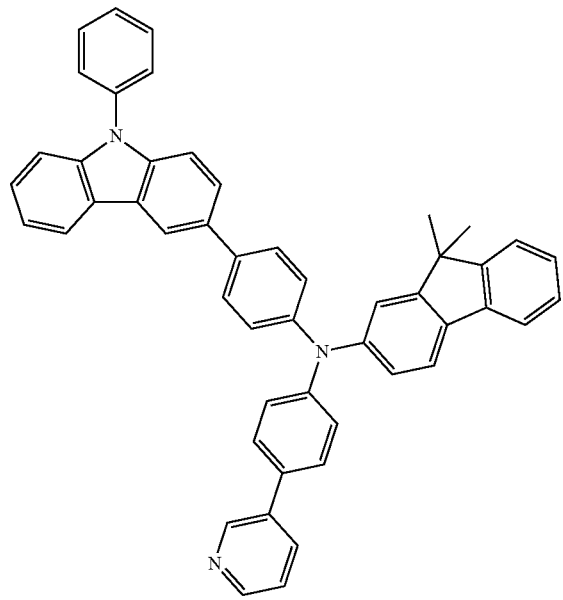
HT11
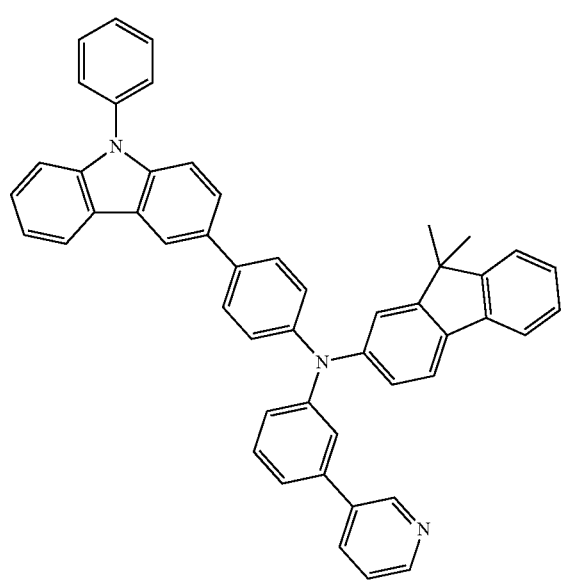
HT12
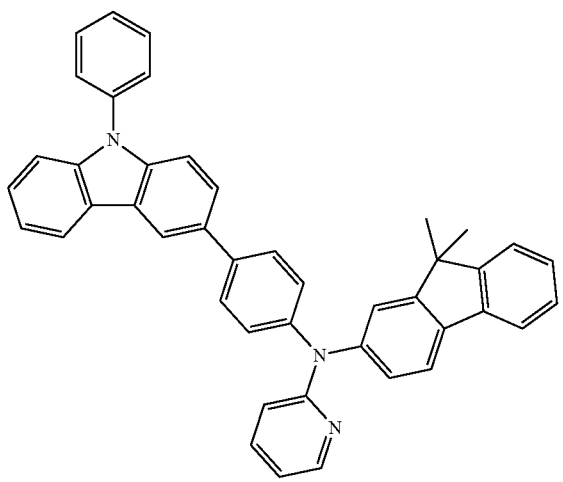
HT13
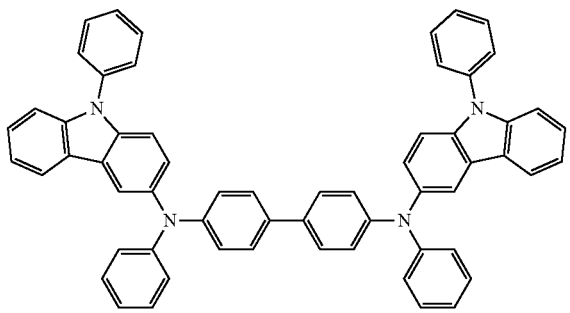
HT14
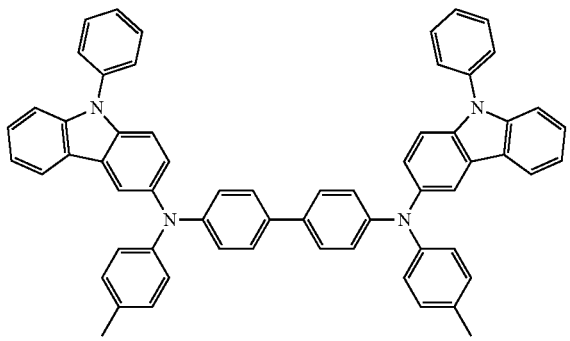
HT15
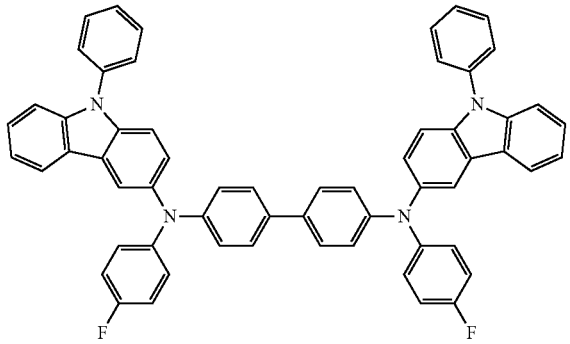

HT16

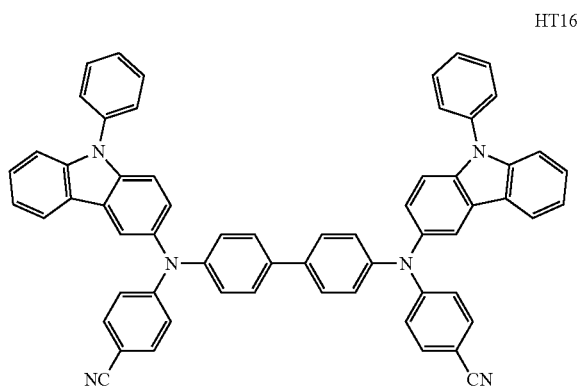

HT17

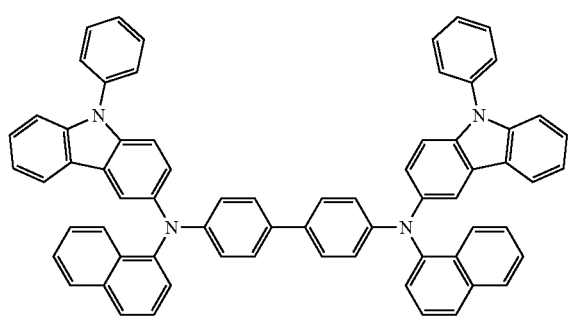

HT18

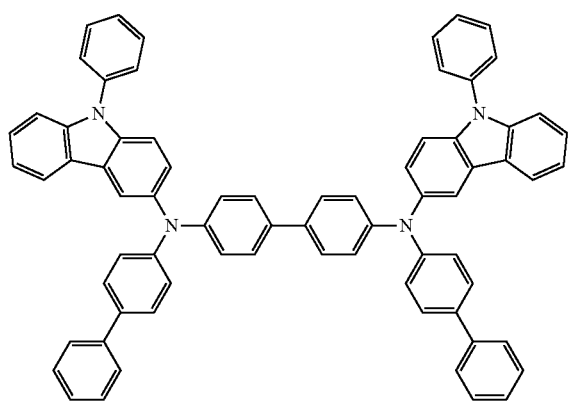

HT19

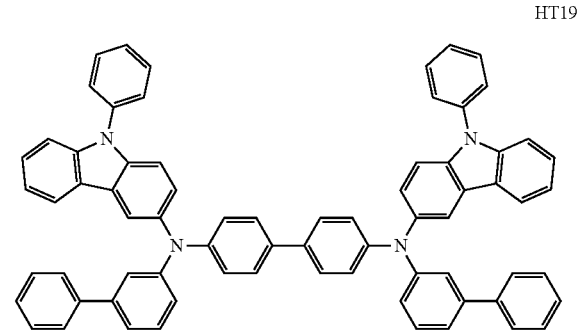

HT20

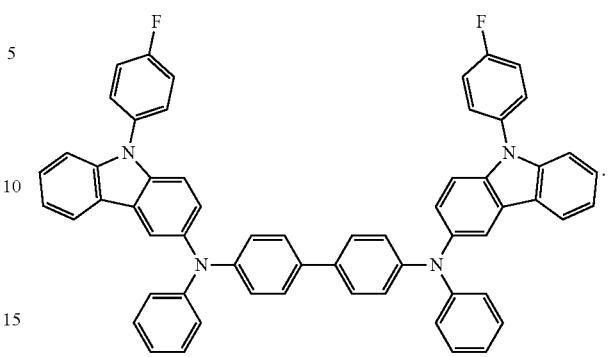

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto:

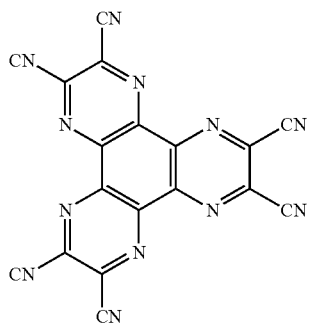

HT-D1

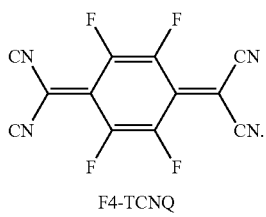

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

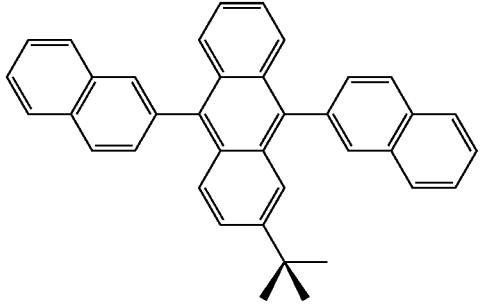

TBADN

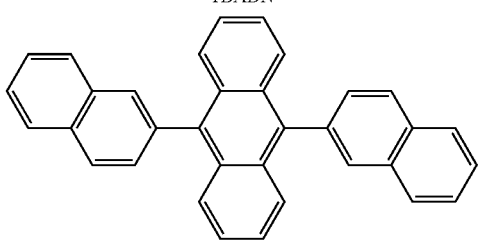

ADN

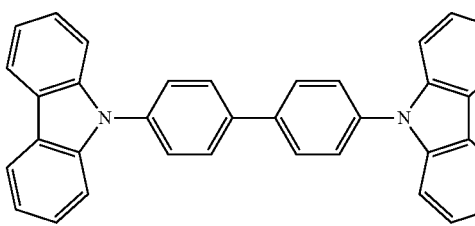

CBP

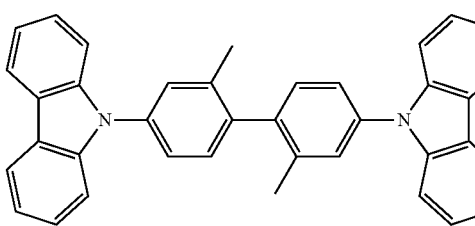

CDBP

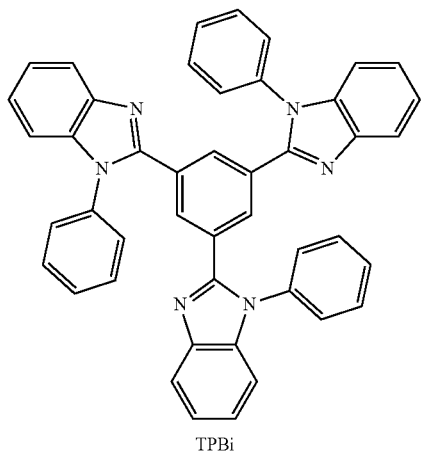

TPBi

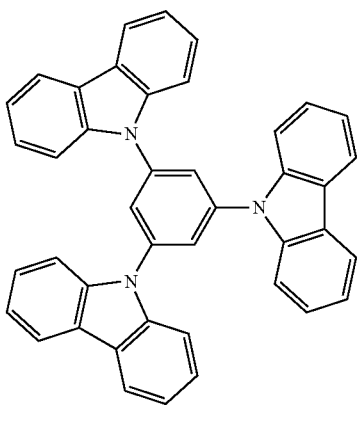

TCP

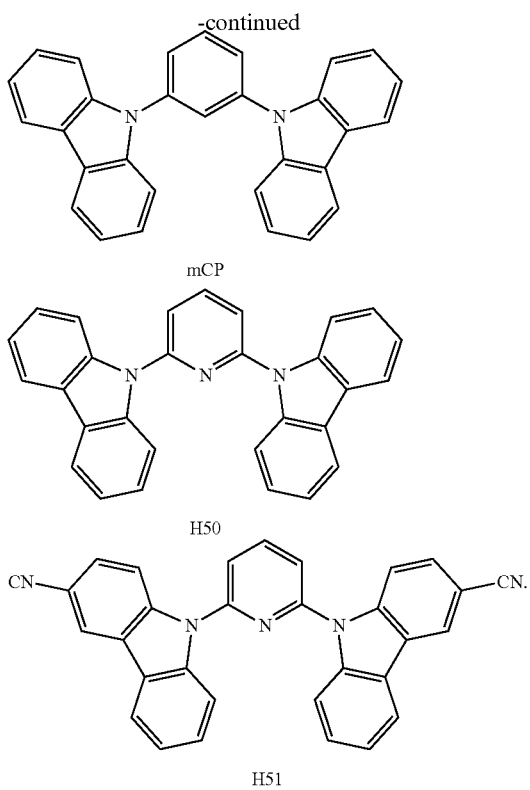

mCP

H50

H51

In one or more embodiments, the host may further include a compound represented by Formula 301:

Formula 301

In Formula 301, $Ar_{111}$ and $Ar_{112}$ may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

In Formula 301, $Ar_{113}$ to $Ar_{116}$ may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

In Formula 301, g, h, i, and j may each independently be an integer from 0 to 4, and may be, for example, 0, 1, or 2.

In Formula 301, $Ar_{113}$ to $Ar_{116}$ may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

[structure]

but embodiments of the present disclosure are not limited thereto.

In one or more embodiments, the host may include a compound represented by Formula 302:

Formula 302

[structure with $Ar_{122}$, $Ar_{126}$, $Ar_{127}$, $(Ar_{125})_k$, $(Ar_{124})_l$, $Ar_{123}$]

In Formula 301, $Ar_{122}$ to $Ar_{125}$ may respectively be the same as described in connection with $Ar_{113}$ in Formula 301.

In Formula 302, $Ar_{126}$ and $Ar_{127}$ may each independently be a $C_1$-$C_{10}$ alkyl group (for example, a methyl group, an ethyl group, or a propyl group).

In Formula 301, k and l may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

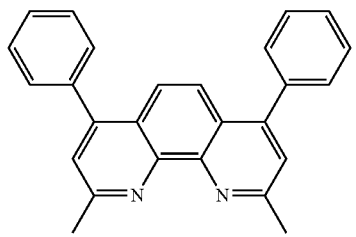

BCP

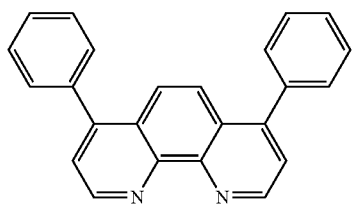

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq$_3$, BAlq, TAZ, and NTAZ:

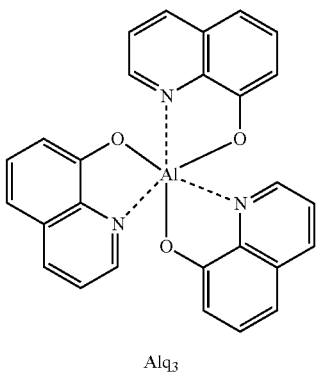

Alq$_3$

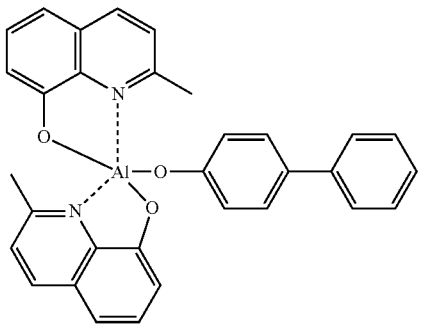

BAlq

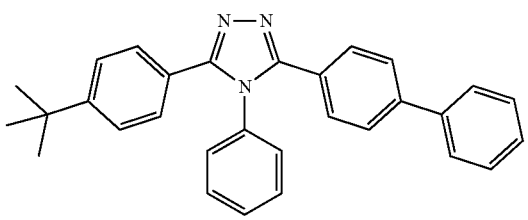

TAZ

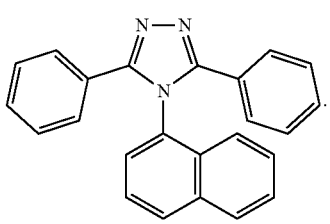

NTAZ

In one or more embodiments, the electron transport layer may include at least one of ET1 to ET25, but are not limited thereto:

ET1
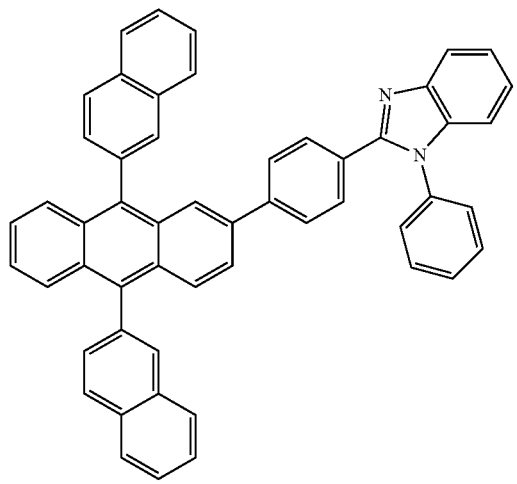
ET2
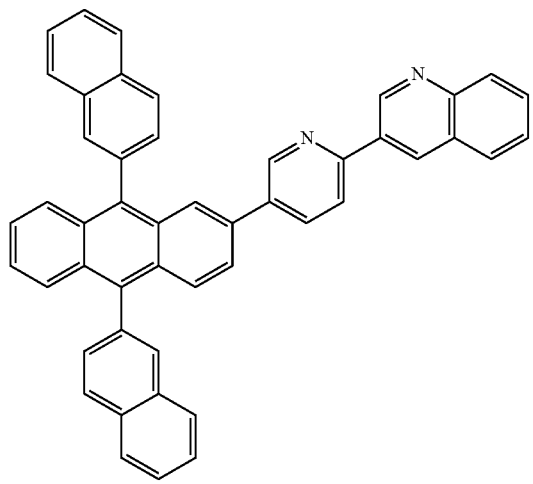
ET3
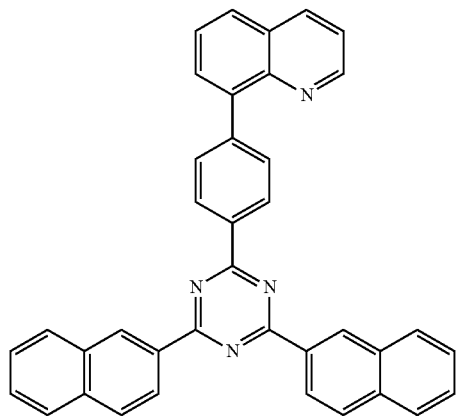
ET4
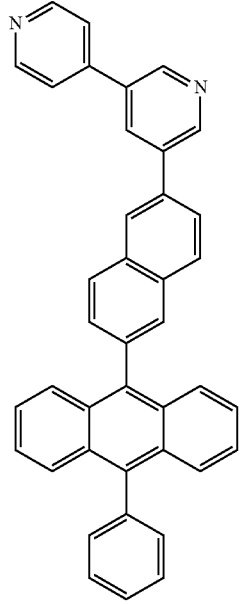
ET5
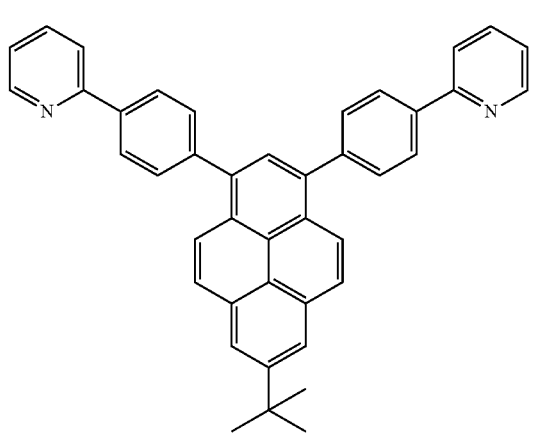
ET6
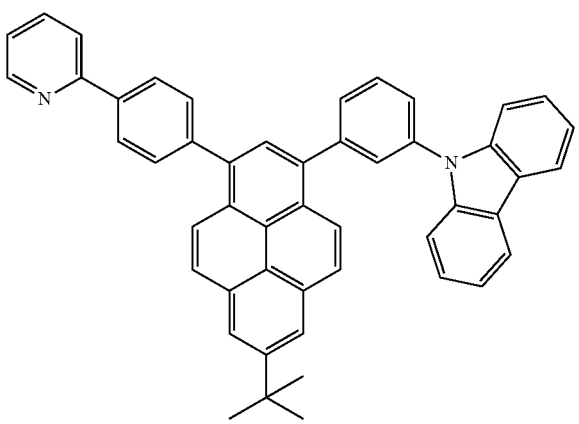

101
-continued
ET7
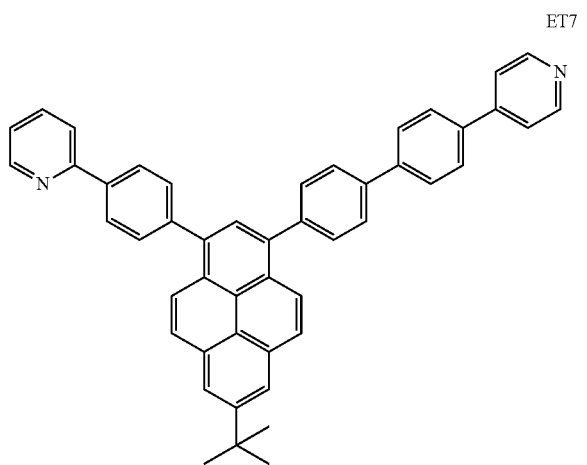
ET8
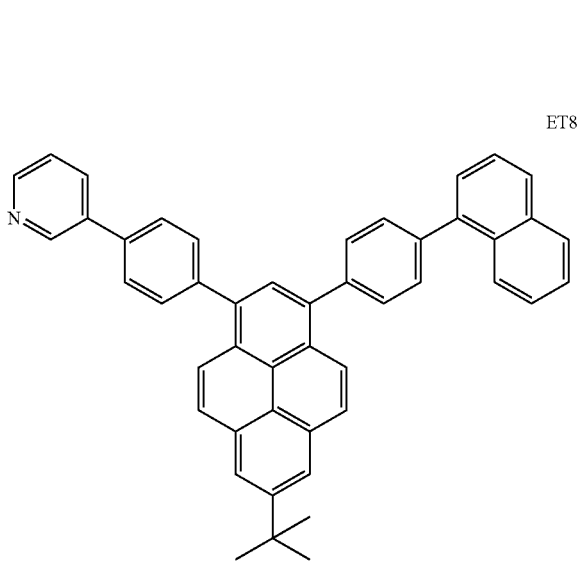
ET9
102
-continued
ET10
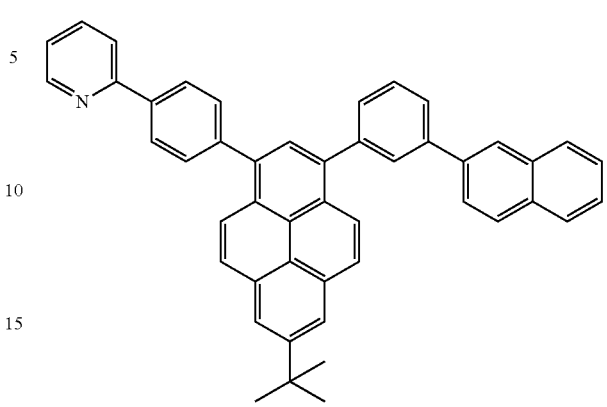
ET11
ET12
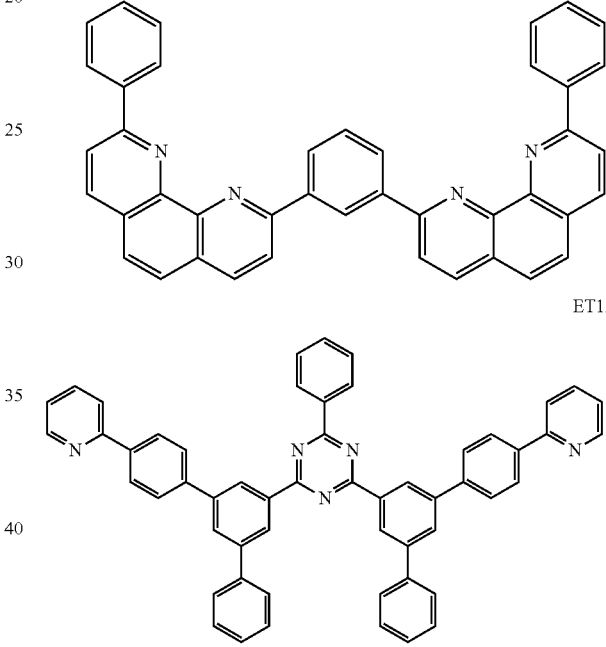
ET13
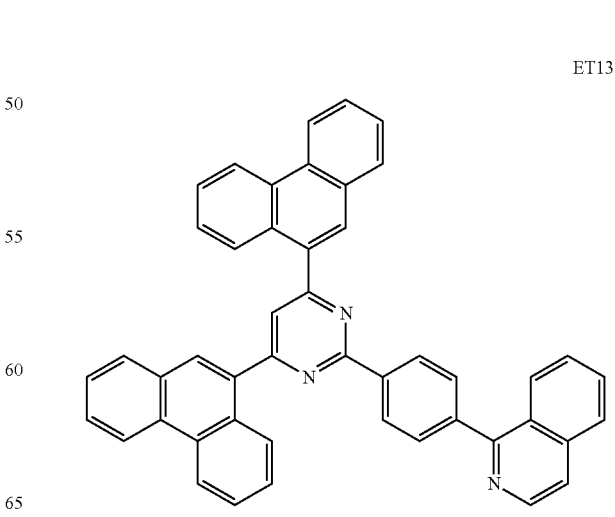

ET14
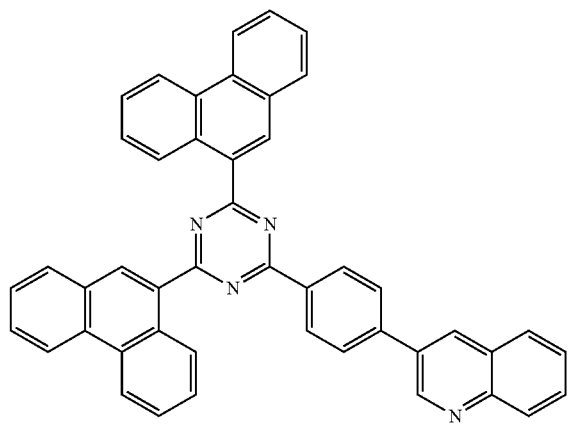
ET15
ET16
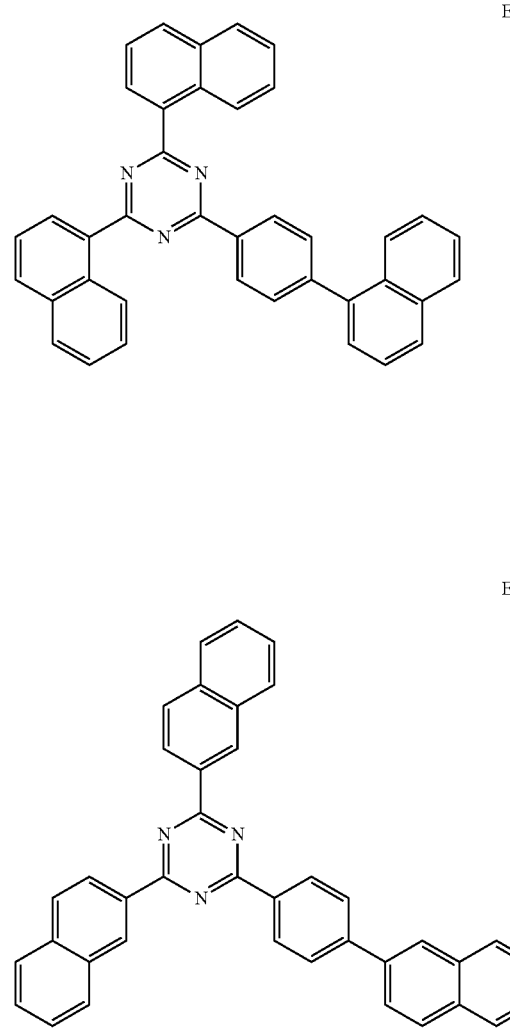
ET17
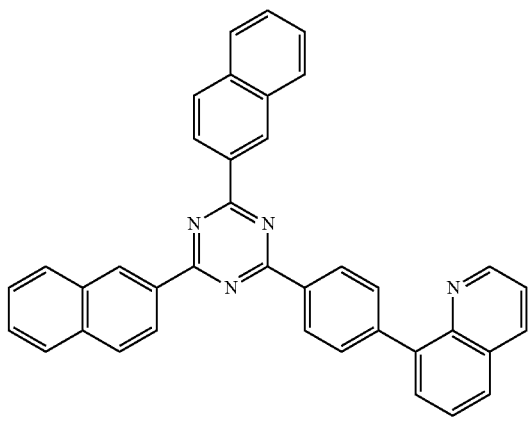
ET18
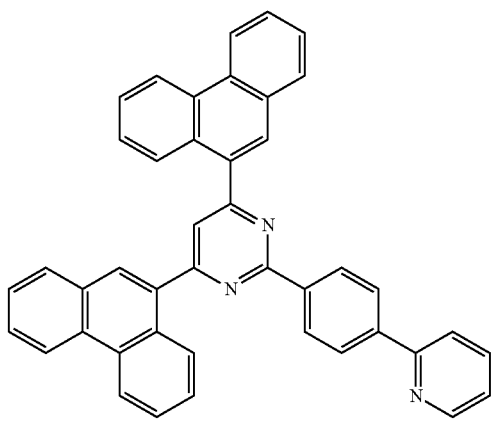
ET19
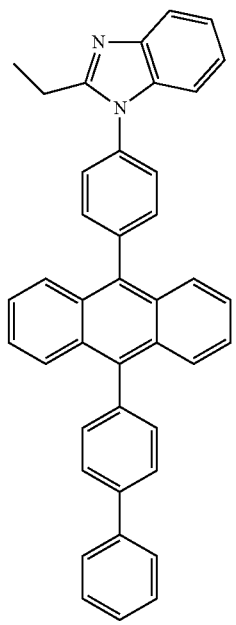

ET20
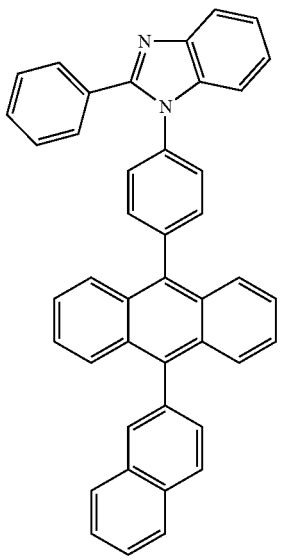
ET21
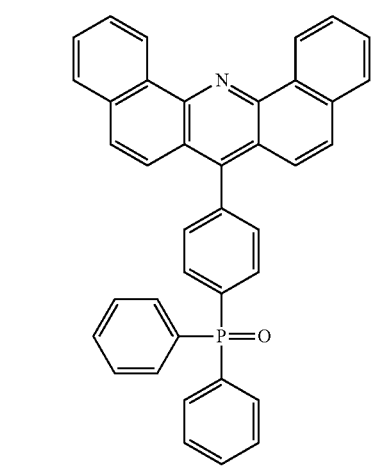
ET22
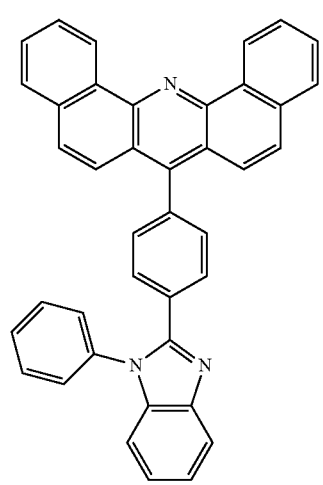
ET23
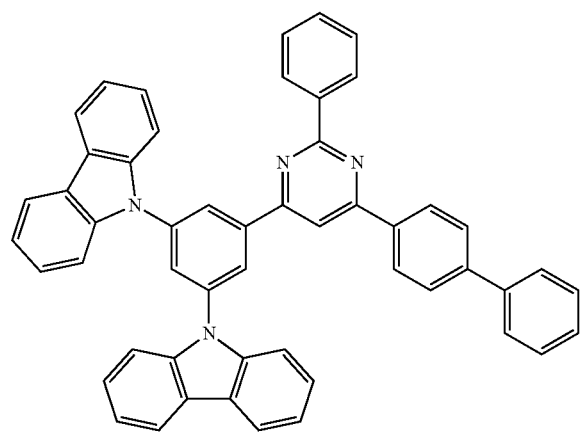
ET24
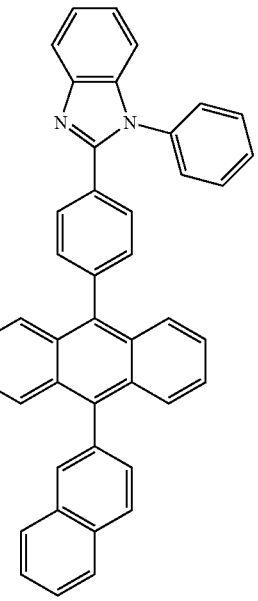
ET25
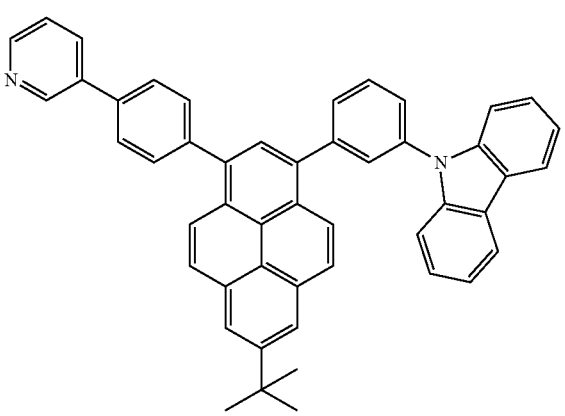
A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2:

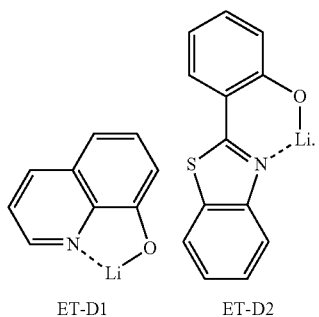

ET-D1      ET-D2

The electron transport region may include an electron injection layer that promotes flow of electrons from the second electrode 19 thereinto.

The electron injection layer may include at least one selected from LiF, NaCl, CsF, Li$_2$O, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —OA$_{101}$ (wherein A$_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a heterocyclic aromatic system that has at least one heteroatom selected from N, O, P, Si, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_7$-$C_{60}$ alkyl aryl group and the $C_2$-$C_{60}$ alkyl heteroaryl group" as used herein refers respectively a $C_6$-$C_{60}$ aryl group and a $C_1$-$C_{60}$ heteroaryl group, each substituted with at least one $C_1$-$C_{60}$ alkyl group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_0$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_7$-$C_{60}$ aryl alkyl group, the substituted $C_1$-$C_{60}$ heteroaryl group, the substituted $C_7$-$C_{60}$ alkyl heteroaryl group, the substituted $C_1$-$C_{60}$ heteroaryloxy group, the substituted $C_1$-$C_{60}$ heteroarylthio group, the $C_2$-$C_{60}$ heteroaryl alkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_7$-$C_{60}$ alkyl heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_7$-$C_{60}$ alkyl heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_7$-$C_{60}$ alkyl heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_7$-$C_{60}$ alkyl heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The expression "B was used instead of A" used in describing Synthesis Examples means that an identical number of molar equivalents of 'B' was used in place of molar equivalents of 'A'.

EXAMPLES

Synthesis Example 1: Synthesis of Compound 1

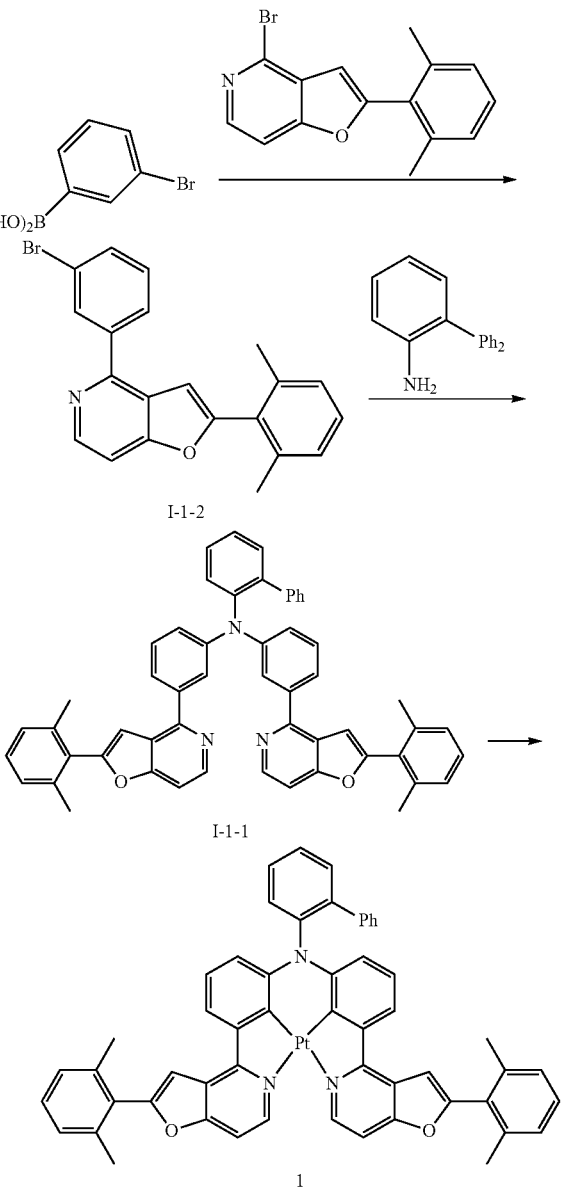

1) Synthesis of Intermediate I-1-2

10.0 grams (g) (49.8 millimoles, mmol) of 3-bromophenylboronic acid, 80 milliliters (ml) of toluene, and 15 ml of ethanol were added to a reactor, and then, 12.5 g (41.5 mmol) of 4-bromo-2-(2,6-dimethylphenyl)furo[3,2-c]pyridine, 3.3 g (2.90 mmol) of Pd(PPh$_3$)$_4$, and 15 ml of 2.0 molar (M) sodium carbonate solution were added thereto. The mixture was then heated and stirred under reflux at a temperature of 110° C. for 18 hours. When the reaction was completed, the resulting mixture was concentrated under reduced pressure, dissolved in 100 ml of dichloromethane, and filtered using diatomite. The organic layer obtained therefrom was dried by using magnesium sulfate to be distilled under reduced pressure, and purified by liquid chromatography to obtain 11.8 g (31 mmol, yield: 75%) of Intermediate I-1-2.

LC-MS m/z=378 (M+H)⁺

2) Synthesis of Intermediate I-1-1

10.0 g (27.6 mmol) of Intermediate I-1-2 and 100 ml of toluene were added to a reactor, and then, 2.0 g (12.0 mmol) of 2-aminobiphenyl, 1.0 g (1.8 mmol) of Pd(dba)$_2$, and 0.8 g (3.6 mmol) of P($^t$Bu)$_3$, and 3.5 g (36 mmol) of sodium butoxide were added thereto. The mixture was then heated and stirred under reflux at a temperature of 120° C. for 24 hours. When the reaction was completed, the resulting mixture was concentrated under reduced pressure, dissolved in dichloromethane, and filtered using diatomite. The organic layer obtained therefrom was dried by using magnesium sulfate to be distilled under reduced pressure, and purified by liquid chromatography to obtain 6.4 g (8.4 mmol, yield: 70%) of Intermediate I-1-1.

LC-MS m/z=764 (M+H)⁺

3) Synthesis of Compound 1

At a temperature of 25° C., 1.5 g (1.96 mmol) of Intermediate I-1-1 was added to 60 ml of benzonitrile. 0.92 g (1.96 mmol) of PtCl$_2$(NCPh)$_2$ was added thereto, and the reaction solution was heated at a temperature of 150° C. for 18 hours. When the reaction was completed, the resulting mixture was concentrated under reduced pressure and purified by liquid chromatography to obtain 0.8 g (0.9 mmol, yield: 45%) of Compound 1. The compound obtained therefrom was confirmed by LCMS.

LC-MS m/z=957 (M+H)⁺

Synthesis Example 2: Synthesis of Compound 2

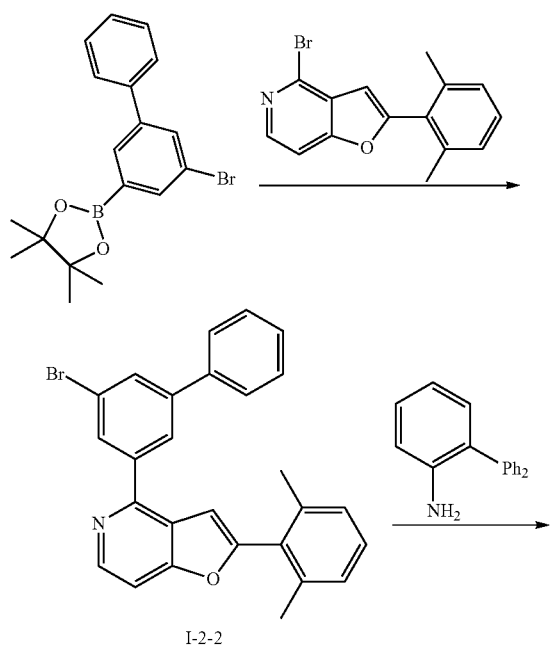

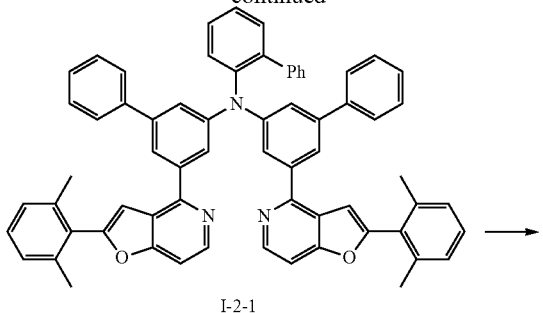

I-2-1

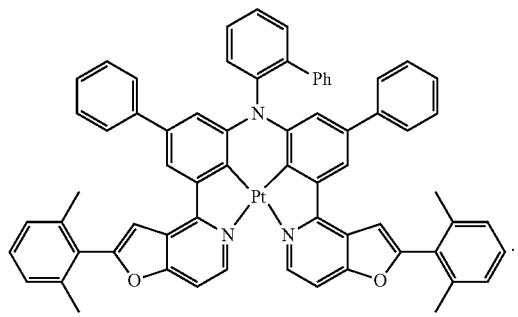

2

1) Synthesis of Intermediate I-2-2

Intermediate I-2-2 (yield: 76%) was synthesized in the same manner as in Synthesis Example 1 for synthesizing Intermediate I-1-2, except that 2-(5-bromo-[1,1'-biphenyl]-3-yl)-4,4,5,5-tetramethyl-1,3,2-dioxaborolane was used instead of 3-bromophenylboronic acid. The compound obtained therefrom was confirmed by LC-MS.

LC-MS m/z=454 (M+H)⁺

2) Synthesis of Intermediate I-2-1

Intermediate I-2-1 (yield: 70%) was synthesized in the same manner as in Synthesis Example 1 for synthesizing Intermediate I-1-1, except that Intermediate I-2-2 was used instead of Intermediate I-1-2. The compound obtained therefrom was confirmed by LC-MS.

LC-MS m/z=916 (M+H)⁺

3) Synthesis of Compound 2

Compound 2 was synthesized in the same manner as in Synthesis Example 1 for synthesizing Compound 1, except that Intermediate I-2-1 was used instead of Intermediate I-1-1. The compound obtained therefrom was confirmed by LC-MS.

LC-MS m/z=1109 (M+H)⁺

Synthesis Example 3: Synthesis of Compound 3

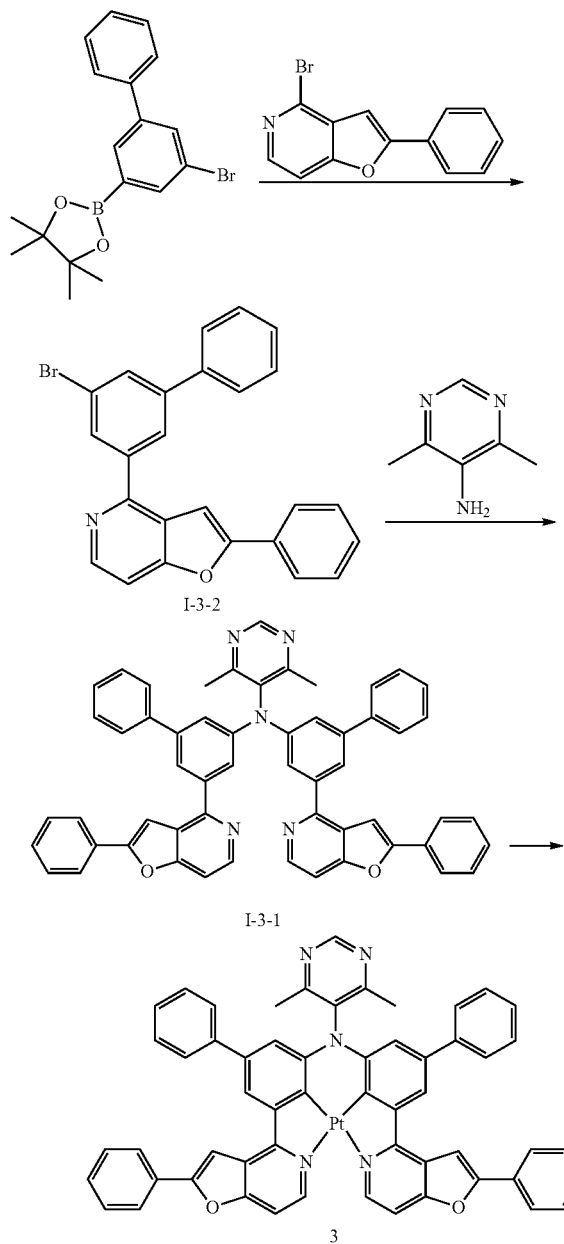

1) Synthesis of Intermediate I-3-2

Intermediate I-3-2 (yield: 70%) was synthesized in the same manner as in Synthesis Example 2 for synthesizing Intermediate I-2-2, except that 4-bromo-2-phenylfuro[3,2-c]pyridine was used instead of 4-bromo-2-(2,6-dimethylphenyl)furo[3,2-c]pyridine. The compound obtained therefrom was confirmed by LC-MS.
LC-MS m/z=426 (M+H)$^+$ 2) Synthesis of Intermediate I-3-1

3.0 g (7.0 mmol) of Intermediate I-3-2 and 80 ml of toluene were added to a reactor, and then, 0.4 g (3.3 mmol) of 4,6-dimethylpyrimidin-5-amine, 0.1 g (0.5 mmol) of Pd(dba)$_2$, 0.2 g (1.0 mmol) of P($^t$Bu)$_3$, and 0.95 g (9.9 mmol) of sodium butoxide were added thereto. The mixture was then heated and stirred under reflux at a temperature of 120° C. for 36 hours. When the reaction was completed, the resulting mixture was concentrated under reduced pressure, dissolved in dichloromethane, and filtered using diatomite. The organic layer obtained therefrom was dried by using magnesium sulfate to be distilled under reduced pressure, and purified by liquid chromatography to obtain 1.4 g (1.7 mmol, yield: 53%) of Intermediate I-3-1.
LC-MS m/z=814 (M+H)$^+$ 3) Synthesis of Compound 3

Compound 3 (yield: 20%) was synthesized in the same manner as in Synthesis Example 1 for synthesizing Compound 1, except that Intermediate I-3-1 was used instead of Intermediate I-1-1. The compound obtained therefrom was confirmed by LCMS.
LC-MS m/z=1007 (M+H)$^+$ Synthesis Example 4: Synthesis of Compound 4

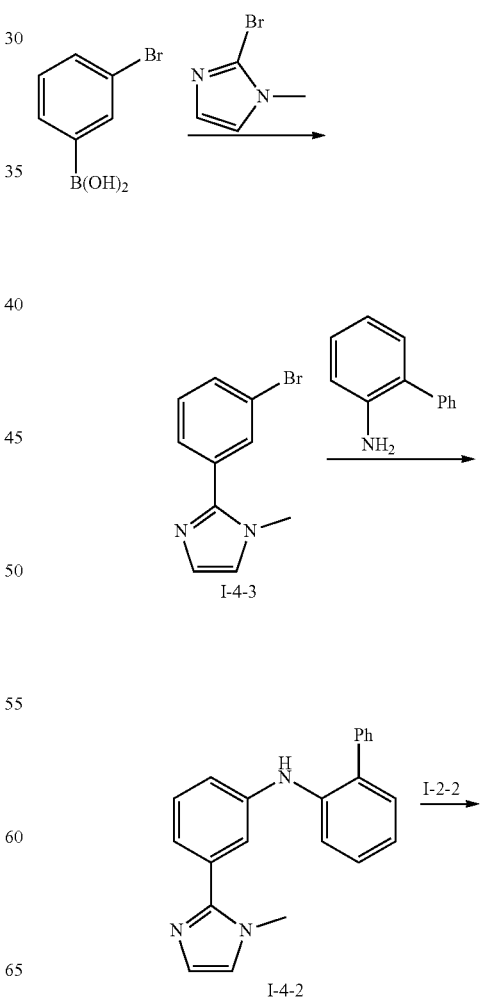

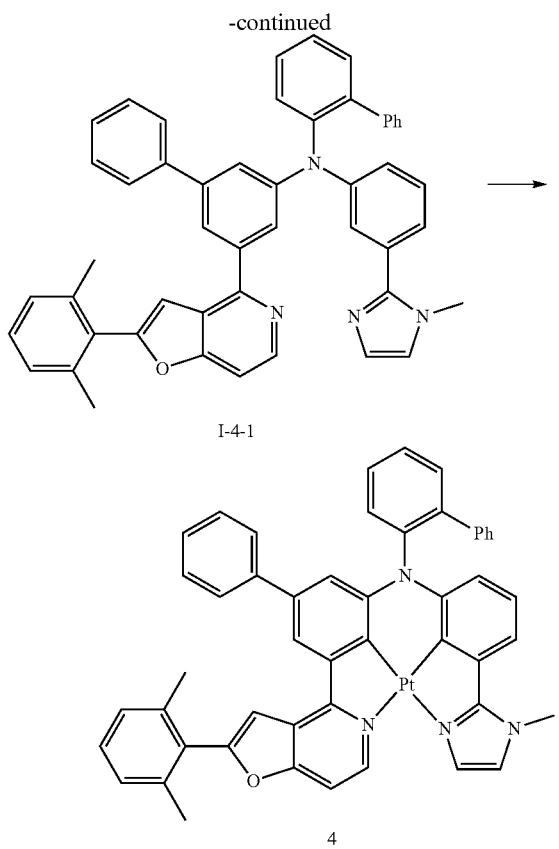

I-4-1

4

1) Synthesis of Intermediate I-4-3

Intermediate I-4-3 (yield: 70%) was synthesized in the same manner as in Synthesis Example 1 for synthesizing Intermediate I-1-2, except that 2-bromo-1-methyl-1H-imidazole was used instead of 4-bromo-2-(2,6-dimethylphenyl)furo[3,2-c]pyridine. The compound obtained therefrom was confirmed by LCMS.

LC-MS m/z=237 (M+H)$^+$

2) Synthesis of Intermediate I-4-2

2.0 g (8.4 mmol) of Intermediate I-4-3 and 60 ml of toluene were added to a reactor, and then, 1.5 g (9.0 mmol) of 2-aminobiphenyl, 0.5 g (0.8 mmol) of Pd(dba)$_2$, 0.3 g (1.6 mmol) of P($^t$Bu)$_3$, and 3.6 g (16.8 mmol) of sodium butoxide were added thereto. The mixture was then heated and stirred under reflux at a temperature of 120° C. for 18 hours. When the reaction was completed, the resulting mixture was concentrated under reduced pressure, dissolved in dichloromethane, and filtered using diatomite. The organic layer obtained therefrom was dried by using magnesium sulfate to be distilled under reduced pressure, and purified by liquid chromatography to obtain 2.1 g (6.7 mmol, yield: 85%) of Intermediate I-4-2.

LC-MS m/z=326 (M+H)$^+$

3) Synthesis of Intermediate I-4-1

1.0 g (3.1 mmol) of Intermediate I-4-2 and 80 ml of toluene were added to a reactor, and then, 1.4 g (3.1 mmol) of Intermediate I-2-2, 0.17 g (0.3 mmol) of Pd(dba)$_2$, 0.12 g (0.6 mmol) of P($^t$Bu)$_3$, and 0.6 g (6.2 mmol) of sodium butoxide were added thereto. The mixture was then heated and stirred under reflux at a temperature of 120° C. for 16 hours. When the reaction was completed, the resulting mixture was concentrated under reduced pressure, dissolved in dichloromethane, and filtered using diatomite. The organic layer obtained therefrom was dried by using magnesium sulfate to be distilled under reduced pressure, and purified by liquid chromatography to obtain 1.1 g (1.6 mmol, yield: 52%) of Intermediate I-4-1.

LC-MS m/z=699 (M+H)$^+$

4) Synthesis of Compound 4

Compound 4 (yield: 50%) was synthesized in the same manner as in Synthesis Example 1 for synthesizing Compound 1, except that Intermediate I-4-1 was used instead of Intermediate I-1-1. The compound obtained therefrom was confirmed by LCMS.

LC-MS m/z=892 (M+H)$^+$

Synthesis Example 5: Synthesis of Compound 5

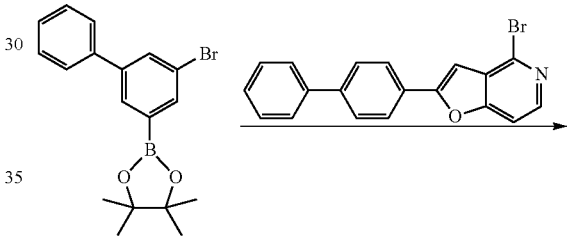

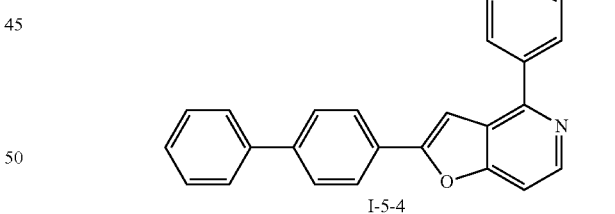

I-5-4

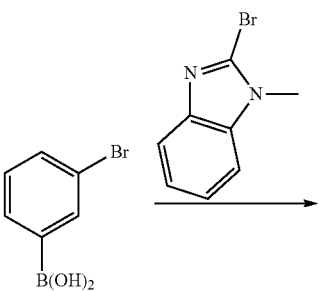

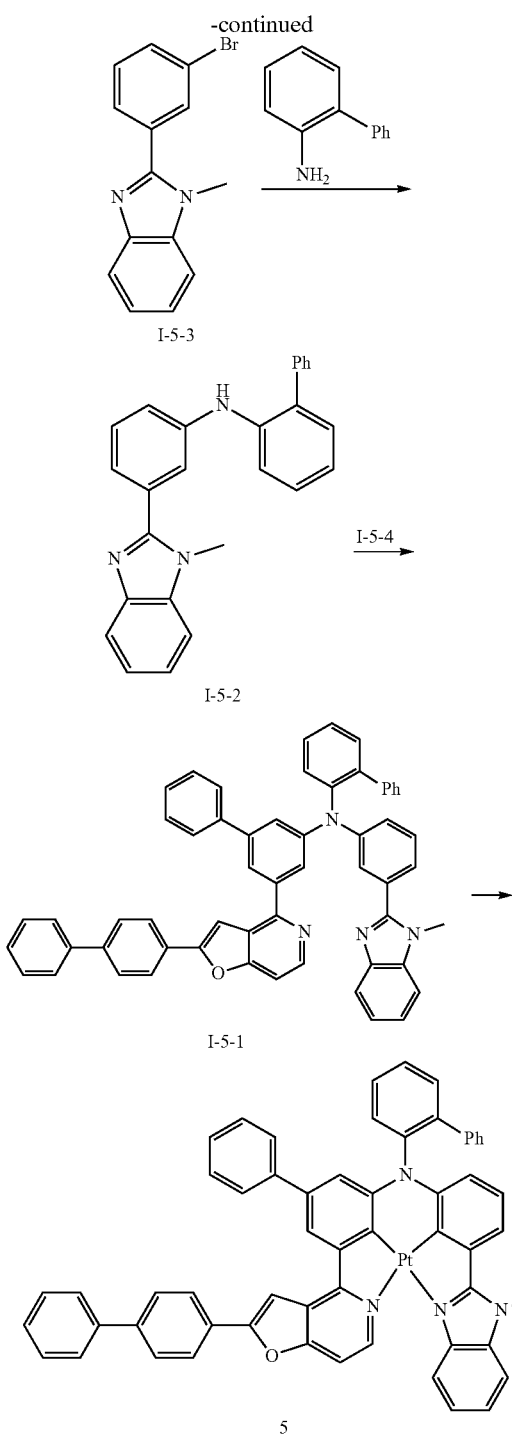

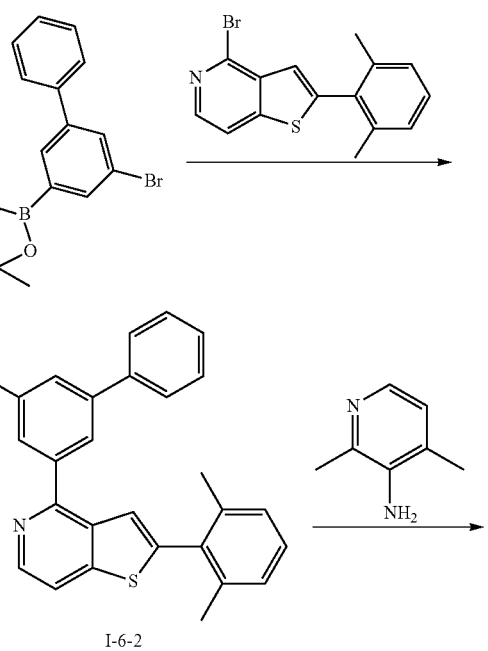

2) Synthesis of Intermediate I-5-3

Intermediate I-5-3 (yield: 75%) was synthesized in the same manner as in Synthesis Example 4 for synthesizing Intermediate I-4-3, except that 2-bromo-1-methyl-1H-benzo[d]imidazole was used instead of 2-bromo-1-methyl-1H-imidazole. The compound obtained therefrom was confirmed by LCMS.

LC-MS m/z=287 (M+H)$^+$

3) Synthesis of Intermediate I-5-2

Intermediate I-5-2 (yield: 80%) was synthesized in the same manner as in Synthesis Example 4 for synthesizing Intermediate I-4-2, except that Intermediate I-5-3 was used instead of Intermediate I-4-3. The compound obtained therefrom was confirmed by LCMS.

LC-MS m/z=376 (M+H)$^+$

3) Synthesis of Intermediate I-5-1

Intermediate I-5-1 (yield: 70%) was synthesized in the same manner as in Synthesis Example 4 for synthesizing Intermediate I-4-1, except that Intermediate I-5-2 and Intermediate I-5-4 were used instead of Intermediate I-4-2 and Intermediate I-2-2, respectively. The compound obtained therefrom was confirmed by LCMS.

LC-MS m/z=747 (M+H)$^+$

4) Synthesis of Compound 5

Compound 5 (yield: 40%) was synthesized in the same manner as in Synthesis Example 1 for synthesizing Compound 1, except that Intermediate I-5-1 was used instead of Intermediate I-1-1. The compound obtained therefrom was confirmed by LCMS.

LC-MS m/z=990 (M+H)$^+$

Synthesis Example 6: Synthesis of Compound 6

1) Synthesis of Intermediate I-5-4

Intermediate I-5-4 (yield: 60%) was synthesized in the same manner as in Synthesis Example 2 for synthesizing Intermediate I-2-2, except that 2-([1,1'-biphenyl]-4-yl)-4-bromofuro[3,2-c]pyridine was used instead of 4-bromo-2-(2,6-dimethylphenyl)furo[3,2-c]pyridine. The compound obtained therefrom was confirmed by LCMS.

LC-MS m/z=424 (M+H)$^+$

-continued

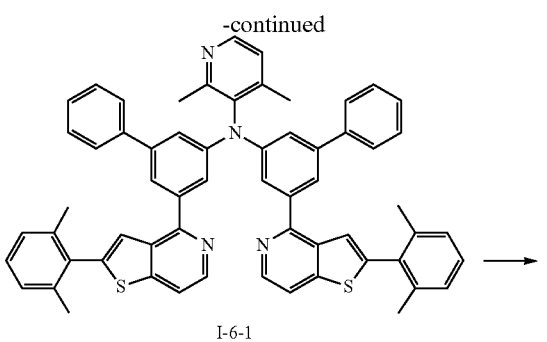

I-6-1

↓

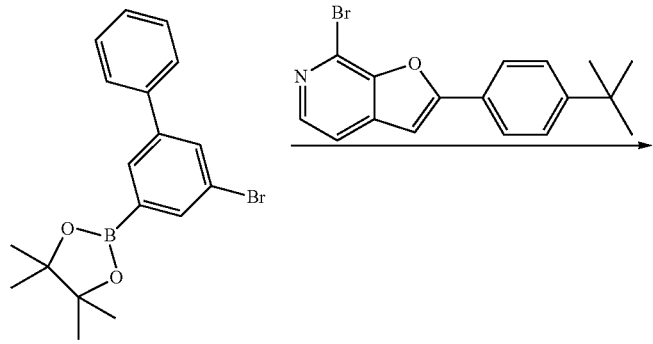

6

1) Synthesis of Intermediate I-6-2

Intermediate I-6-2 (yield: 70%) was synthesized in the same manner as in Synthesis Example 2 for synthesizing Intermediate I-2-2, except that 4-bromo-2-(2,6-dimethylphenyl)thieno[3,2-c]pyridine was used instead of 4-bromo-2-(2,6-dimethylphenyl)furo[3,2-c]pyridine. The compound obtained therefrom was confirmed by LCMS.

LC-MS m/z=470 (M+H)$^+$

2) Synthesis of Intermediate I-6-1

Intermediate I-6-1 (yield: 56%) was synthesized in the same manner as in Synthesis Example 1 for synthesizing Intermediate I-2-21, except that 2,4-dimethylpyridin-3-amine was used instead of 2-aminobiphenyl. The compound obtained therefrom was confirmed by LCMS.

LC-MS m/z=901 (M+H)$^+$

3) Synthesis of Compound 6

Compound 6 (yield: 28%) was synthesized in the same manner as in Synthesis Example 1 for synthesizing Compound 1, except that Intermediate I-6-1 was used instead of Intermediate I-1-1. The compound obtained therefrom was confirmed by LCMS.

LC-MS m/z=1094 (M+H)$^+$

Synthesis Example 7: Synthesis of Compound 7

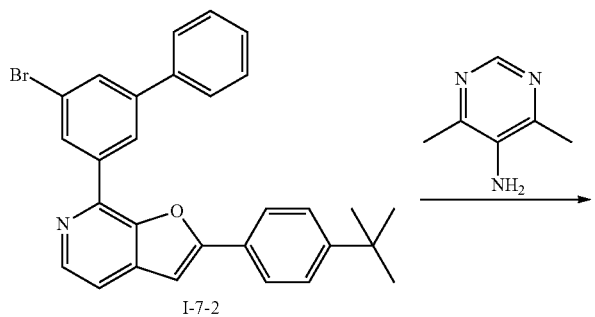

I-7-2

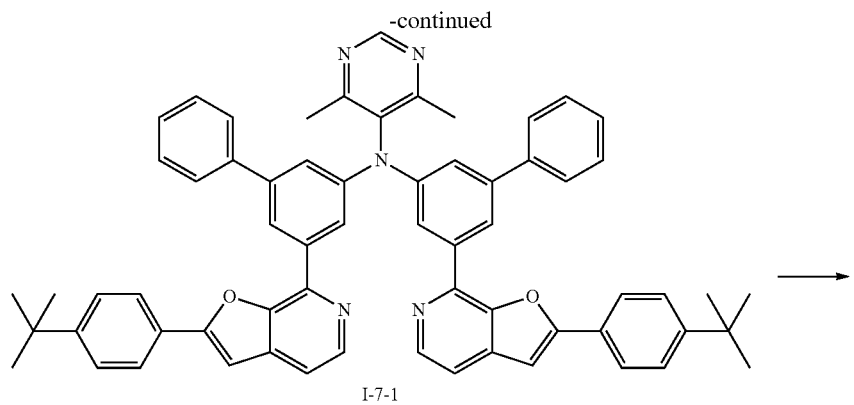

I-7-1

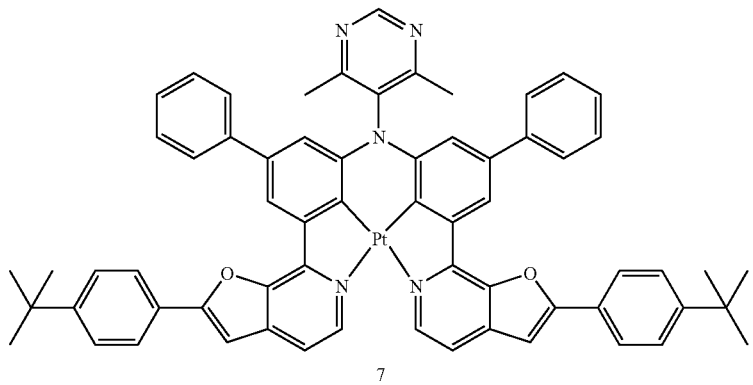

7

1) Synthesis of Intermediate I-7-2

Intermediate I-7-2 (yield: 60%) was synthesized in the same manner as in Synthesis Example 2 for synthesizing Intermediate I-2-2, except that 7-bromo-2-(4-(tert-butyl)phenyl)furo[2,3-c]pyridine was used instead of 4-bromo-2-(2,6-dimethylphenyl)furo[3,2-c]pyridine. The compound obtained therefrom was confirmed by LCMS.
LC-MS m/z=482 (M+H)$^+$

2) Synthesis of Intermediate I-7-1

Intermediate I-7-1 (yield: 45%) was synthesized in the same manner as in Synthesis Example 3 for synthesizing Intermediate I-3-1, except that Intermediate I-7-2 was used instead of Intermediate I-3-2. The compound obtained therefrom was confirmed by LCMS.
LC-MS m/z=926 (M+H)$^+$

3) Synthesis of Compound 7

Compound 7 (yield: 25%) was synthesized in the same manner as in Synthesis Example 1 for synthesizing Compound 1, except that Intermediate I-7-1 was used instead of Intermediate I-1-1. The compound obtained therefrom was confirmed by LCMS.
LC-MS m/z=1119 (M+H)$^+$ Synthesis Example 8: Synthesis of Compound 8

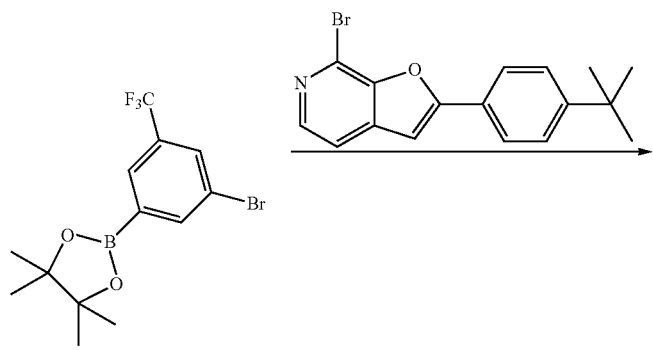

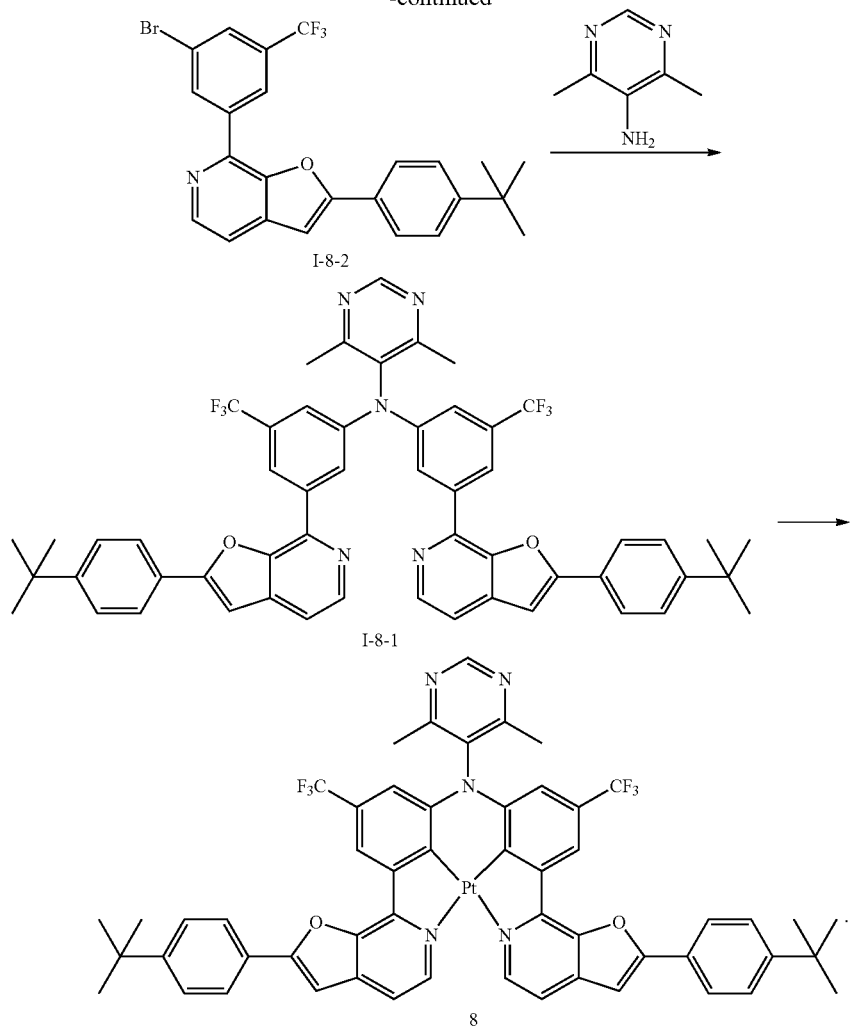

1) Synthesis of Intermediate I-8-2

Intermediate I-8-2 (yield: 85%) was synthesized in the same manner as in Synthesis Example 7 for synthesizing Intermediate I-7-2, except that 2-(3-bromo-5-(trifluoromethyl)phenyl)-4,4,5,5-tetramethyl-1,3,2-dioxaborolane was used instead of 2-(5-bromo-[1,1'-biphenyl]-3-yl)-4,4,5,5-tetramethyl-1,3,2-dioxaborolane. The compound obtained therefrom was confirmed by LCMS.

LC-MS m/z=474 (M+H)$^+$

2) Synthesis of Intermediate I-8-1

Intermediate I-8-1 (yield: 50%) was synthesized in the same manner as in Synthesis Example 7 for synthesizing Intermediate I-7-1, except that Intermediate I-8-2 was used instead of Intermediate I-7-2. The compound obtained therefrom was confirmed by LCMS.

LC-MS m/z=910 (M+H)$^+$

3) Synthesis of Compound 8

Compound 8 (yield: 20%) was synthesized in the same manner as in Synthesis Example 1 for synthesizing Compound 1, except that Intermediate I-8-1 was used instead of Intermediate I-1-1. The compound obtained therefrom was confirmed by LCMS.

LC-MS m/z=1103 (M+H)$^+$

Synthesis Example 9: Synthesis of Compound 9

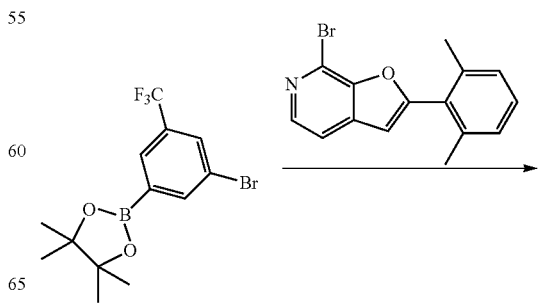

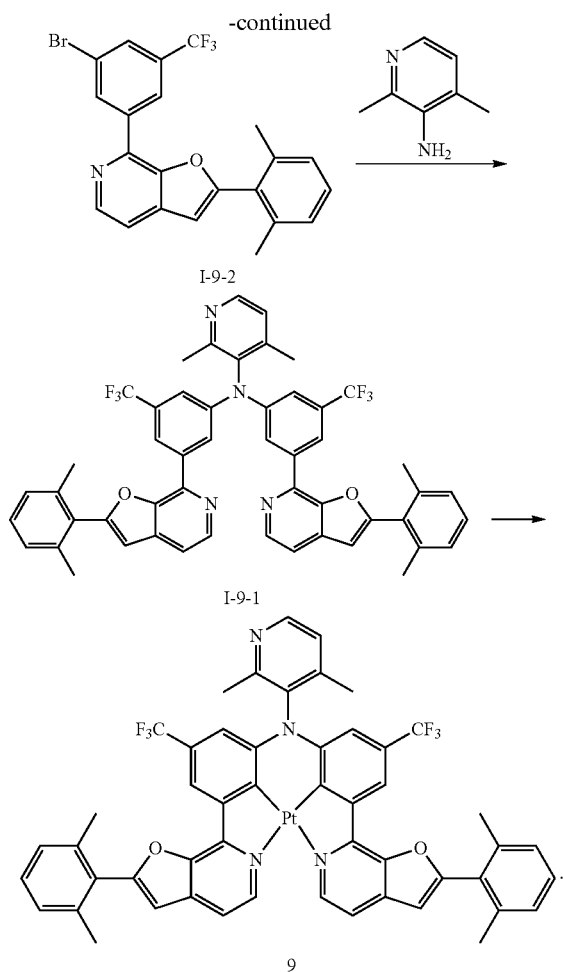

1) Synthesis of Intermediate I-9-2

Intermediate I-9-2 (yield: 80%) was synthesized in the same manner as in Synthesis Example 2 for synthesizing Intermediate I-2-2, except that 7-bromo-2-(2,6-dimethylphenyl)furo[2,3-c]pyridine and 2-(3-bromo-5-(trifluoromethyl)phenyl)-4,4,5,5-tetramethyl-1,3,2-dioxaborolane were used instead of 4-bromo-2-(2,6-dimethylphenyl)furo[3,2-c]pyridine and 2-(5-bromo-[1,1'-biphenyl]-3-yl)-4,4,5,5-tetramethyl-1,3,2-dioxaborolane, respectively. The compound obtained therefrom was confirmed by LCMS.

LC-MS m/z=446 (M+H)+

2) Synthesis of Intermediate I-9-1

Intermediate I-9-1 (yield: 60%) was synthesized in the same manner as in Synthesis Example 6 for synthesizing Intermediate I-6-1, except that Intermediate I-9-2 was used instead of Intermediate I-6-2. The compound obtained therefrom was confirmed by LCMS.

LC-MS m/z=853 (M+H)+

3) Synthesis of Compound 9

Compound 9 (yield: 35%) was synthesized in the same manner as in Synthesis Example 1 for synthesizing Compound 1, except that Intermediate I-9-1 was used instead of Intermediate I-1-1. The compound obtained therefrom was confirmed by LCMS.

LC-MS m/z=1046 (M+H)+

Synthesis Example 10: Synthesis of Compound 10

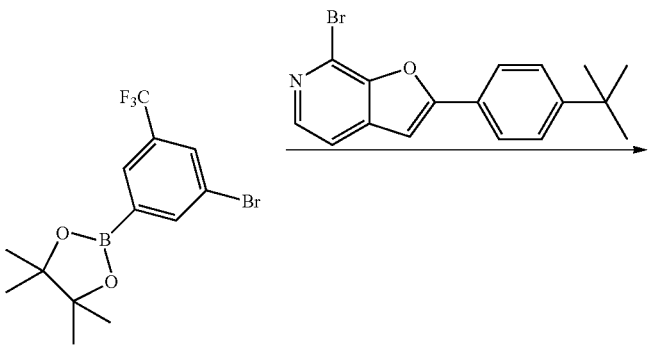

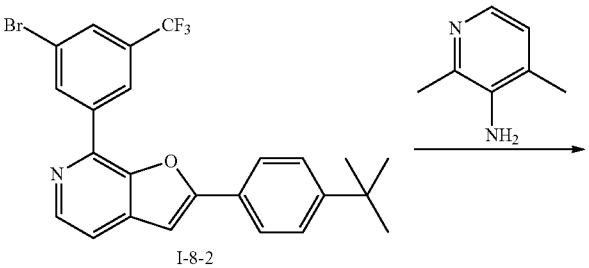

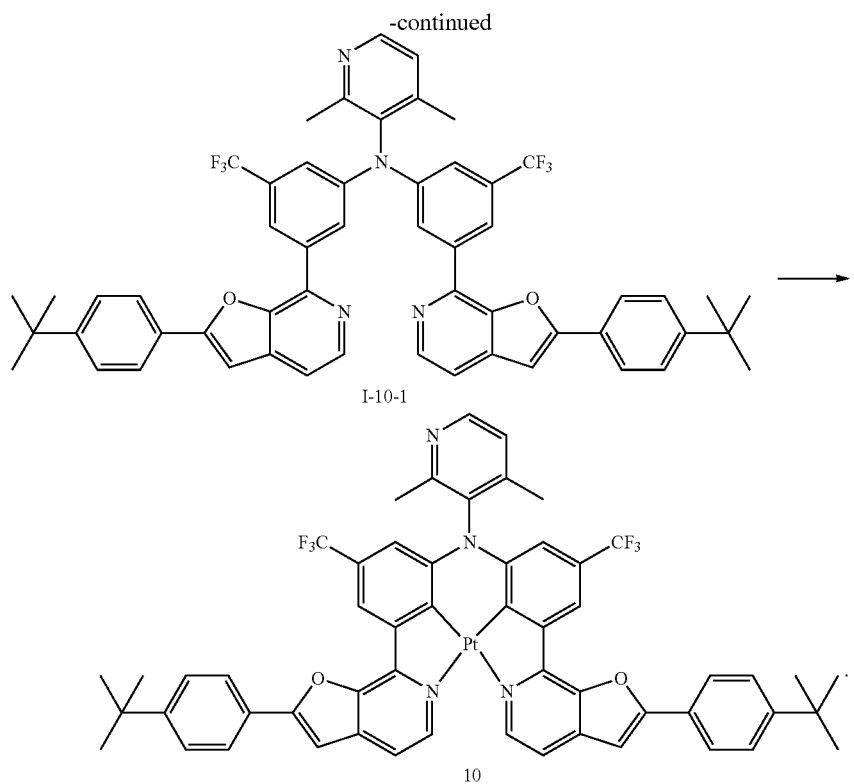

1) Synthesis of Intermediate I-10-1

Intermediate I-10-1 (yield: 55%) was synthesized in the same manner as in Synthesis Example 8 for synthesizing Intermediate I-8-1, except that 2,4-dimethylpyridin-3-amine was used instead of 4,6-dimethylpyrimidin-5-amine. The compound obtained therefrom was confirmed by LCMS.

LC-MS m/z=909 (M+H)$^+$

2) Synthesis of Compound 10

Compound 10 (yield: 25%) was synthesized in the same manner as in Synthesis Example 1 for synthesizing Compound 1, except that Intermediate I-10-1 was used instead of Intermediate I-1-1. The compound obtained therefrom was confirmed by LCMS.

LC-MS m/z=1102 (M+H)$^+$

Synthesis Example 11: Synthesis of Compound 11

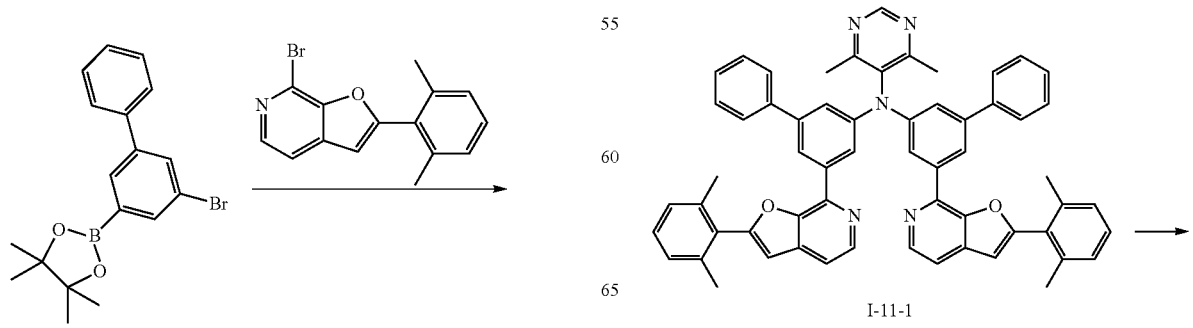

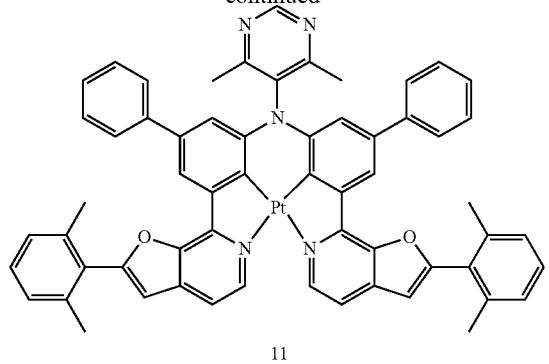

11

1) Synthesis of Intermediate I-11-2

Intermediate I-11-2 (yield: 83%) was synthesized in the same manner as in Synthesis Example 7 for synthesizing Intermediate I-7-2, except that 7-bromo-2-(2,6-dimethylphenyl)furo[2,3-c]pyridine was used instead of 7-bromo-2-(4-(tert-butyl)phenyl)furo[2,3-c]pyridine. The compound obtained therefrom was confirmed by LCMS.
LC-MS m/z=454 (M+H)$^+$ 2) Synthesis of Intermediate I-11-1

Intermediate I-11-1 (yield: 65%) was synthesized in the same manner as in Synthesis Example 7 for synthesizing Intermediate I-7-1, except that Intermediate I-11-2 was used instead of Intermediate I-7-2. The compound obtained therefrom was confirmed by LCMS.
LC-MS m/z=870 (M+H)$^+$ 3) Synthesis of Compound 11

Compound 11 (yield: 40%) was synthesized in the same manner as in Synthesis Example 1 for synthesizing Compound 1, except that Intermediate I-11-1 was used instead of Intermediate I-1-1. The compound obtained therefrom was confirmed by LCMS.
LC-MS m/z=1063 (M+H)$^+$ Synthesis Example 12: Synthesis of Compound 12

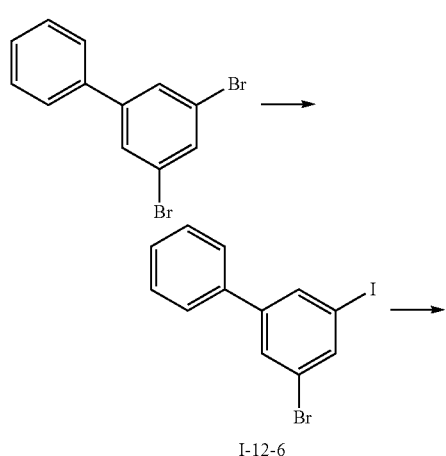

I-12-6

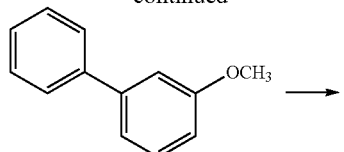

I-12-5

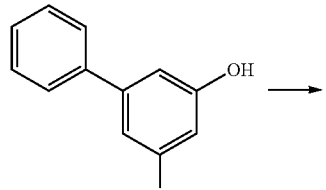

I-12-4

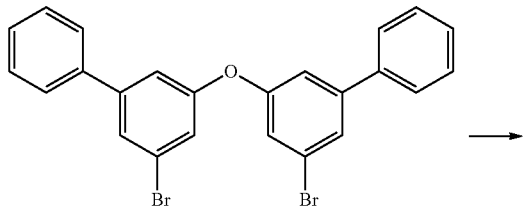

I-12-3

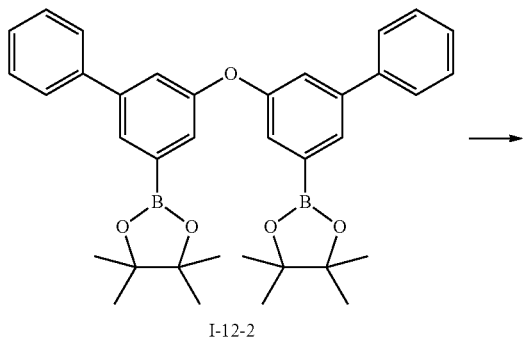

I-12-2

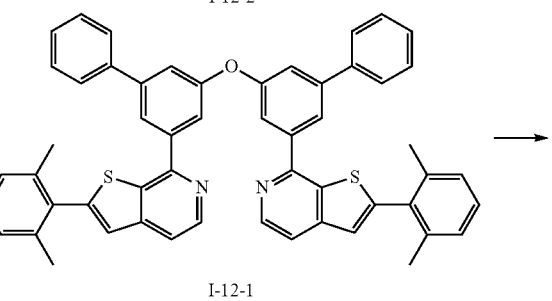

I-12-1

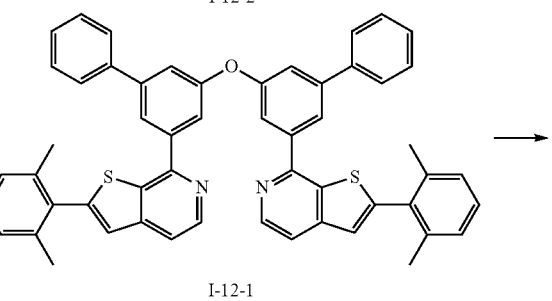

12

1) Synthesis of Intermediate I-12-6

9.6 g (31.0 mmol) of 3,5-dibromo-1,1'-biphenyl was dissolved in 250 ml of diethyl ether in a reactor, and then, 1.6 M n-BuLi in Hexane solution was slowly added dropwise thereto at a temperature of −78° C. The mixed solution was stirred at a temperature of −78° C. for 1 hour, and Iodine-solution in THF (9.5 g, 37 mmol) was slowly added dropwise thereto at a temperature of −78° C. for 30 minutes. After 30 minutes, the temperature of the reactor was raised to room temperature, and the reactor was stirred for 18 hours. When the reaction was completed, water and a saturated sodium thiosulfate-aqueous solution were added to the reactor, and an extraction process was performed thereon by using ethyl acetate. The organic layer obtained therefrom was dried by using magnesium sulfate to be distilled under reduced pressure, and purified by liquid chromatography to obtain 10.5 g (29.4 mmol, yield: 95%) of Intermediate I-12-6.

LC-MS m/z=360 (M+H)$^+$

2) Synthesis of Intermediate I-12-5

10.5 g (29.4 mmol) of Intermediate I-12-6 and 100 ml of methanol were added to a Seal-tube, and then, 1.4 g (5.9 mmol) of 4,7-dimethoxyphenanthroline, 0.6 g (2.9 mmol) of CuI, and 19.1 g (58.8 mmol) of $CsCO_3$ were added thereto. The mixture was then heated and stirred under reflux at a temperature of 100° C. for 24 hours. When the reaction was completed, the resulting mixture was concentrated under reduced pressure, dissolved in dichloromethane, and filtered using diatomite. The organic layer obtained therefrom was dried by using magnesium sulfate to be distilled under reduced pressure, and purified by liquid chromatography to obtain 6.6 g (25.0 mmol, yield: 85%) of Intermediate I-12-5.

LC-MS m/z=264 (M+H)$^+$

3) Synthesis of Intermediate I-12-4

6.6 g (25.0 mmol) of Intermediate I-12-5 was dissolved in 100 ml of dichloromethane in a reactor, and then, 1.0 M $BBr_3$ in dichloromethane solution was slowly added dropwise thereto at a temperature of 0° C. The mixed solution was stirred at a temperature of 0° C. for 1 hour, and stirred again at room temperature for 18 hours. When the reaction was completed, a small amount of methanol and a saturated sodium hydrogen carbonate-aqueous solution were added to the reactor at a temperature of 0° C., and an extraction process was performed thereon. The organic layer obtained therefrom was dried by using magnesium sulfate to be distilled under reduced pressure, and purified by liquid chromatography to obtain 5.9 g (23.7 mmol, yield: 95%) of Intermediate I-12-4.

4) Synthesis of Intermediate I-12-3

3.0 g (12.0 mmol) of Intermediate I-12-4 and 4.3 g (12.0 mmol) of Intermediate I-12-6 were dissolved in 60 ml of N,N-dimethylformamide in a reactor, and then, 0.2 g (1.2 mmol) of CuI, 0.3 g (2.4 mmol) of pyridine-2-carboxylic acid and 5.0 g (24.0 mmol) of $K_3PO_4$ were added thereto. The mixture was stirred at a temperature of 120° C. for 8 hours. When the reaction was completed, an extraction process was performed thereon by using water and ethyl acetate. The organic layer obtained therefrom was dried by using magnesium sulfate to be distilled under reduced pressure, and purified by liquid chromatography to obtain 3.1 g (6.6 mmol, yield: 55%) of Intermediate I-12-3.

5) Synthesis of Intermediate I-12-2

3.1 g (6.6 mmol) of Intermediate I-12-3, 5.0 g (19.8 mmol) of bis(pinacolato)diboron were dissolved in 60 ml of toluene, and then, 0.7 g (1.0 mmol) of $PdCl_2(dppf)_2$, 1.9 g of (19.8 mmol) of KOAc were added thereto. The mixture was stirred at a temperature of 125° C. for 18 hours. When the reaction was completed, the resulting mixture was filtered using diatomite, and an extraction process was performed thereby using water and ethyl acetate. The organic layer obtained therefrom was dried by using magnesium sulfate to be distilled under reduced pressure, and purified by liquid chromatography to obtain 4.1 g (7.2 mmol, yield: 60%) of Intermediate I-12-2.

6) Synthesis of Intermediate I-12-1

1.0 g (1.7 mmol) of Intermediate I-12-2 and 1.0 g (3.6 mmol) of 7-bromo-2-(2,6-dimethylphenyl)thieno[2,3-c]pyridine were dissolved in 50 ml of ethanol in a reactor, and then, 0.2 g (0.17 mmol) of $Pd(PPh_3)_4$ and 0.7 g (5.1 mmol) of $K_2CO_3$ were added thereto. The mixture was stirred at a temperature of 90° C. for 18 hours. When the reaction was completed, the resulting mixture was concentrated under reduced pressure, and an extraction process was performed thereby using water and dichloromethane. The organic layer obtained therefrom was dried by using magnesium sulfate to be distilled under reduced pressure, and purified by liquid chromatography to obtain 0.6 g (0.82 mmol, yield: 48%) of Intermediate I-12-1.

LC-MS m/z=797 (M+H)$^+$

7) Synthesis of Compound 12

Compound 12 (yield: 60%) was synthesized in the same manner as in Synthesis Example 1 for synthesizing Compound 1, except that Intermediate I-12-1 was used instead of Intermediate I-1-1. The compound obtained therefrom was confirmed by LCMS.

LC-MS m/z=990 (M+H)$^+$

Synthesis Example 13: Synthesis of Compound 13

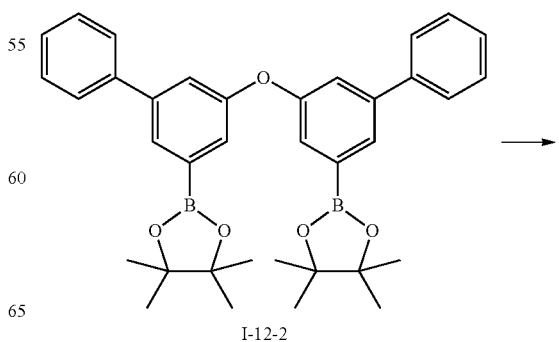

I-12-2

-continued

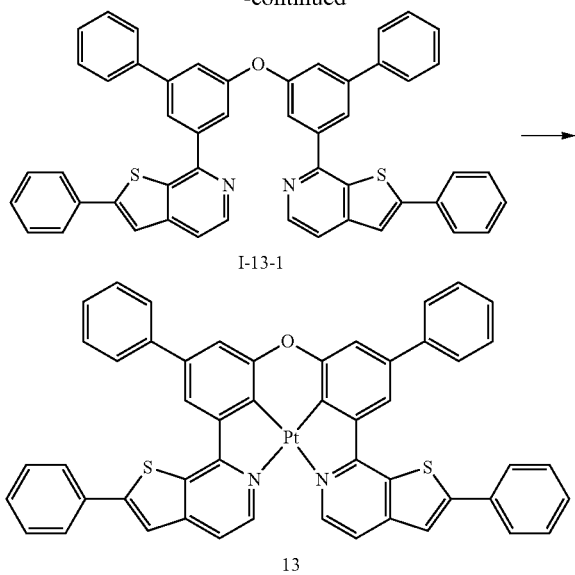

1) Synthesis of Intermediate I-13-1

Intermediate I-13-1 (yield: 45%) was synthesized in the same manner as in Synthesis Example 12 for synthesizing Intermediate I-12-1, except that 7-bromo-2-phenylthieno[2,3-c]pyridine was used instead of 7-bromo-2-(2,6-dimethylphenyl)thieno[2,3-c]pyridine. The compound obtained therefrom was confirmed by LCMS.

LC-MS m/z=741 (M+H)$^+$

2) Synthesis of Compound 13

Compound 13 (yield: 20%) was synthesized in the same manner as in Synthesis Example 1 for synthesizing Compound 1, except that Intermediate I-13-1 was used instead of Intermediate I-1-1. The compound obtained therefrom was confirmed by LCMS.

LC-MS m/z=934 (M+H)$^+$

Synthesis Example 14: Synthesis of Compound 14

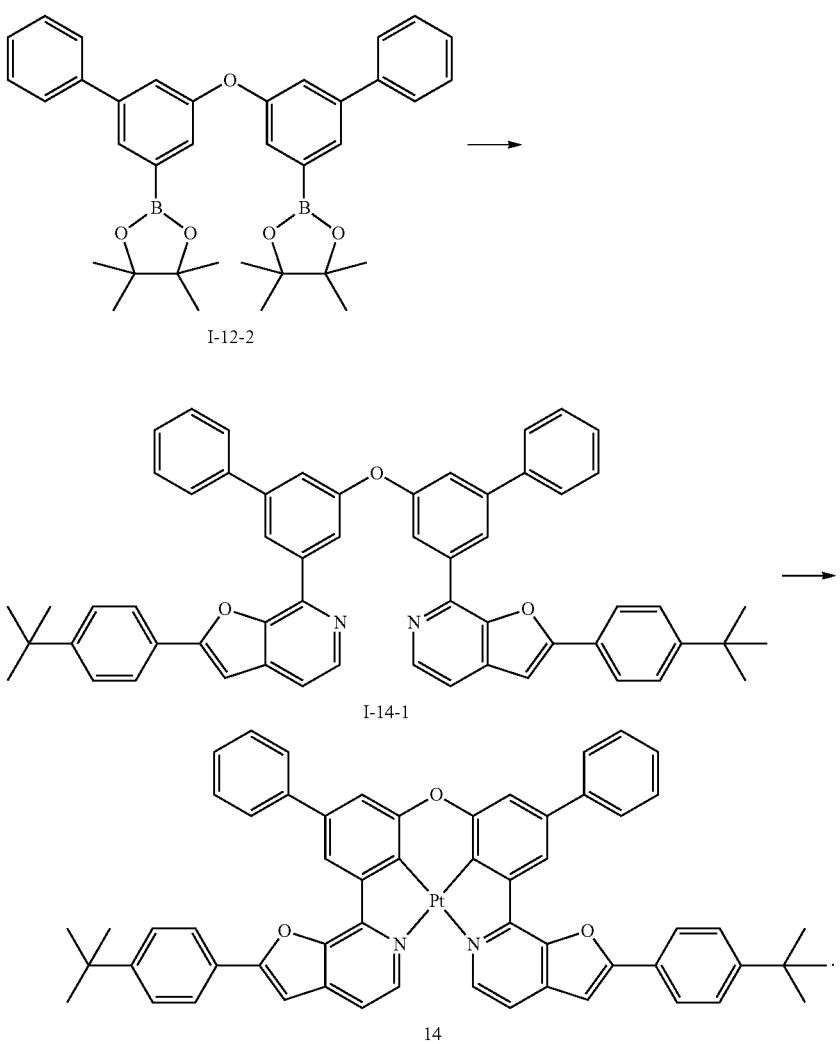

1) Synthesis of Intermediate I-14-1

Intermediate I-14-1 (yield: 55%) was synthesized in the same manner as in Synthesis Example 12 for synthesizing Intermediate I-12-1, except that 7-bromo-2-(4-(tert-butyl)phenyl)furo[2,3-c]pyridine was used instead of 7-bromo-2-(2,6-dimethylphenyl)thieno[2,3-c]pyridine. The compound obtained therefrom was confirmed by LCMS.

LC-MS m/z=821 (M+H)$^+$

2) Synthesis of Compound 14

Compound 14 (yield: 25%) was synthesized in the same manner as in Synthesis Example 1 for synthesizing Compound 1, except that Intermediate I-14-1 was used instead of Intermediate I-1-1. The compound obtained therefrom was confirmed by LCMS.

LC-MS m/z=1014 (M+H)$^+$

Synthesis Example 15: Synthesis of Compound 15

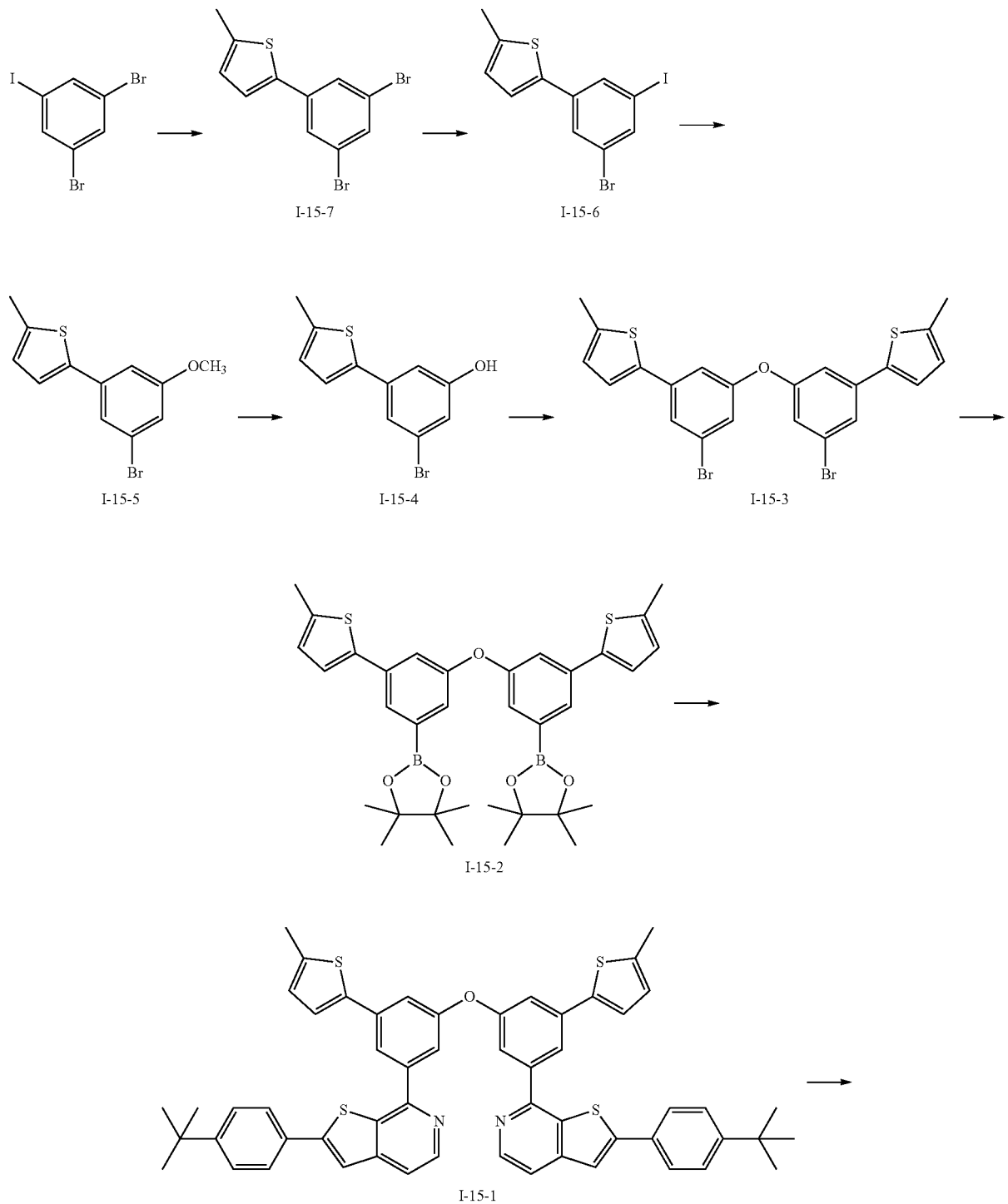

-continued

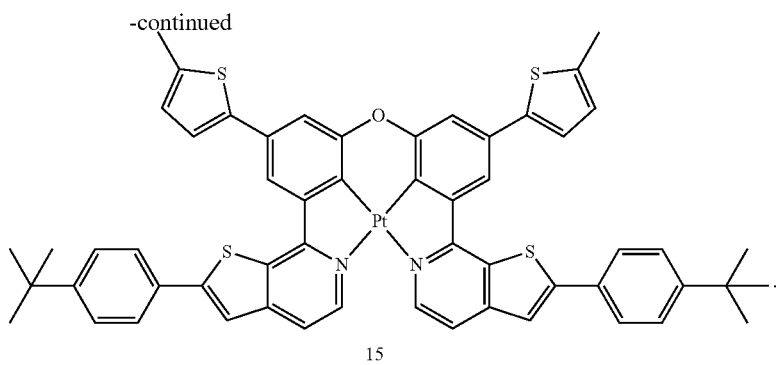

15

1) Synthesis of Intermediate I-15-7

17.3 g (47.9 mmol) of 1,3-dibromo-5-iodobenzene and 7.2 g (50.3 mmol) of (5-methylthiophen-2-yl)boronic acid were dissolved in 300 ml of THF and 75 ml of water in a reactor, and then, 3.8 g (3.3 mmol) of Pd(PPh$_3$)$_4$ and 16.6 g (119.7 mmol) of K$_2$CO$_3$ were added thereto. The mixture was stirred for 18 hours. When the reaction was completed, the resulting mixture was extracted using water and ethyl acetate to collect the organic layer, and that the organic layer obtained therefrom was dried by using magnesium sulfate to be distilled under reduced pressure, and purified by liquid chromatography to obtain 11.0 g (33.1 mmol, yield: 70%) of Intermediate I-15-7.

LC-MS m/z=330 (M+H)$^+$

2) Synthesis of Intermediate I-15-6

Intermediate I-15-6 (yield: 95%) was synthesized in the same manner as in Synthesis Example 12 for synthesizing Intermediate I-12-6, except that Intermediate I-15-7 was used instead of 3,5-dibromo-1,1'-biphenyl. The compound obtained therefrom was confirmed by LCMS.

LC-MS m/z=339 (M+H)$^+$

3) Synthesis of Intermediate I-15-5

Intermediate I-15-6 (yield: 80%) was synthesized in the same manner as in Synthesis Example 12 for synthesizing Intermediate I-12-5, except that Intermediate I-15-6 was used instead of Intermediate I-12-6. The compound obtained therefrom was confirmed by LCMS.

LC-MS m/z=283 (M+H)$^+$

4) Synthesis of Intermediate I-15-4

Intermediate I-15-4 (yield: 90%) was synthesized in the same manner as in Synthesis Example 12 for synthesizing Intermediate I-12-4, except that Intermediate I-15-5 was used instead of Intermediate I-12-5. The compound obtained therefrom was confirmed by LCMS.

LC-MS m/z=269 (M+H)$^+$

5) Synthesis of Intermediate I-15-3

Intermediate I-15-3 (yield: 45%) was synthesized in the same manner as in Synthesis Example 12 for synthesizing Intermediate I-12-3, except that Intermediate I-15-4 was used instead of Intermediate I-12-4. The compound obtained therefrom was confirmed by LCMS.

LC-MS m/z=519 (M+H)$^+$

6) Synthesis of Intermediate I-15-2

Intermediate I-15-2 (yield: 70%) was synthesized in the same manner as in Synthesis Example 12 for synthesizing Intermediate I-12-2, except that Intermediate I-15-3 was used instead of Intermediate I-12-3. The compound obtained therefrom was confirmed by LCMS.

LC-MS m/z=615 (M+H)$^+$

7) Synthesis of Intermediate I-15-1

Intermediate I-15-1 (yield: 70%) was synthesized in the same manner as in Synthesis Example 12 for synthesizing Intermediate I-12-1, except that Intermediate I-15-2 and 7-bromo-2-(4-(tert-butyl)phenyl)thieno[2,3-c]pyridine were used instead of Intermediate I-12-2 and 7-bromo-2-phenylthieno[2,3-c]pyridine, respectively. The compound obtained therefrom was confirmed by LCMS.

LC-MS m/z=893 (M+H)$^+$

7) Synthesis of Compound 15

Compound 15 (yield: 30%) was synthesized in the same manner as in Synthesis Example 1 for synthesizing Compound 1, except that Intermediate I-15-1 was used instead of Intermediate I-1-1. The compound obtained therefrom was confirmed by LCMS.

LC-MS m/z=1086 (M+H)$^+$

Example 1

As an anode, a glass substrate on which ITO/Ag/ITO was deposited to a thickness of 70 Å/1,000 Å/70 Å was cut into a size of 50 mm×50 mm×0.5 mm (mm=millimeters), sonicated with iso-propyl alcohol and pure water each for 5 minutes, and then, cleaned by exposure to ultraviolet rays and ozone for 30 minutes. Then, the glass substrate was provided to a vacuum deposition apparatus.

2-TNATA was deposited on the anode formed on the glass substrate to form a hole injection layer having a thickness of 600 Å, and 4,4'-bis[N-(1-naphthyl)-N-phenylamino]biphenyl (hereinafter, referred to as NPB) was deposited on the hole injection layer to form a hole transport layer having a thickness of 1,350 Å.

CBP (host) and Compound 1 (dopant) were co-deposited on the hole transport layer at a host-to-dopant weight ratio of 98:2 to form an emission layer having a thickness of 400 Å. Then, BCP was deposited on the emission layer to form a hole blocking layer having a thickness of 50 Å. Next, Alq$_3$ was deposited on the hole blocking layer to form an electron transport layer having a thickness of 350 Å, LiF was formed on the electron transport layer to form an electron injection layer having a thickness of 10 Å, and Mg and Ag were deposited on the electron injection layer at a Mg-to-Al weight ratio of 90:10 to form a cathode having a thickness of 120 Å, thereby completing the manufacture of an organic light-emitting device (i.e., a bottom emission type light-emitting device emitting red light) having a structure of ITO/Ag/ITO/2-TNATA (600 Å)/NPB (1,350 Å)/CBP+Compound 1 (2 weight %) (400 Å)/BCP (50 Å)/Alq$_3$ (350 Å)/LiF (10 Å)/MgAg (120 Å):

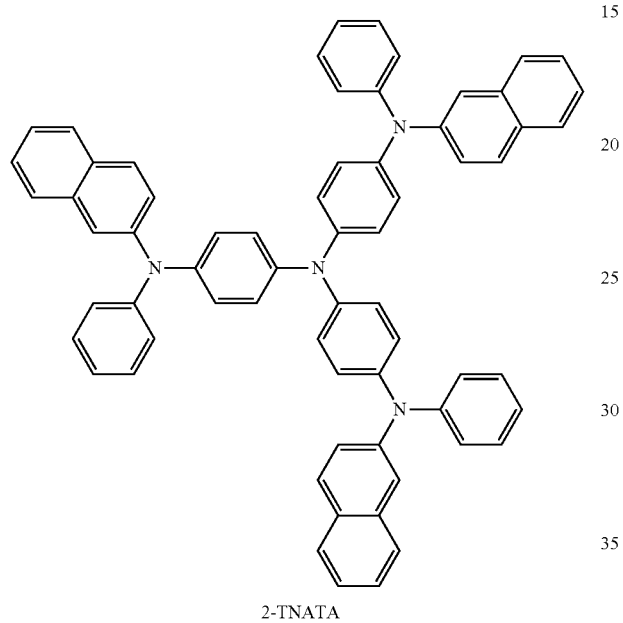

2-TNATA

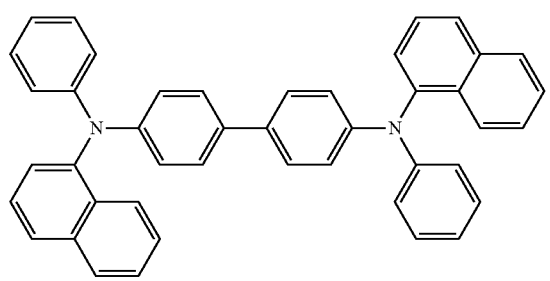

NPB

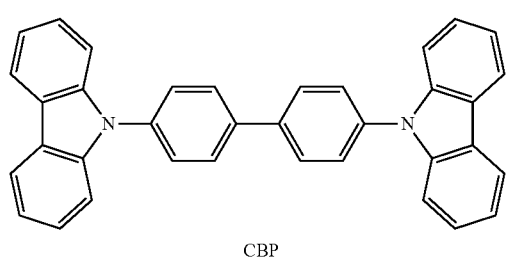

CBP

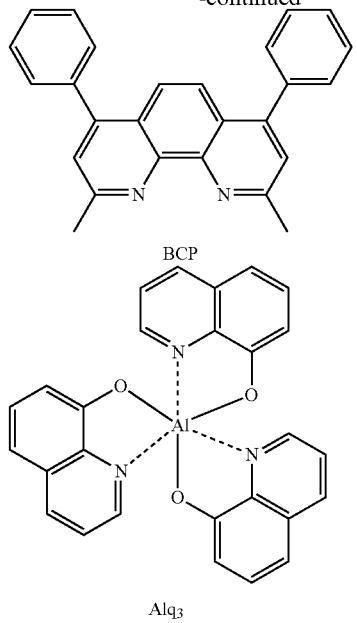

BCP

Alq$_3$

Examples 2 to 15 and Comparative Examples a to C

Organic light-emitting devices were manufactured in the same manner as in Example 1, except that Compounds shown in Table 2 were each used as a dopant for forming the emission layer instead of Compound 1.

Evaluation Example 1: Evaluation of Electroluminescence (EL) Spectrum

Figure 2:
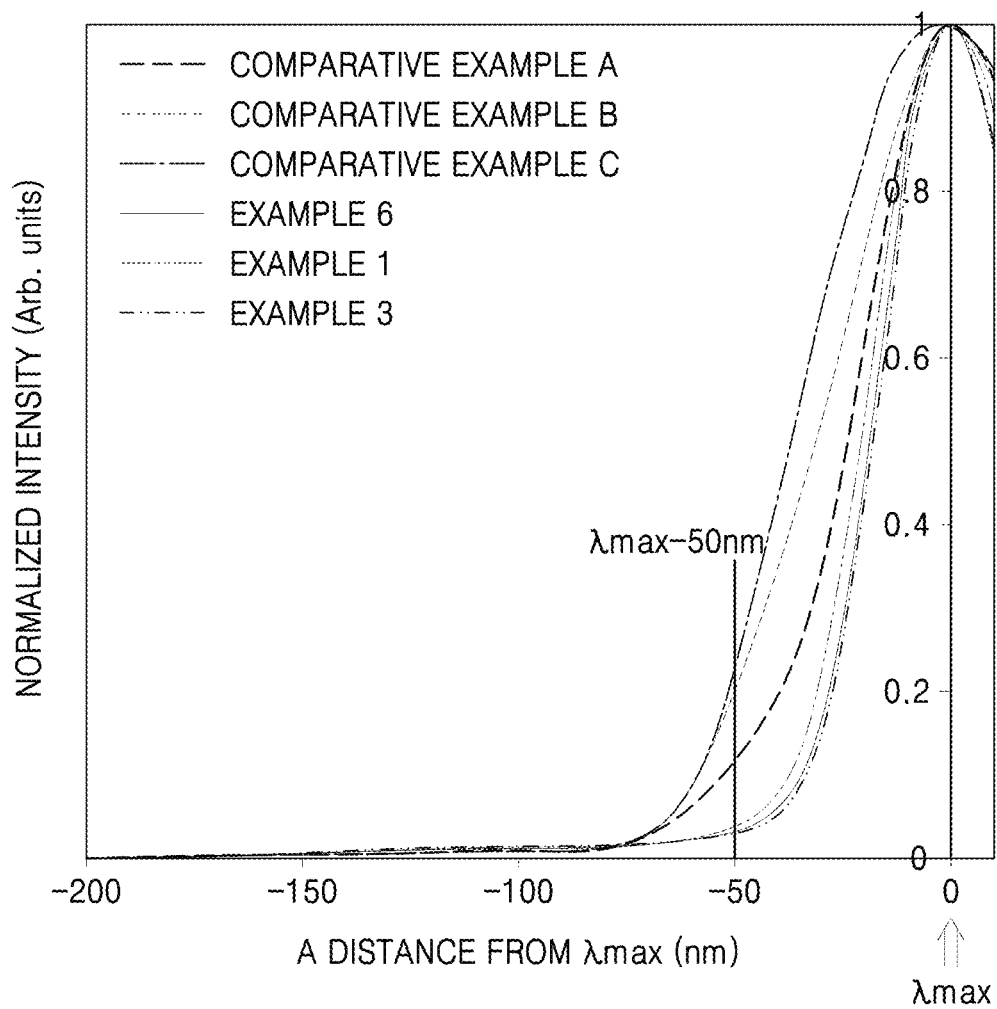
FIG. 2 is a graph of normalized intensity (arbitrary units, arb. units) versus a distance from $\lambda_{max}$ (nanometers, nm) showing an electroluminescence spectrum of each of organic light-emitting devices prepared according to Examples 1, 3, and 6 and Comparative Examples A to C.
Figure 3:
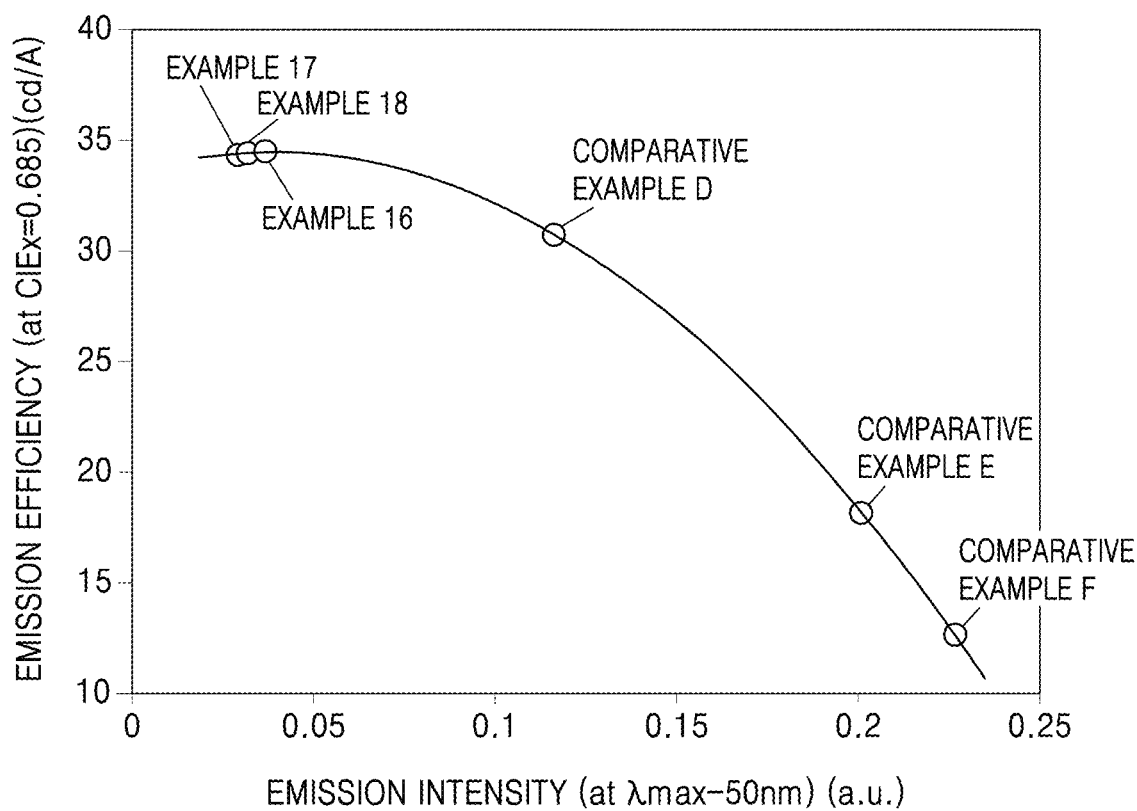
FIG. 3 is a graph of emission efficiency at $CIE_x$=0.685 (candelas per ampere, cd/A) versus emission intensity at $\lambda$max-50 nm (arbitrary units, a. u.) showing emission efficiency (at $CIE_x$=0.685) of each of organic light-emitting devices prepared according to Examples 16 to 18 and Comparative Examples D to F.

Regarding the organic light-emitting devices prepared according to Examples 1 to 15 and Comparative Examples A to C, an ISC PC1 spectrofluorometer equipped with a Xenon lamp was used to measure an EL spectrum thereof at room temperature. Then, the emission intensity of a short-wavelength tail at a distance of about −50 nanometers (nm) from the maximum emission wavelength ($\lambda_{max}$) in the EL spectrum (at $\lambda_{max}$-50 nm) (arbitrary units, a.u.) was measured, and results thereof are summarized in Table 2. FIG. 2 shows EL spectrum of each of the organic light-emitting devices prepared according to Examples 1, 3, and 6 and Comparative Examples A to C.

TABLE 2

| OLED | Dopant Compound No. | Emission intensity (at $\lambda_{max}$-50 nm) (a.u.) |
|---|---|---|
| Example 1 | 1 | 0.0365 |
| Example 2 | 2 | 0.0372 |
| Example 3 | 3 | 0.0377 |
| Example 4 | 4 | 0.0559 |
| Example 5 | 5 | 0.0430 |
| Example 6 | 6 | 0.0290 |
| Example 7 | 7 | 0.0497 |
| Example 8 | 8 | 0.0245 |
| Example 9 | 9 | 0.0550 |
| Example 10 | 10 | 0.0326 |
| Example 11 | 11 | 0.0555 |
| Example 12 | 12 | 0.0270 |

TABLE 2-continued
| OLED | Dopant Compound No. | Emission intensity (at $\lambda_{max}$-50 nm) (a.u.) |
|---|---|---|
| Example 13 | 13 | 0.0270 |
| Example 14 | 14 | 0.0273 |
| Example 15 | 15 | 0.0405 |
| Comparative Example A | Ref 1 | 0.1159 |
| Comparative Example B | Ref 2 | 0.1868 |
| Comparative Example C | Ref 3 | 0.2105 |
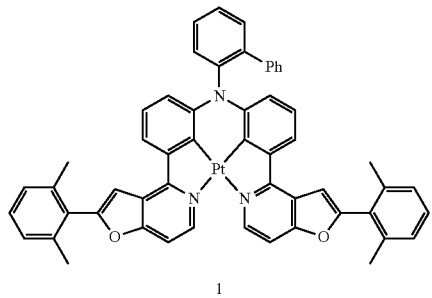
1
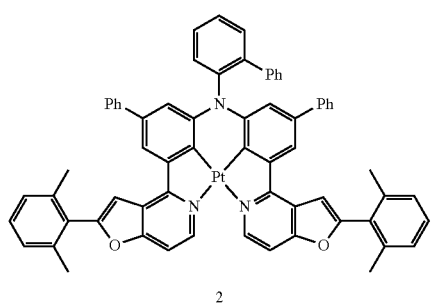
2
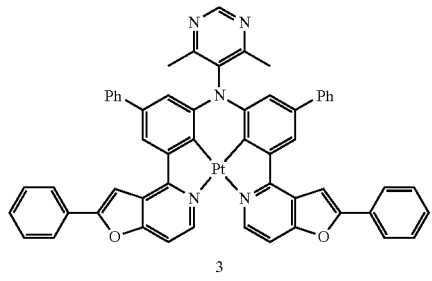
3
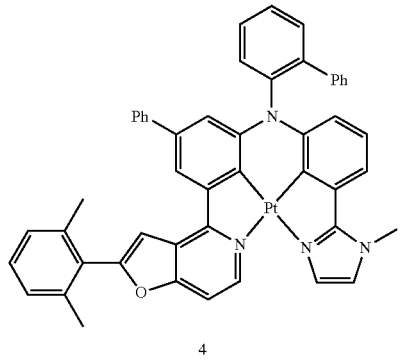
4
TABLE 2-continued
| OLED | Dopant Compound No. | Emission intensity (at $\lambda_{max}$-50 nm) (a.u.) |
|---|---|---|
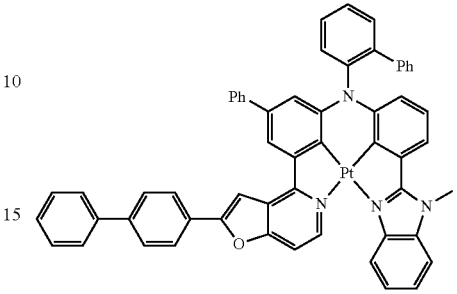
5
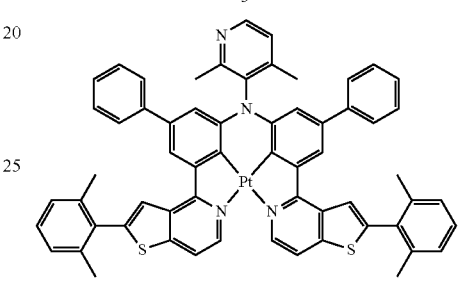
6
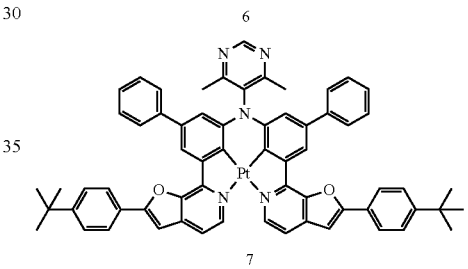
7
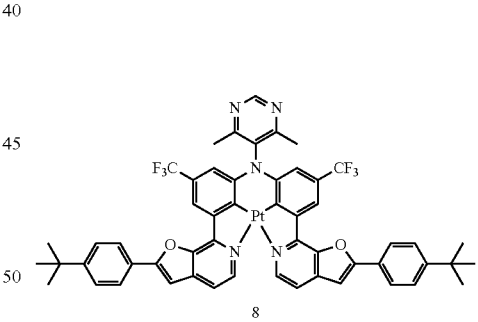
8
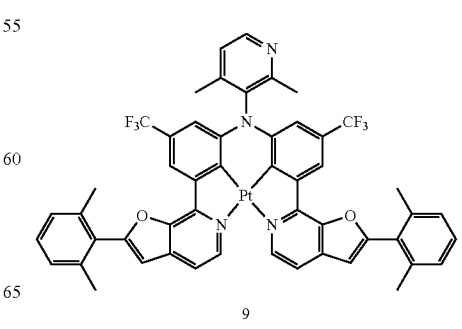
9

TABLE 2-continued

| OLED | Dopant Compound No. | Emission intensity (at $\lambda_{max}$-50 nm) (a.u.) |
|---|---|---|

[Structures of compounds 10, 11, 12, 13, 14, 15, Ref 1, Ref 2, Ref 3]

Referring to Table 2, it was confirmed that the organic light-emitting devices prepared according to Examples 1 to 15, and respectively including Compounds 1 to 15 as a dopant, had an EL spectrum of a wave pattern with a remarkable reduced emission intensity of the tail at a distance of about −0.5 nm from the maximum emission wavelength (at $\lambda_{max}$-50 nm), as compared with the organic light-emitting devices prepared according to Comparative Examples A to C and respectively including Compounds Ref 1 to Ref 3 as a dopant.

Evaluation Example 2: Evaluation of Characteristics of Organic Light-Emitting Device (Bottom Emission Type)

The driving voltage, maximum quantum emission efficiency, full width/half maximum (FWHM) of an EL spectrum, emission intensity (at $\lambda_{max}$-50 nm) (a.u.) (same as data as in Table 2) of a short-wavelength tail at a distance of −50 nm from the maximum emission wavelength in an EL spectrum, the maximum emission wavelength in an EL spectrum, and lifespan ($LT_{95}$) of the organic light-emitting devices manufactured according to Examples 1, 3, 6, 13, 14, and 15 and Comparative Examples A and C are measured, and results thereof are shown in Table 3. This evaluation was performed using a current-voltage meter (Keithley 2400) and luminance meter (Minolta Cs-1,000A). Lifespan ($LT_{95}$) refers to the time taken until luminance is decreased to 95% of initial luminance 100%.

TABLE 3

| | Dopant Compound No. | Driving voltage (V) | Maximum quantum emission efficiency (%) | Emission color | FWHM (nm) | Emission intensity (at $\lambda_{max}$-50 nm) (a.u.) | Maximum emission wavelength (nm) | $LT_{95}$ (hr) |
|---|---|---|---|---|---|---|---|---|
| Example 1 | 1 | 4.8 | 22.1 | Red | 64.5 | 0.0365 | 629 | ~1000 |
| Example 3 | 3 | 4.7 | 21.5 | Red | 45.0 | 0.0377 | 624 | ~1000 |
| Example 6 | 6 | 4.7 | 23.8 | Red | 44.6 | 0.0290 | 628 | ~1500 |
| Example 13 | 13 | 4.2 | 20.4 | Red | 49.9 | 0.0270 | 610 | ~1500 |
| Example 14 | 14 | 4.0 | 23.8 | Red | 42.0 | 0.0273 | 590 | ~1500 |
| Example 15 | 15 | 4.7 | 23.3 | Red | 50.0 | 0.0405 | 620 | ~1000 |
| Comparative Example A | Ref 1 | 5.2 | 19.1 | Red | 70.9 | 0.1159 | 627 | ~1000 |
| Comparative Example C | Ref 3 | 4.5 | 19.8 | Red | 96.8 | 0.2105 | 582 | ~1000 |

Referring to Table 3, it was confirmed that, as compared with the organic light-emitting devices of Comparative Examples A and C, the organic light-emitting devices of Examples 1, 3, 5, 13, 14, and 15 exhibited more excellent or equal driving voltage, maximum quantum emission efficiency, and lifespan, but had simultaneously relatively small FWHM, and emitted red light having a relatively small emission intensity (at $\lambda_{max}$-50 nm).

Example 16

As an anode, a glass substrate on which ITO/Al was deposited to a thickness of 70 Å/1,000 Å was cut into a size of 50 mm×50 mm×0.5 mm, sonicated with iso-propyl alcohol and pure water each for 5 minutes, and then, cleaned by exposure to ultraviolet rays and ozone for 30 minutes. Then, the glass substrate was provided to a vacuum deposition apparatus.

2-TNATA was deposited on the anode formed on the glass substrate to a form a hole injection layer having a thickness of 600 Å, and NPB was deposited on the hole injection layer to form a hole transport layer having a thickness of 900 Å.

CBP (host) and Compound 1 (dopant) were co-deposited on the hole transport layer at a host-to-dopant weight ratio of 98:2 to form an emission layer having a thickness of 400 Å. Then, BCP was deposited on the emission layer to form a hole blocking layer having a thickness of 50 Å. Next, $Alq_3$ was deposited on the hole blocking layer to form an electron transport layer having a thickness of 350 Å, LiF was formed on the electron transport layer to form an electron injection layer having a thickness of 10 Å, and Mg and Ag were deposited on the electron injection layer at a Mg-to-Al weight ratio of 90:10 to form a cathode having a thickness of 120 Å, thereby completing the manufacture of an organic light-emitting device (i.e., a top emission type light-emitting device emitting red light) having a structure of ITO/Al/2-TNATA (600 Å)/NPB (900 Å)/CBP+Compound 1 (2 weight %) (400 Å)/BCP (50 Å)/$Alq_3$ (35 0 Å)/LiF (10 Å)/MgAg (120 Å). NPB was additionally deposited on the cathode to form a capping layer having a thickness of 800 Å.

Examples 17 and 18 and Comparative Examples D to F

Organic light-emitting devices were manufactured in the same manner as in Example 16, except that Compounds shown in Table 4 were each used instead of Compound 1 as a dopant in forming an emission layer.

Evaluation Example 3: Evaluation of Characteristics of Organic Light-Emitting Device (Top Emission Type)

Regarding the organic light-emitting devices prepared according to Examples 16 to 18 and Comparative Examples D to F, the emission intensity of a short-wavelength tail at a distance of about −50 nm from the maximum wavelength ($\lambda_{max}$) in the EL spectrum (at $\lambda_{max}$-50 nm)(a.u.) was measured according to the same method described in Evaluation Example 1, and the emission efficiency (at $CIE_x$=0.685) of the organic light-emitting devices were evaluated. Results thereof are summarized in Table 4. Here, as a device used for evaluating the emission efficiency, a current-voltage meter (Keithley 2400) and a luminance meter (Minolta Cs-1000A) were used.

TABLE 4

| | Dopant compound No. | Emission intensity (at $\lambda_{max}$-50 nm) (a.u.) | Emission efficiency (at $CIE_x$ = 0.685) (cd/A) |
|---|---|---|---|
| Example 16 | 1 | 0.035 | 34.6 |
| Example 17 | 3 | 0.026 | 34.3 |
| Example 18 | 6 | 0.030 | 34.5 |
| Comparative Example D | Ref 1 | 0.117 | 30.7 |
| Comparative Example E | Ref 2 | 0.203 | 18.1 |
| Comparative Example F | Ref 3 | 0.226 | 12.6 |

Referring to Table 4, it was confirmed that, as compared with the organic light-emitting devices of Comparative Examples D to F, the organic light-emitting devices of Examples 16 to 18 each had more excellent emission efficiency and the EL spectrum with a wave pattern in which the emission intensity of a tail at a distance of about −50 nm from the maximum emission wavelength in the EL spectrum (emission intensity at $\lambda_{max}$-50 nm) was significantly reduced.

According to the one or more embodiments of the present disclosure, an organometallic compound has excellent electric characteristics and thermal stability. Accordingly, an organic light-emitting device including the organometallic compound may have excellent driving voltage, maximum quantum emission efficiency, full width/half maximum (FWHM) of an EL spectrum, emission intensity (at $\lambda_{max}$-50 nm) (a.u.) of a short-wavelength tail at a distance of −50 nm from the maximum emission wavelength in an EL spectrum, and lifespan ($LT_{95}$), due to excellent phosphorescent emission characteristics of the organometallic compound, a diagnostic composition using the organometallic compound may accordingly have high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organometallic compound represented by Formula 1:

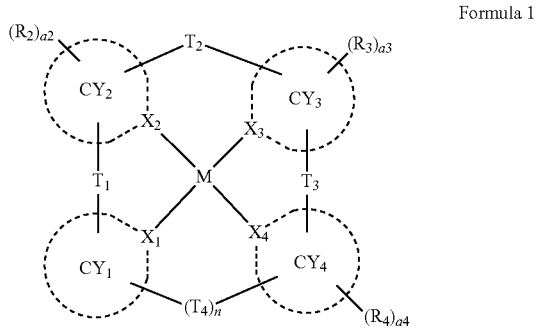

Formula 1

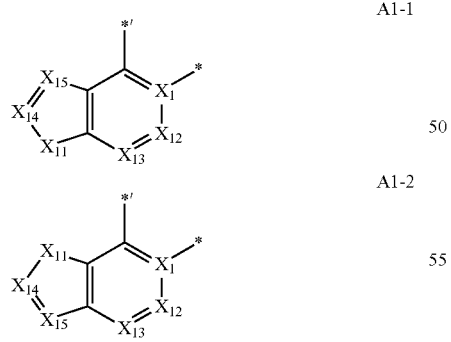 A1-1

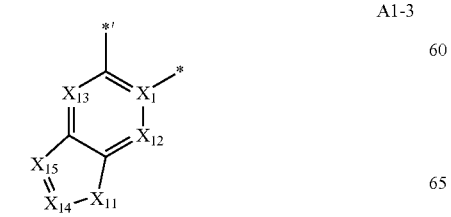 A1-2

A1-3

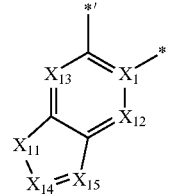 A1-4

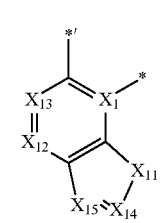 A1-5

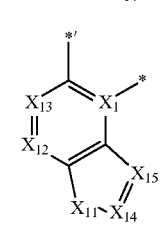 A1-6

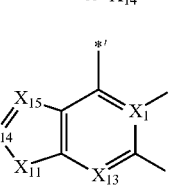 A11-1

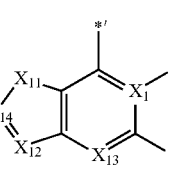 A11-2

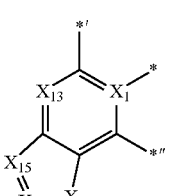 A11-3

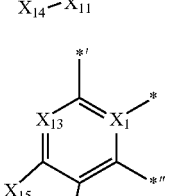 A11-3

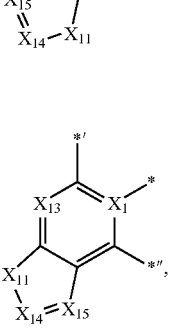 A11-4 wherein, M in Formula 1 is a transition metal, $X_1$ in Formula 1 is nitrogen (N), $X_2$ to $X_4$ in Formula 1 are each independently carbon (C) or N, in Formula 1, a bond between $X_1$ and M is a coordinate bond, and one bond selected from a bond between $X_2$ and M, a bond between $X_3$ and M, and a bond between $X_4$ and M is a coordinate bond while the remaining two bonds are each independently be a covalent bond, n in Formula 1 is 0 or 1, wherein, when n is 0, $CY_1$ and $CY_4$ are not linked each other, $CY_1$ and $CY_4$ are identical to each other, in Formula 1, i) when n is 0, $CY_1$ is a group represented by one selected from Formulae A1-1 to A1-6; and ii) when n is 1, $CY_1$ is a group represented by one selected from Formulae A11-1 to A11-4, in Formulae A1-1 to A1-6 and A11-1 to A11-4, i) $X_{11}$ is *—$N[(L_{11})_{c11}$-$(R_{11})]$—*', *—$B(R_{11})$—*', *—$P(R_{11})$—*', *—$C(R_{11a})(R_{11b})$—*', *—$Si(R_{11a})(R_{11b})$—*', *—$Ge(R_{11a})(R_{11b})$—*', *—S—*', *—Se—*', *—O—*', *—C(=O)—*', *—S(=O)—*', *—S(=O)_2$—*', or *—C(=S)—*', $X_{12}$ is $C(R_{12})$ or N, $X_{13}$ is $C(R_{13})$ or N, $X_{14}$ is $C(R_{14})$ or N, and $X_{15}$ is $C(R_{15})$ or N;

ii) when $X_{14}$ is $C(R_{14})$ and $X_{15}$ is $C(R_{15})$, $R_{14}$ and $R_{15}$ are not linked each other; and iii) $R_{11a}$ and $R_{11b}$, are optionally linked each other via a second linking group to form a substituted or unsubstituted $C_5$-$C_{30}$ carbocyclic group or a substituted or unsubstituted $C_1$-$C_{30}$ heterocyclic group, in Formulae A1-1 to A1-6 and A11-1 to A11-4, * may indicate a binding site to M in Formula 1, *' may indicate a binding site to $T_1$ in Formula 1, and *'' may indicate a binding site to $T_4$ in Formula 1, in Formula 1, $CY_2$ to $CY_4$ are each independently selected from a $C_5$-$C_{30}$ carbocyclic group and a $C_1$-$C_{30}$ heterocyclic group, in Formula 1, $T_1$ to $T_4$ are each independently selected from a single bond, a double bond, *—$N[(L_5)_{c5}$-$(R_5)]$—*', *—$B(R_5)$—*', *—$P(R_5)$—*', *—$C(R_5)(R_6)$—*', *—$Si(R_5)(R_6)$—*', *—$Ge(R_5)(R_6)$—*', *—S—*', *—Se—*', *—O—*', *—C(=O)—*', *—S(=O)—*', *—S(=O)_2$—*', *—$C(R_5)$=*', *=C(R_5)—*', *—$C(R_5)$=$C(R_6)$—*', *—C(=S)—*', and *—C≡C—*', wherein $R_5$ and $R_6$ are optionally linked each other via a first linking group to form a substituted or unsubstituted $C_5$-$C_{30}$ carbocyclic group or a substituted or unsubstituted $C_1$-$C_{30}$ heterocyclic group, $L_5$ and $L_{11}$ are each independently selected from a single bond, a substituted or unsubstituted $C_5$-$C_{30}$ carbocyclic group, and a substituted or unsubstituted $C_1$-$C_{30}$ heterocyclic group, c5 and c11 are each independently an integer from 1 to 3, wherein, when c5 is two or more, two or more of groups $L_5$ are identical to or different from each other, and when c11 is two or more, two or more of groups $L_{11}$ are identical to or different from each other, $R_2$ to $R_6$, $R_{11}$ to $R_{15}$, $R_{11a}$, and $R_{11b}$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted monovalent non-aromatic condensed polycyclic group, a substituted or un substituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, provided that when $CY_1$ is a group represented by Formula A1-1, then i) $X_{11}$ is O and at least one of $X_{12}$ to $X_{15}$ is N, or ii) $X_{11}$ is *—S—*' or *—Se—*', a2 to a4 are each independently an integer from 0 to 20, in Formula 1, two or more selected from groups $R_2$ in the number of a2 are optionally linked each other to form a substituted or unsubstituted $C_5$-$C_{30}$ carbocyclic group or a substituted or unsubstituted $C_1$-$C_{30}$ heterocyclic group, in Formula 1, two or more selected from groups $R_3$ in the number of a3 are optionally linked each other to form a substituted or unsubstituted $C_5$-$C_{30}$ carbocyclic group or a substituted or unsubstituted $C_1$-$C_{30}$ heterocyclic group, in Formula 1, two or more selected from groups $R_4$ in the number of a4 are optionally linked each other to form a substituted or unsubstituted $C_5$-$C_{30}$ carbocyclic group or a substituted or unsubstituted $C_1$-$C_{30}$ heterocyclic group, in Formula 1, two or more of $R_2$ to $R_4$ are optionally linked each other to form a substituted or unsubstituted $C_5$-$C_{30}$ carbocyclic group or a substituted or unsubstituted $C_1$-$C_{30}$ heterocyclic group, in Formula 1, one of $R_5$ and $R_6$ and one of $R_2$ to $R_4$ are optionally linked each other to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_7$-$C_{60}$ aryl alkyl group, the substituted $C_1$-$C_{60}$ heteroaryl group, the substituted $C_2$-$C_{60}$ alkyl heteroaryl group, the substituted $C_1$-$C_{60}$ heteroaryloxy group, the substituted $C_1$-$C_{60}$ heteroarylthio group, the $C_2$-$C_{60}$ heteroaryl alkyl group, the substituted monovalent non-aromatic condensed polycyclic group, and the substituted monovalent non-aromatic condensed heteropolycyclic group is selected from:
deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, and a C$_1$-C$_{60}$ alkoxy group;
a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_7$-C$_{60}$ aryl alkyl group, a C$_1$-C$_{60}$ heteroaryl group, a C$_2$-C$_{60}$ alkyl heteroaryl group, a C$_1$-C$_{60}$ heteroaryloxy group, a C$_1$-C$_{60}$ heteroarylthio group, a C$_2$-C$_{60}$ heteroaryl alkyl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);
a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkylaryl group, a C$_6$-C$_{60}$ aryloxy group, a C$_6$-C$_{60}$ arylthio group, a C$_7$-C$_{60}$ aryl alkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroaryl alkyl group, a monovalent non-aromatic condensed polycyclic group, and a monovalent non-aromatic condensed heteropolycyclic group;
a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_7$-C$_{60}$ aryl alkyl group, a C$_1$-C$_{60}$ heteroaryl group, a C$_2$-C$_{60}$ alkyl heteroaryl group, a C$_1$-C$_{60}$ heteroaryloxy group, a C$_1$-C$_{60}$ heteroarylthio group, a C$_2$-C$_{60}$ heteroaryl alkyl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_7$-C$_{60}$ aryl alkyl group, a C$_1$-C$_{60}$ heteroaryl group, a C$_2$-C$_{60}$ alkyl heteroaryl group, a C$_1$-C$_{60}$ heteroaryloxy group, a C$_1$-C$_{60}$ heteroarylthio group, a C$_2$-C$_{60}$ heteroaryl alkyl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), and —P(=O)(Q$_{28}$)(Q$_{29}$); and
—N(Q$_{31}$)(Q$_{32}$), —Si(Q$_{33}$)(Q$_{34}$)(Q$_{35}$), —B(Q$_{36}$)(Q$_{37}$), and —P(=O)(Q$_{38}$)(Q$_{39}$), and Q$_1$ to Q$_9$, Q$_{11}$ to Q$_{19}$, Q$_{21}$ to Q$_{29}$, and Q$_{31}$ to Q$_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryl group substituted with at least one selected from a C$_1$-C$_{60}$ alkyl group, and a C$_6$-C$_{60}$ aryl group, a C$_6$-C$_{60}$ aryloxy group, a C$_6$-C$_{60}$ arylthio group, a C$_7$-C$_{60}$ aryl alkyl group, a C$_1$-C60 heteroaryl group, a C$_2$-C$_{60}$ alkyl heteroaryl group, a C$_1$-C$_{60}$ heteroaryloxy group, a C$_1$-C$_{60}$ heteroarylthio group, a C$_2$-C$_{60}$ heteroaryl alkyl group, a monovalent non-aromatic condensed polycyclic group, and a monovalent non-aromatic condensed heteropolycyclic group.

2. The organometallic compound of claim 1, wherein M is Pt, Pd, or Au,
X$_4$ is N, and a bond between X$_4$ and M is a coordinate bond.

3. The organometallic compound of claim 1, wherein CY$_2$ to CY$_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

4. The organometallic compound of claim 1, wherein
$X_2$ and $X_3$ are C,
$CY_2$ and $CY_3$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group.

5. The organometallic compound of claim 1, wherein
$T_1$ is a single bond,
$T_2$ is not a single bond, and
n is 0.

6. The organometallic compound of claim 1, wherein
$R_2$ to $R_6$, $R_{11}$ to $R_{15}$, $R_{11a}$, and $R_{11b}$, are each independently selected from:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;
a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —$N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CD_2CH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

7. The organometallic compound of claim 1, wherein $R_2$ to $R_6$, $R_{11}$ to $R_{15}$, $R_{11a}$ and $R_{11b}$ are each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one selected from Formulae 9-1 to 9-19 and 10-1 to 10-186, and —$Si(Q_3)(Q_4)(Q_5)$:

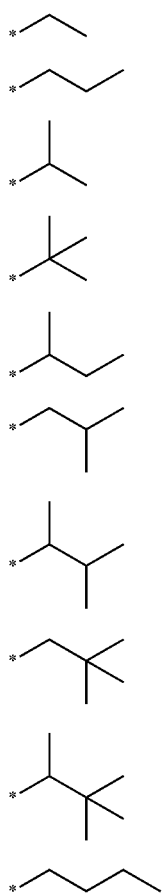
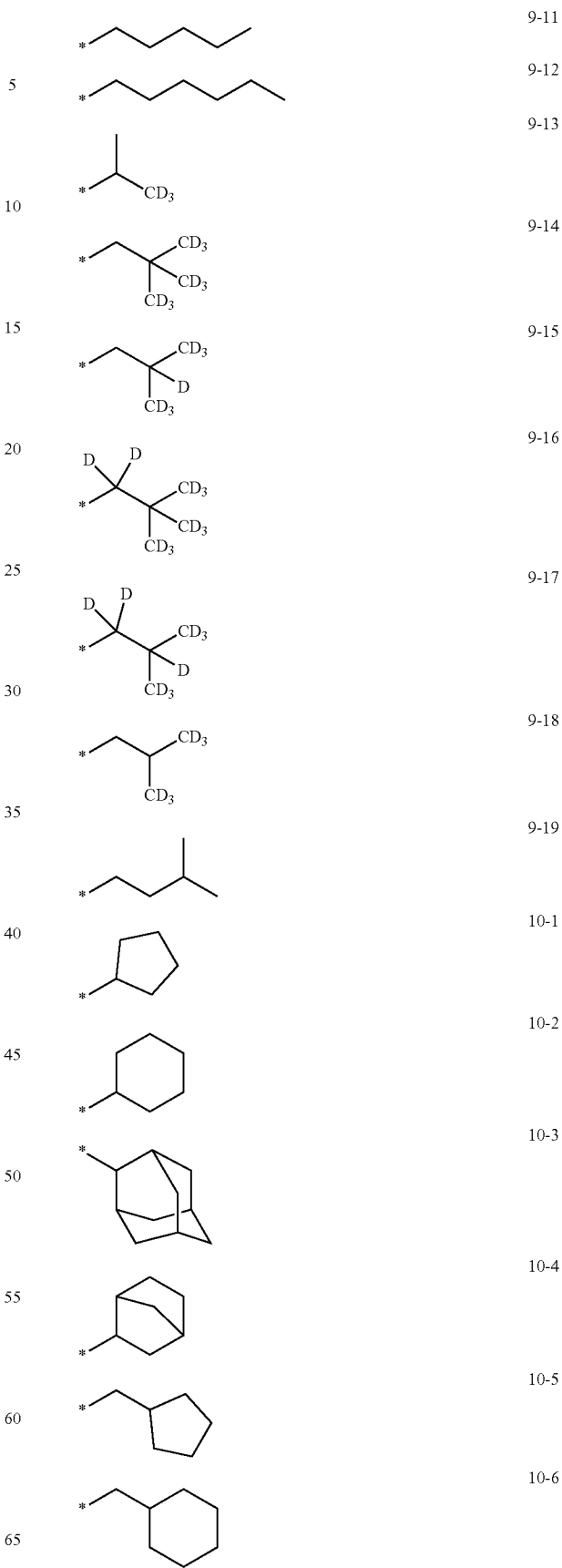

159
-continued
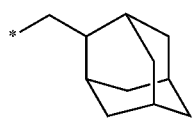
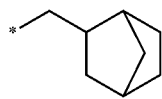
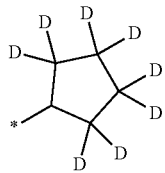
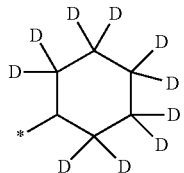
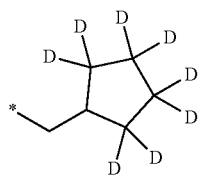
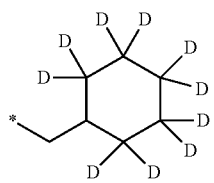
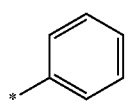
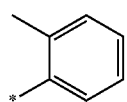
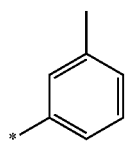
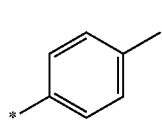
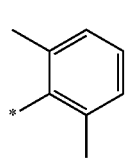
160
-continued
10-7
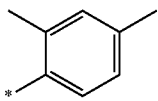
10-8
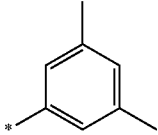
10-9
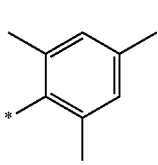
10-10
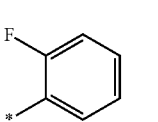
10-11
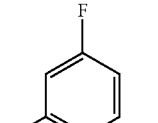
10-12
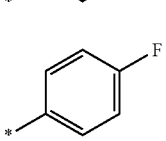
10-13
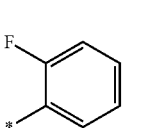
10-14
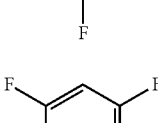
10-15
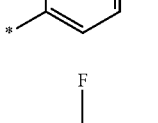
10-16
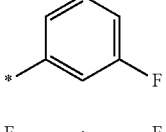
10-17
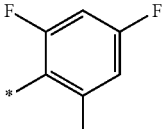
10-18
10-19
10-20
10-21
10-22
10-23
10-24
10-25
10-26
10-27
10-28
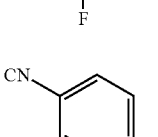

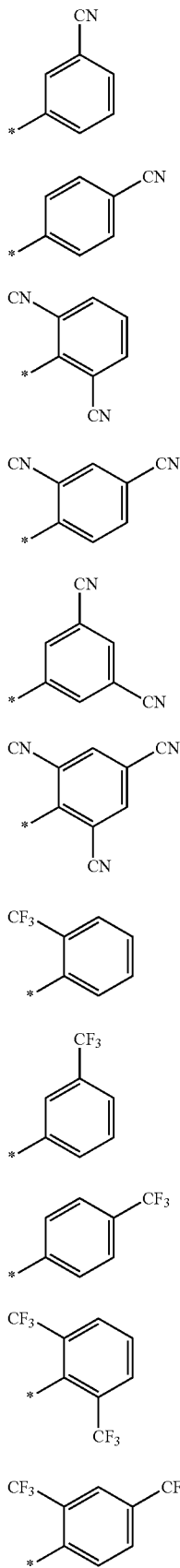
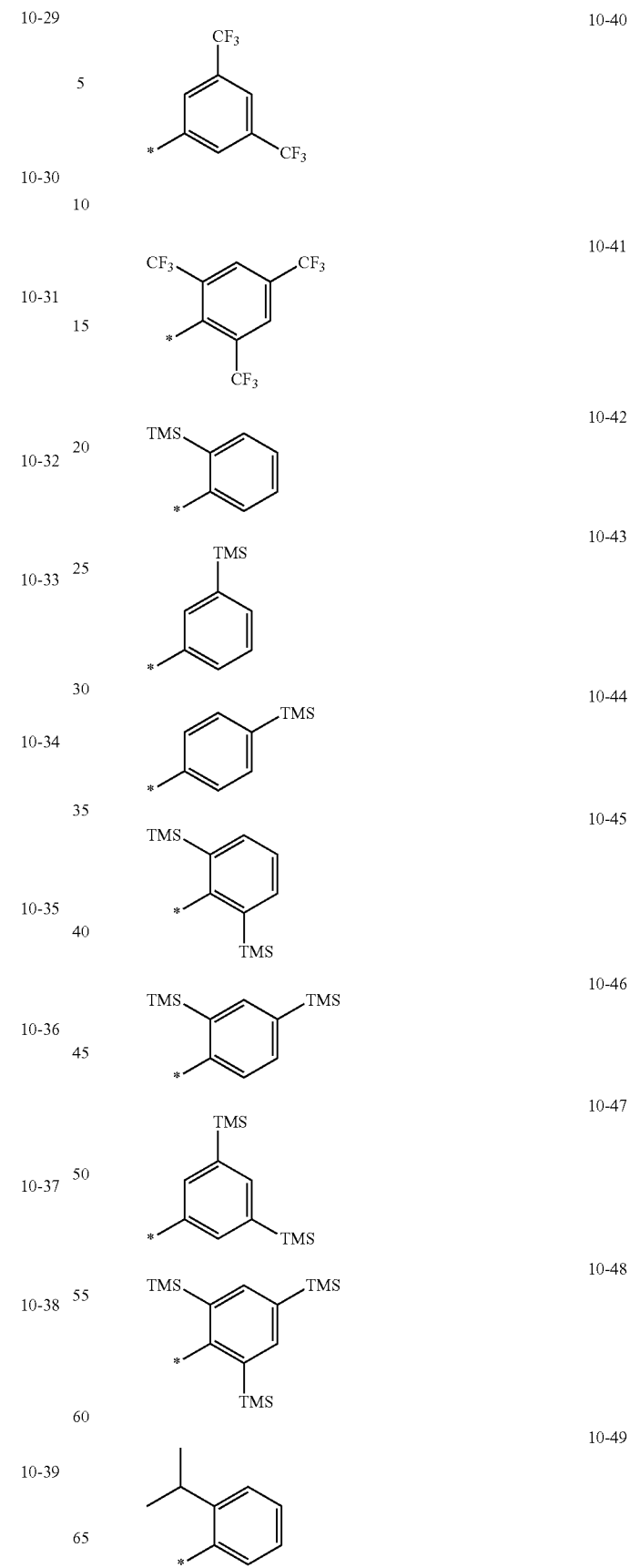

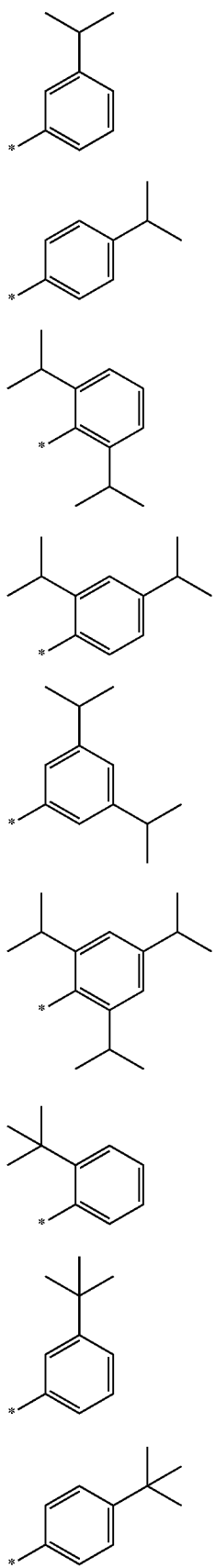
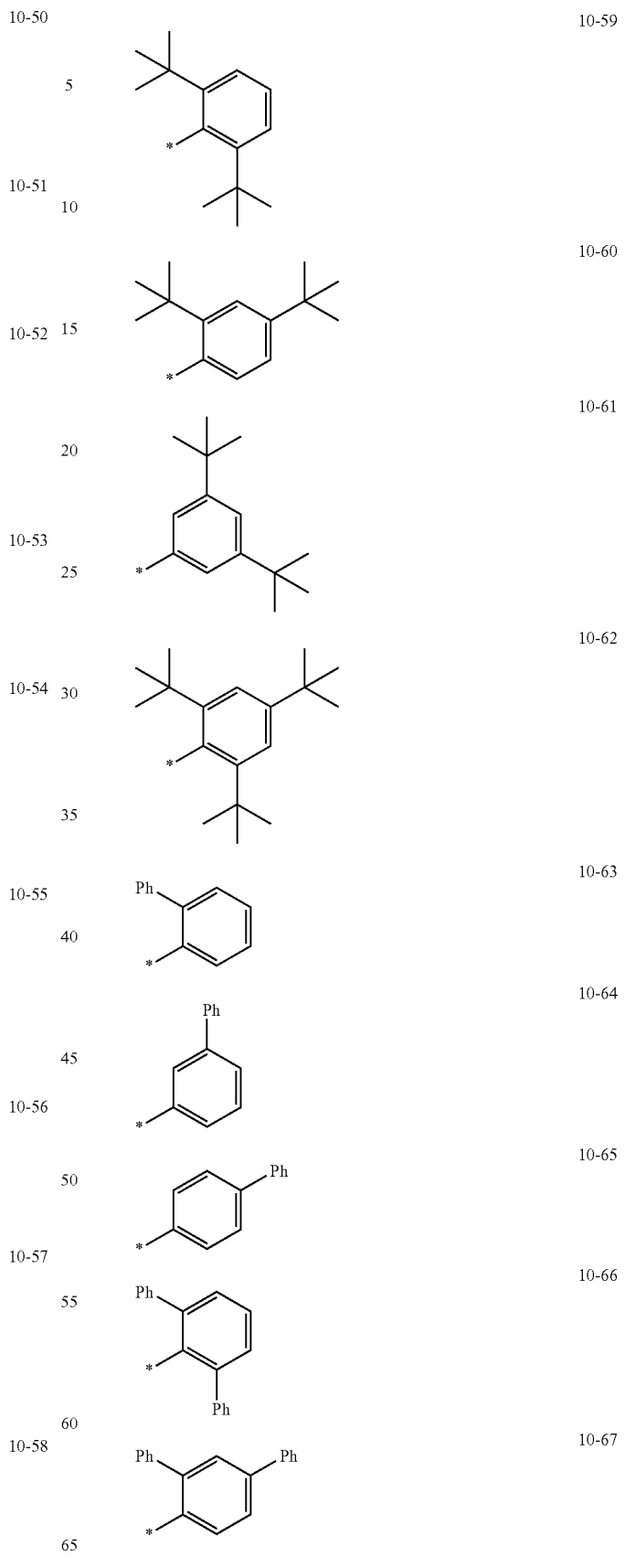

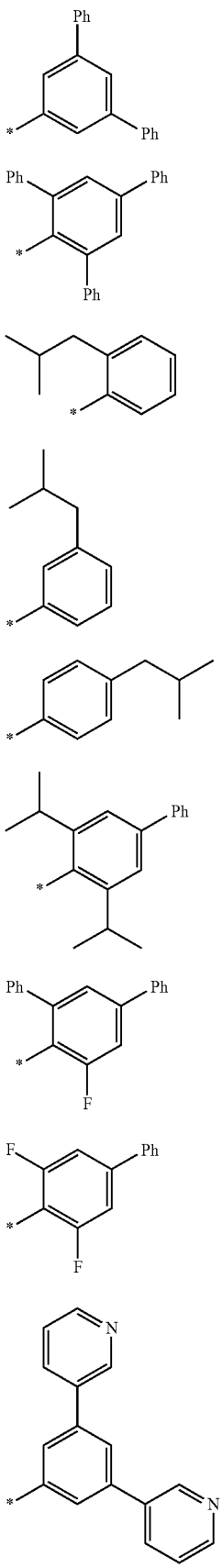
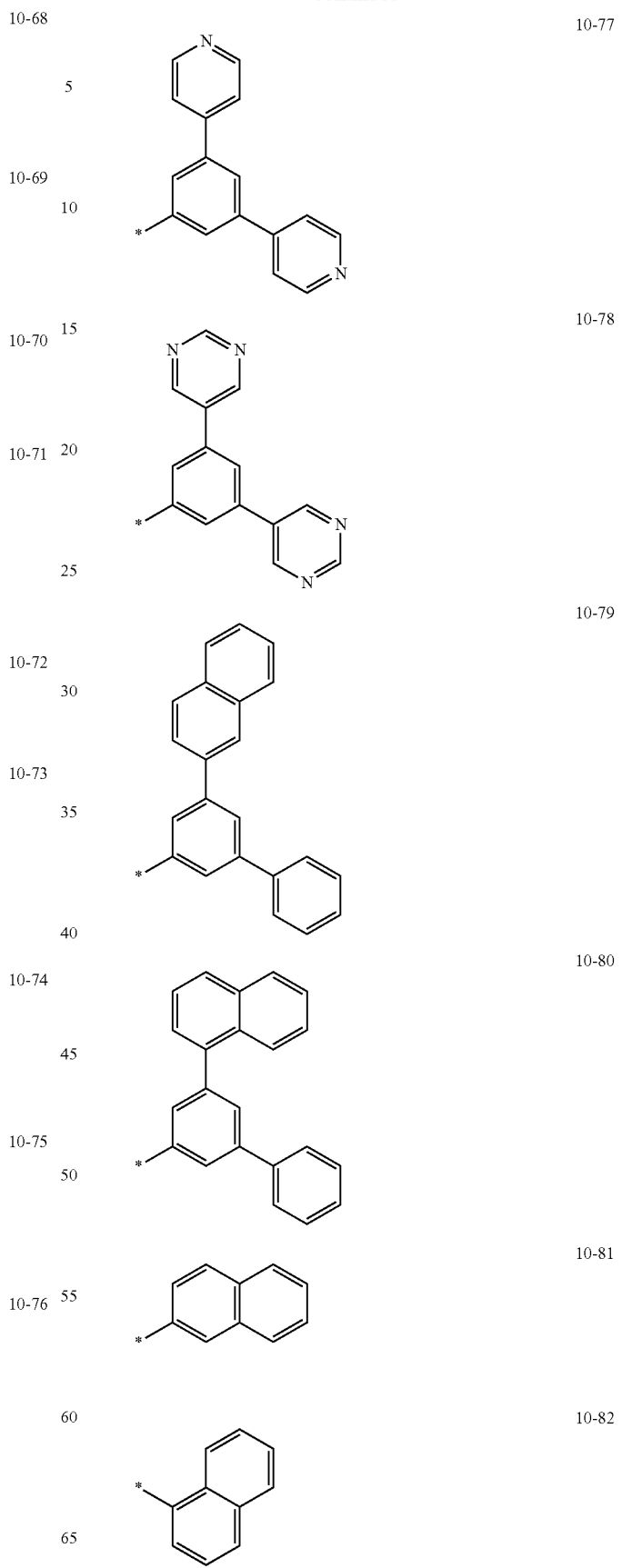

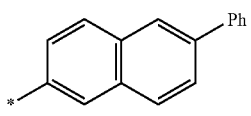
10-83
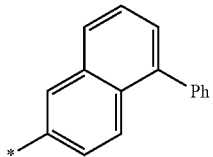
10-84
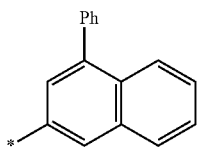
10-85
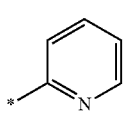
10-86
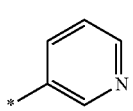
10-87
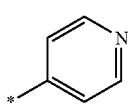
10-88
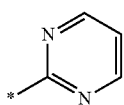
10-89
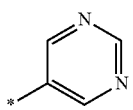
10-90
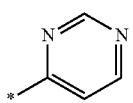
10-91
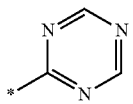
10-92
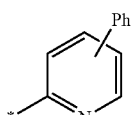
10-93
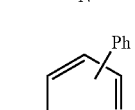
10-94
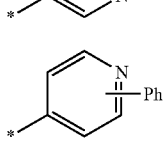
10-95
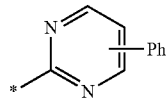
10-96
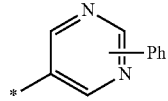
10-97
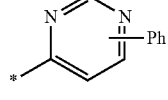
10-98
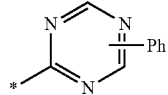
10-99
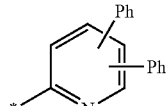
10-100
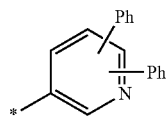
10-101
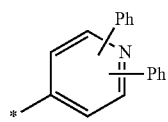
10-102
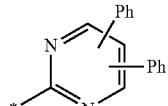
10-103
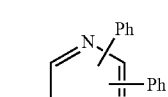
10-104
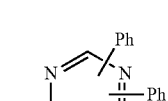
10-105
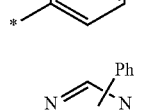
10-106
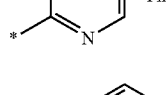
10-107
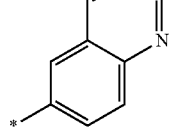

10-108 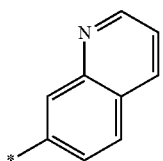
10-109 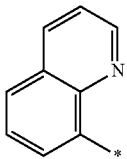
10-110 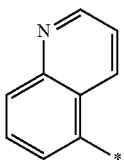
10-111 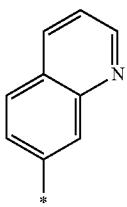
10-112 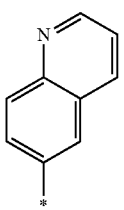
10-113 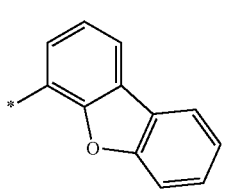
10-114 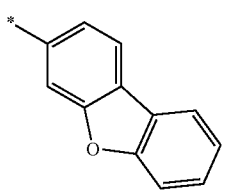
10-115 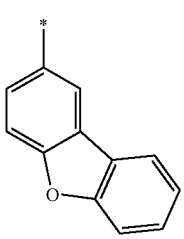
10-116 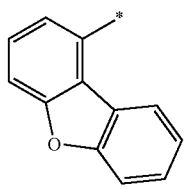
10-117 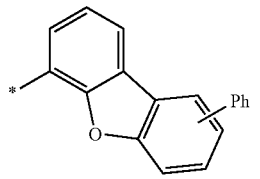
10-118 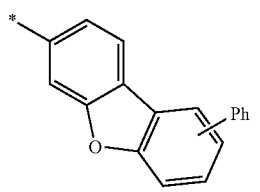
10-119 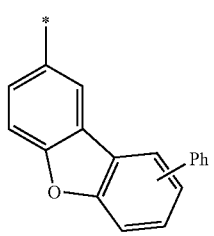
10-120 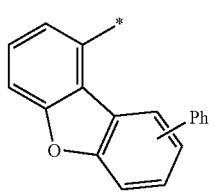
10-121 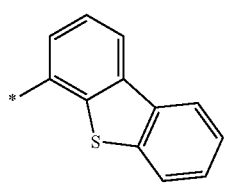
10-122 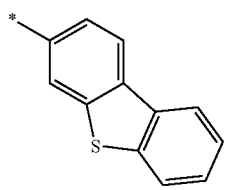
10-123 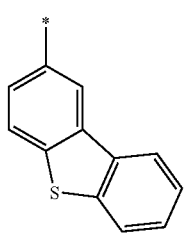

10-124 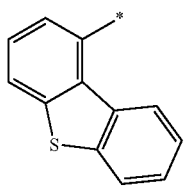
10-125 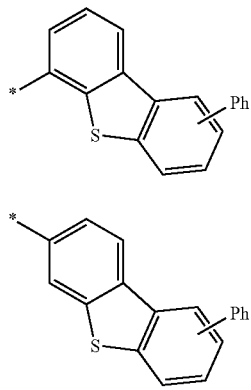
10-126
10-127 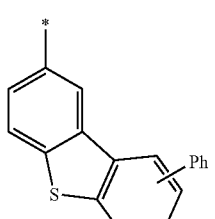
10-128 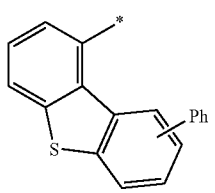
10-129 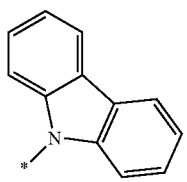
10-130 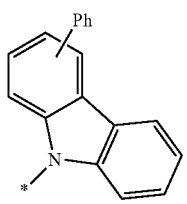
10-131 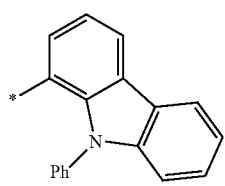
10-132 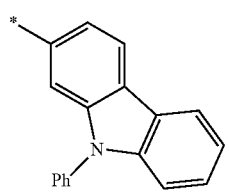
10-133 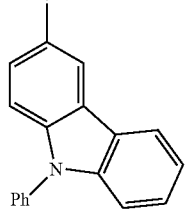
10-134 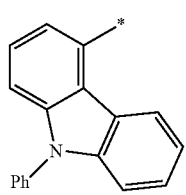
10-135 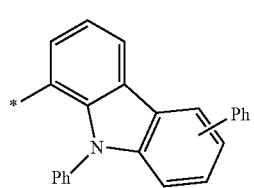
10-136 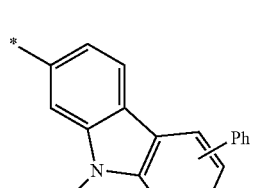
10-137 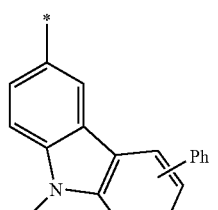
10-138 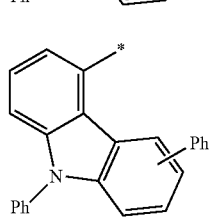

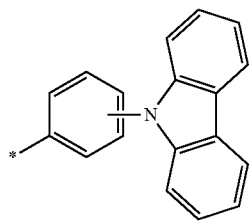
10-139
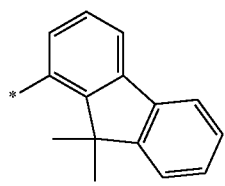
10-140
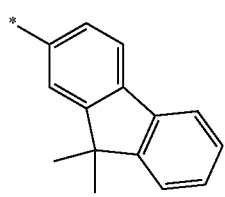
10-141
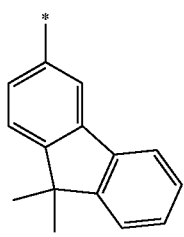
10-142
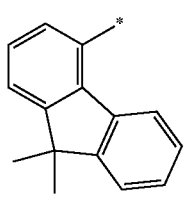
10-143
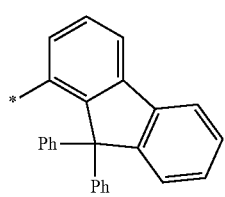
10-144
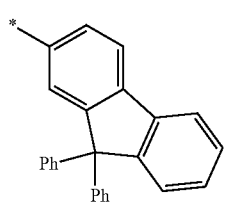
10-145
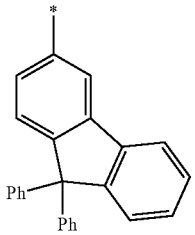
10-146
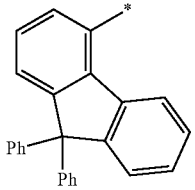
10-147
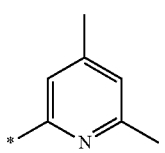
10-148
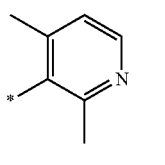
10-149
10-150
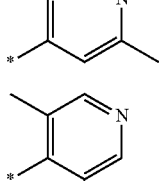
10-151
10-152
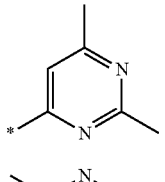
10-153
10-154
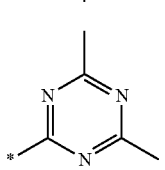
10-155

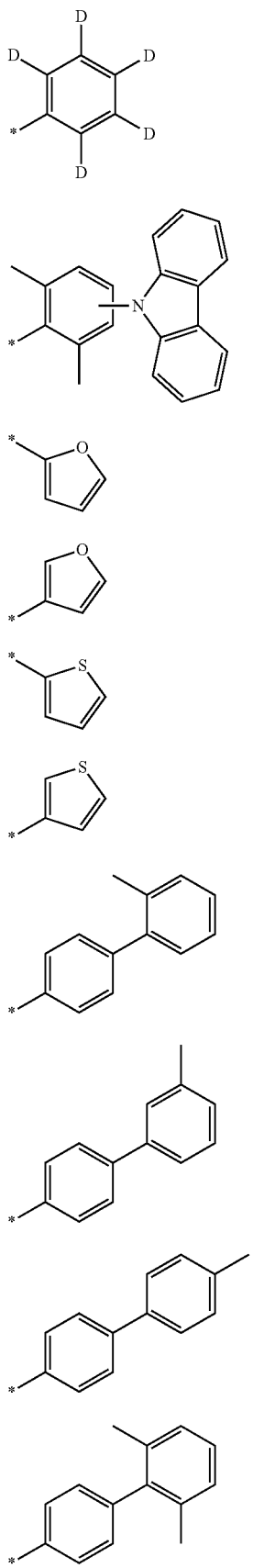
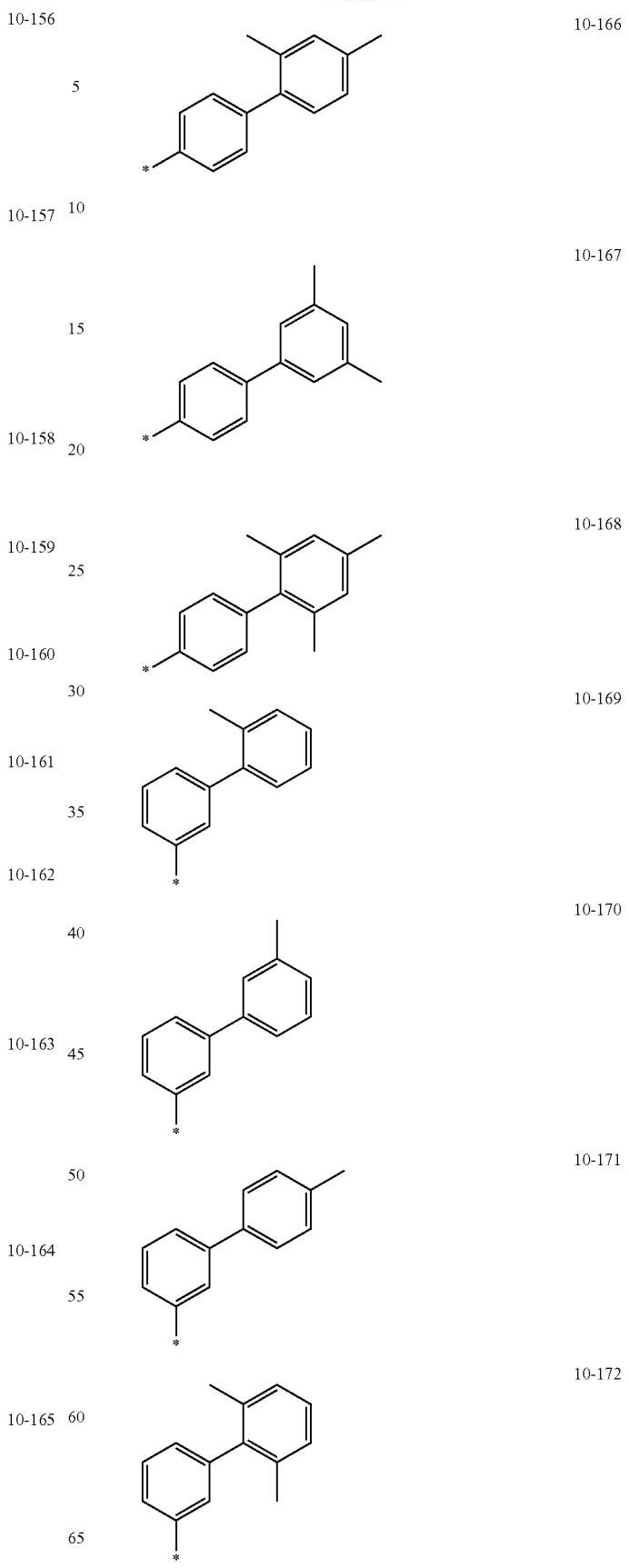

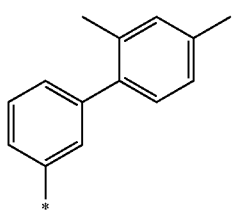
10-173
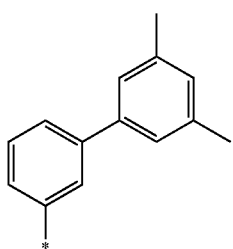
10-174
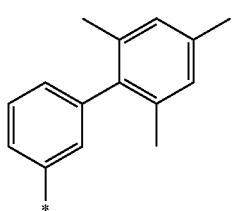
10-175
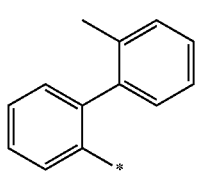
10-176
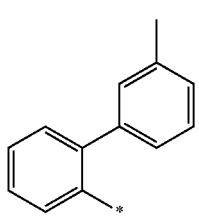
10-177
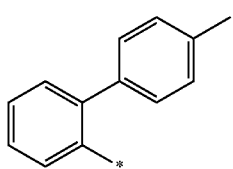
10-178
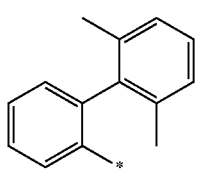
10-179
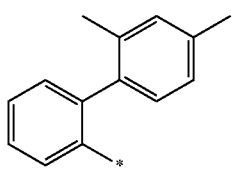
10-180
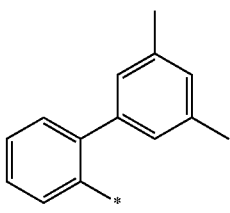
10-181
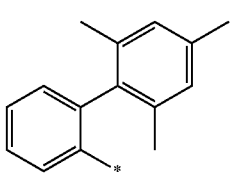
10-182
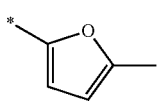
10-183
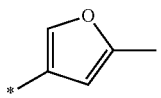
10-184
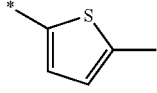
10-185
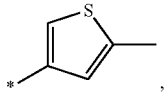
10-186
wherein, in Formulae 9-1 to 9-19 and 10-1 to 10-186, * indicates a binding site to a neighboring atom, Ph indicates a phenyl group, and TMS indicates a trimethylsilyl group, and
wherein $Q_3$ to $Q_5$ are the same as defined in claim 1.
8. The organometallic compound of claim 1, wherein a moiety represented by
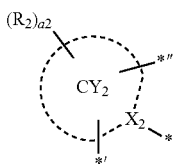
in Formula 1 is represented by one selected from Formulae A2-1(1) to A2-1(21):
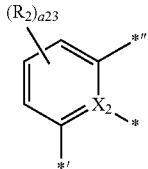
A2-1(1)

-continued
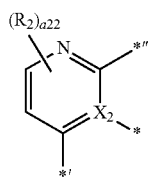
A2-1(2)
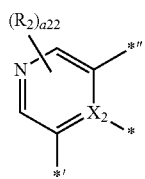
A2-1(3)
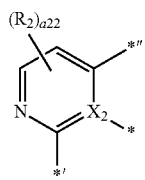
A2-1(4)
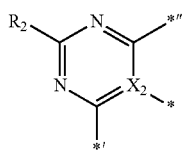
A2-1(5)
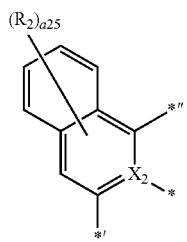
A2-1(6)
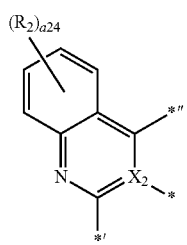
A2-1(7)
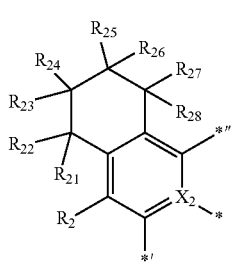
A2-1(8)
-continued
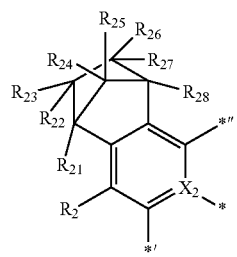
A2-1(9)
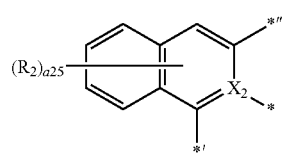
A2-1(10)
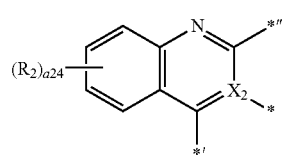
A2-1(11)
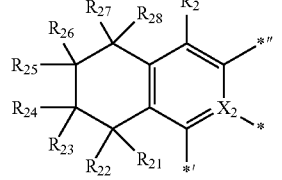
A2-1(12)
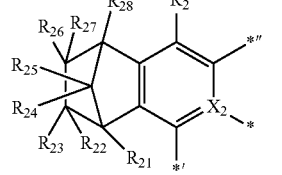
A2-1(13)
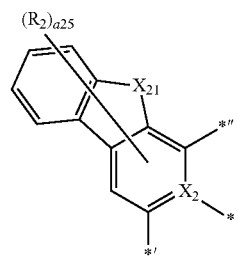
A2-1(14)
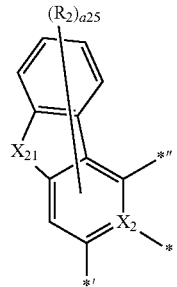
A2-1(15)

-continued

A2-1(16) 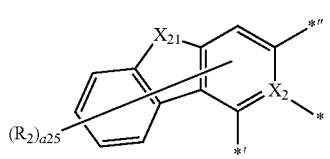

A2-1(17) 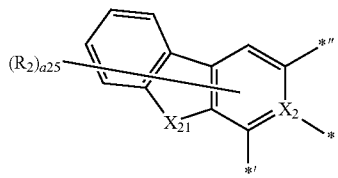

A2-1(18) 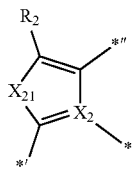

A2-1(19) 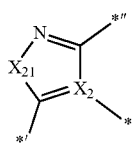

A2-1(20) 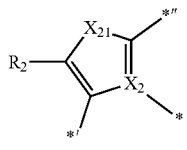

A2-1(21) 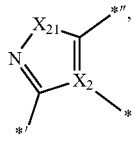

wherein, in Formulae A2-1(1) to A2-1(21),
$X_2$ and $R_2$ are respectively the same as described in claim 1,
$X_{21}$ is O, S, $N(R_{21})$, $C(R_{21})(R_{22})$, or $Si(R_{21})(R_{22})$,
$R_{21}$ to $R_{28}$ are respectively the same as described in connection with $R_2$ in claim 1,
a25 is an integer from 0 to 5,
a24 is an integer from 0 to 4,
a23 is an integer from 0 to 3,
a22 is an integer from 0 to 2,
\* indicates a binding site to M in Formula 1,
\*' indicates a binding site to $T_1$ in Formula 1, and
\*" indicates a binding site to $T_2$ in Formula 1.

9. The organometallic compound of claim 1, wherein a moiety represented by

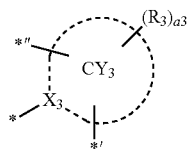

in Formula 1 is represented by one selected from Formulae A3-1(1) to A3-1(21):

A3-1(1) 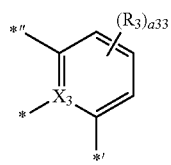

A3-1(2) 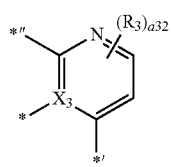

A3-1(3) 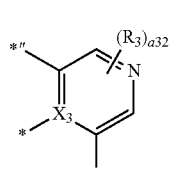

A3-1(4) 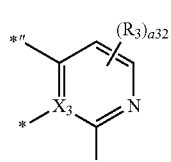

A3-1(5) 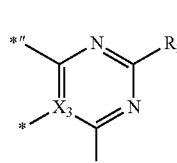

A3-1(6) 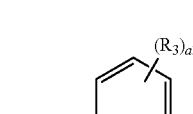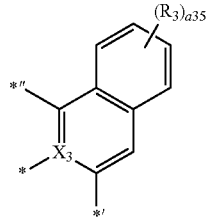

A3-1(7) 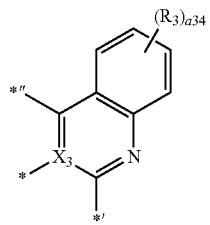

A3-1(8) 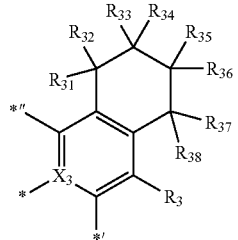

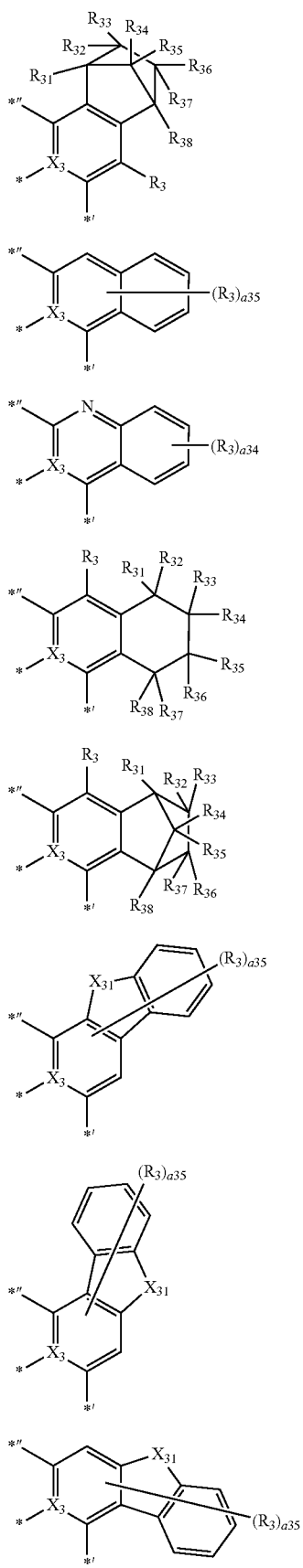

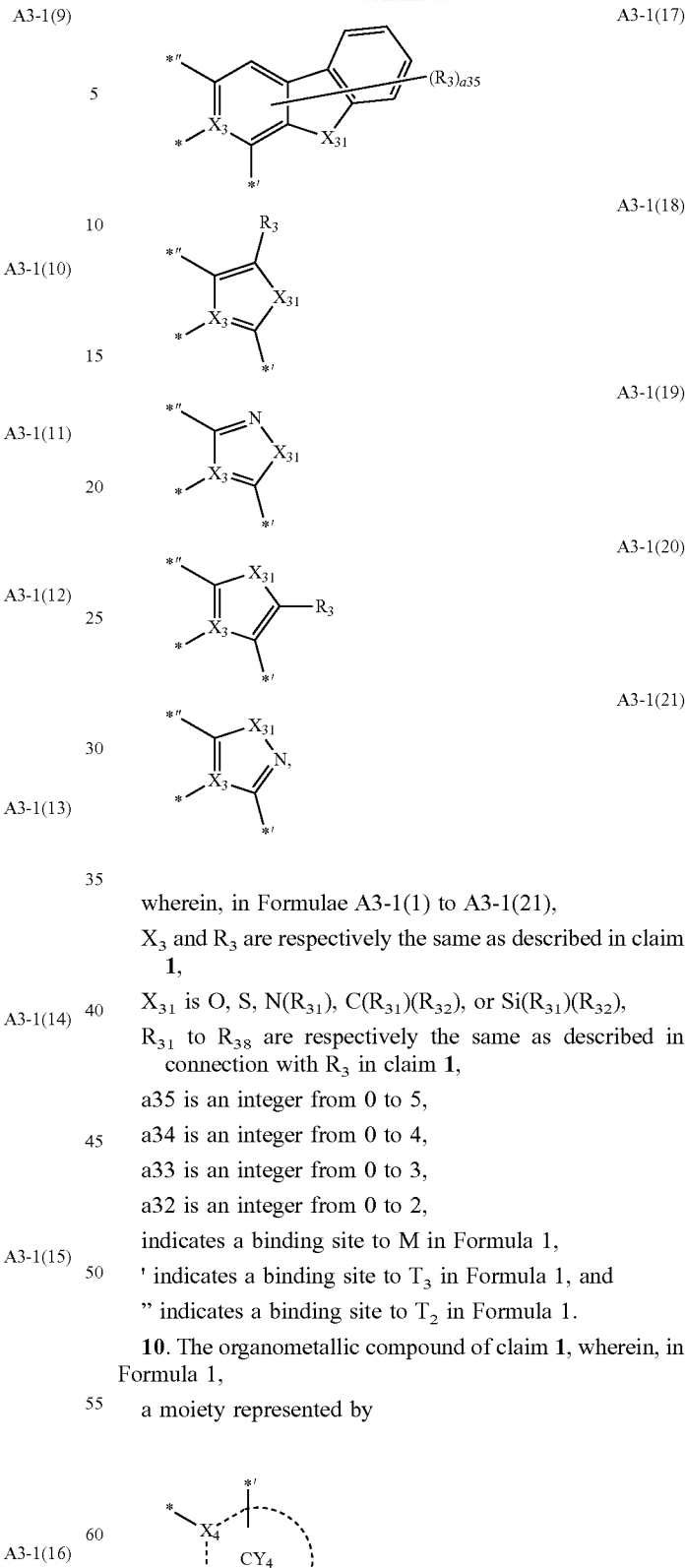

wherein, in Formulae A3-1(1) to A3-1(21), $X_3$ and $R_3$ are respectively the same as described in claim 1, $X_{31}$ is O, S, $N(R_{31})$, $C(R_{31})(R_{32})$, or $Si(R_{31})(R_{32})$, $R_{31}$ to $R_{38}$ are respectively the same as described in connection with $R_3$ in claim 1, a35 is an integer from 0 to 5, a34 is an integer from 0 to 4, a33 is an integer from 0 to 3, a32 is an integer from 0 to 2,

* indicates a binding site to M in Formula 1,

' indicates a binding site to $T_3$ in Formula 1, and

" indicates a binding site to $T_2$ in Formula 1.

10. The organometallic compound of claim 1, wherein, in Formula 1, a moiety represented by is represented by one selected from Formulae A4-1 to A4-6, A4-1(1) to A4-1(44), and A4-2(1) to A4-2(71)

A4-1
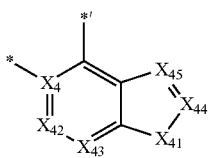
A4-2
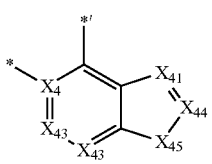
A4-3
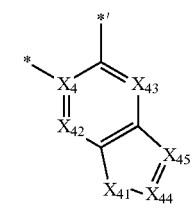
A4-4
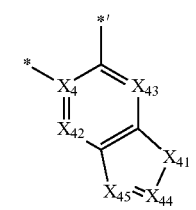
A4-5
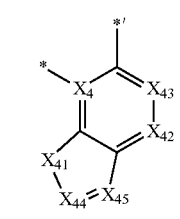
A4-6
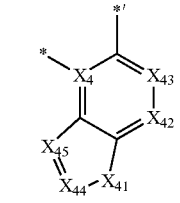
A4-1(1)
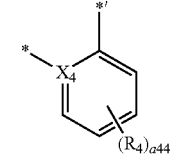
A4-1(2)
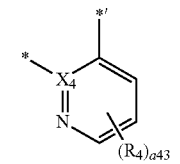
A4-1(3)
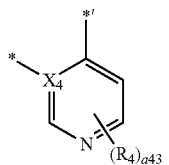
A4-1(4)
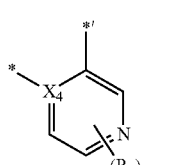
A4-1(5)
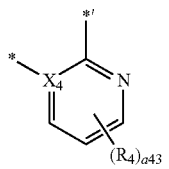
A4-1(6)
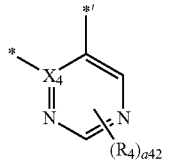
A4-1(7)
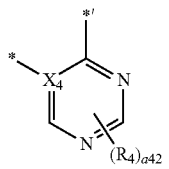
A4-1(8)
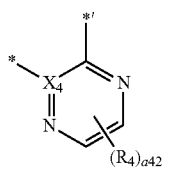
A4-1(9)
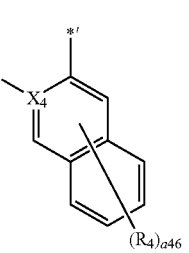
A4-1(10)
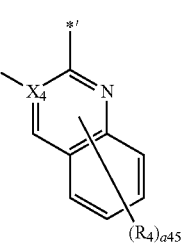

A4-1(11) 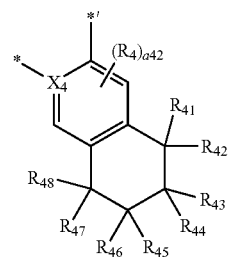
A4-1(12) 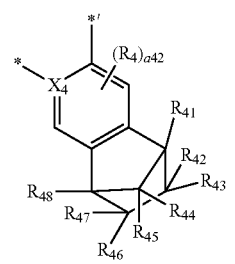
A4-1(13) 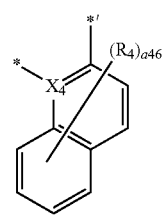
A4-1(14) 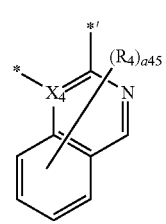
A4-1(15) 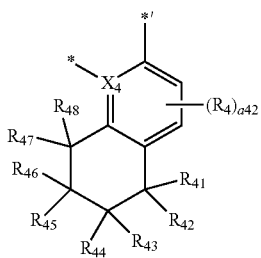
A4-1(16) 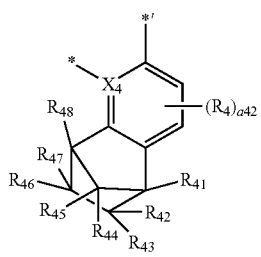
A4-1(17) 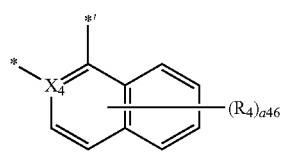
A4-1(18) 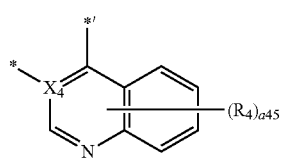
A4-1(19) 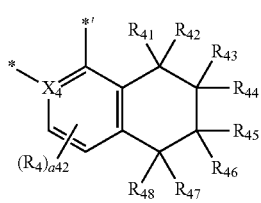
A4-1(20) 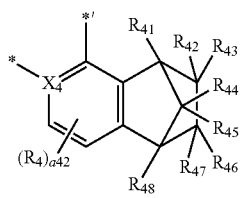
A4-1(21) 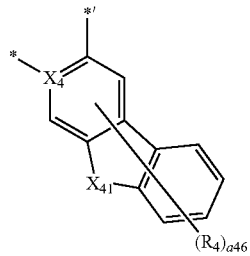
A4-1(22) 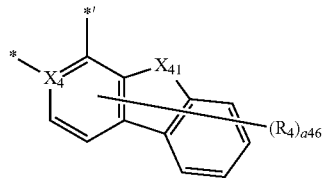
A4-1(23) 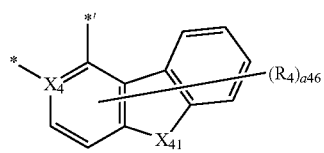
A4-1(24) 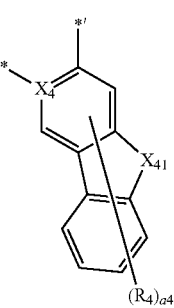

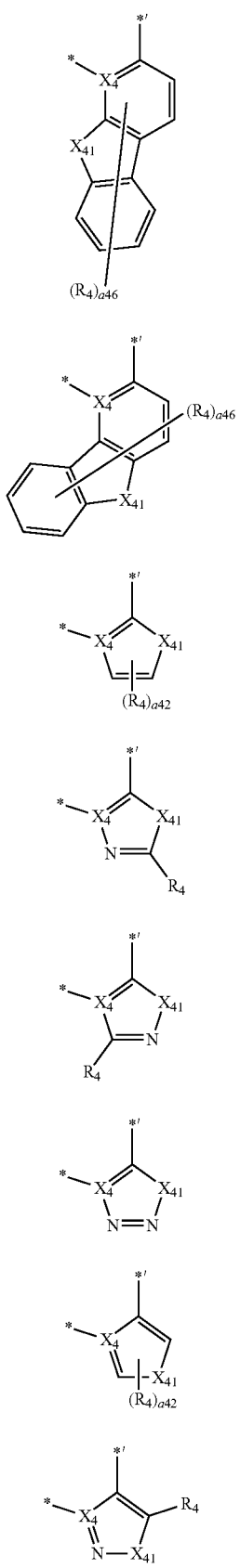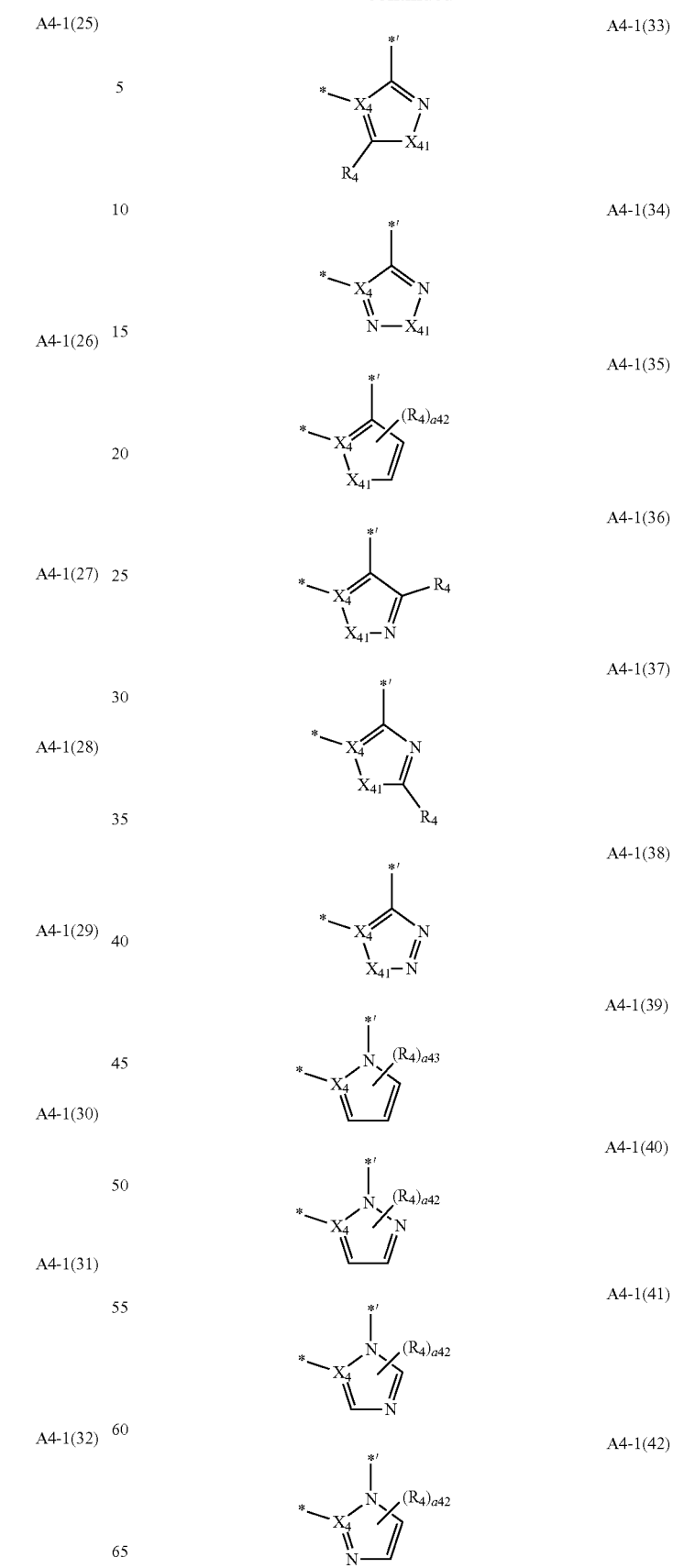

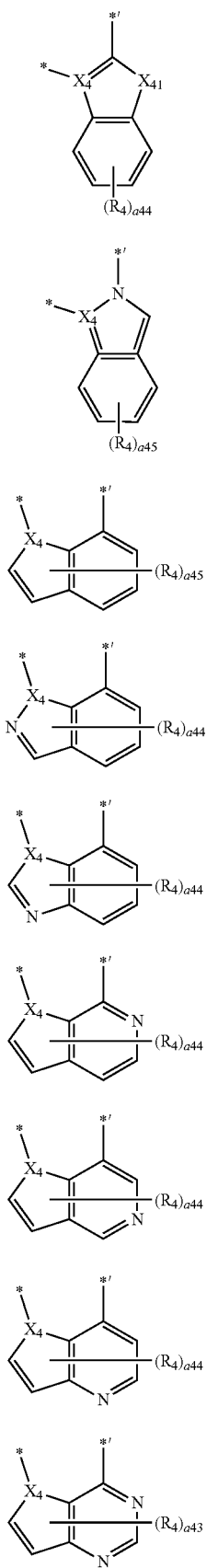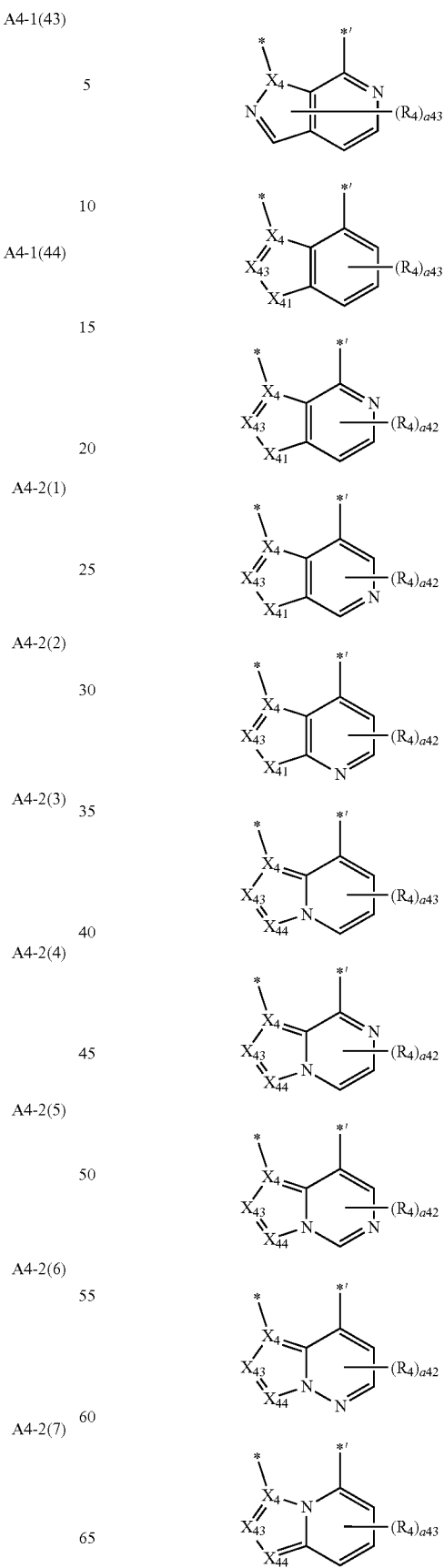

A4-2(18) 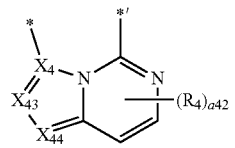
A4-2(19) 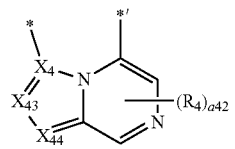
A4-2(20) 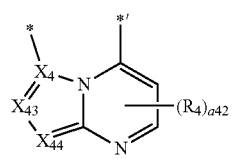
A4-2(21) 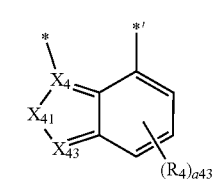
A4-2(22) 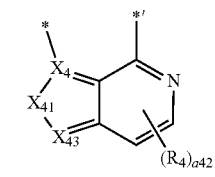
A4-2(23) 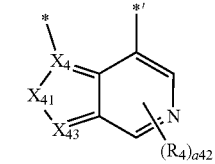
A4-2(24) 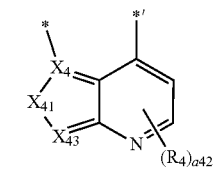
A4-2(25) 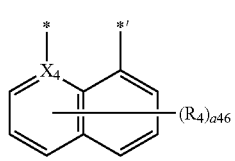
A4-2(26) 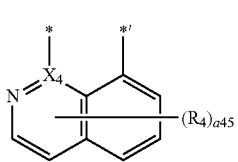
A4-2(27) 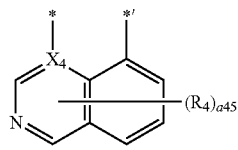
A4-2(28) 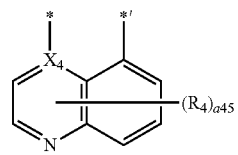
A4-2(29) 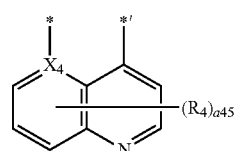
A4-2(30) 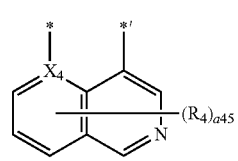
A4-2(31) 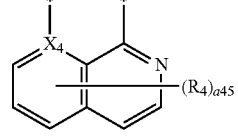
A4-2(32) 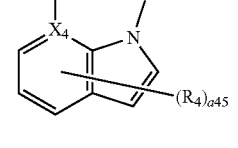
A4-2(33) 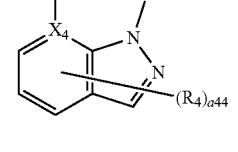
A4-2(34) 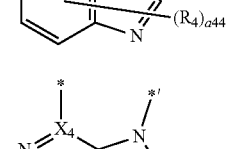
A4-2(35) 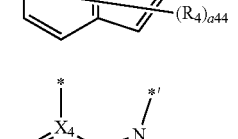
A4-2(36)

-continued
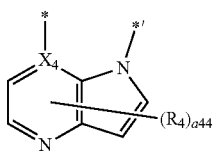 A4-2(37)
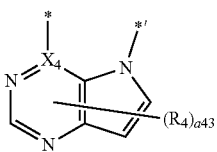 A4-2(38)
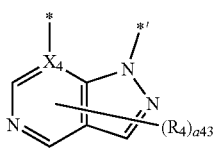 A4-2(39)
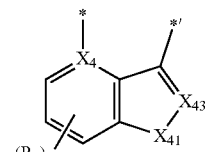 A4-2(40)
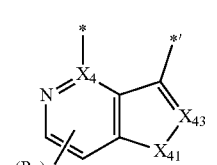 A4-2(41)
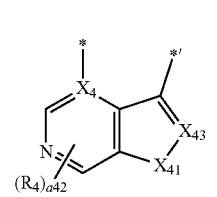 A4-2(42)
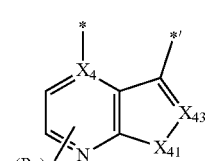 A4-2(43)
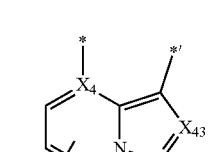 A4-2(44)
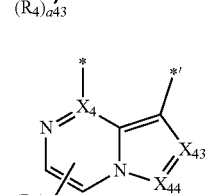 A4-2(45)
-continued
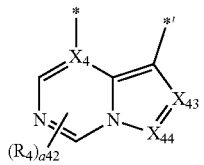 A4-2(46)
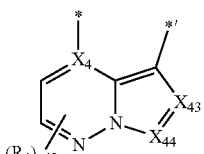 A4-2(47)
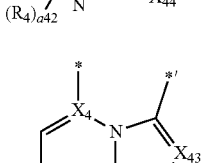 A4-2(48)
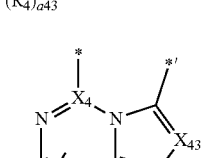 A4-2(49)
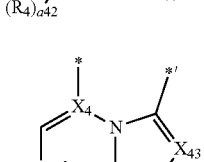 A4-2(50)
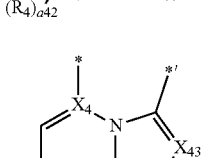 A4-2(51)
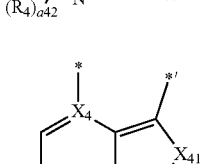 A4-2(52)
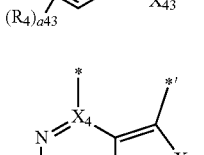 A4-2(53)
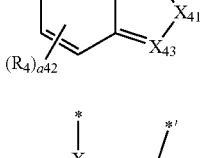 A4-2(54)

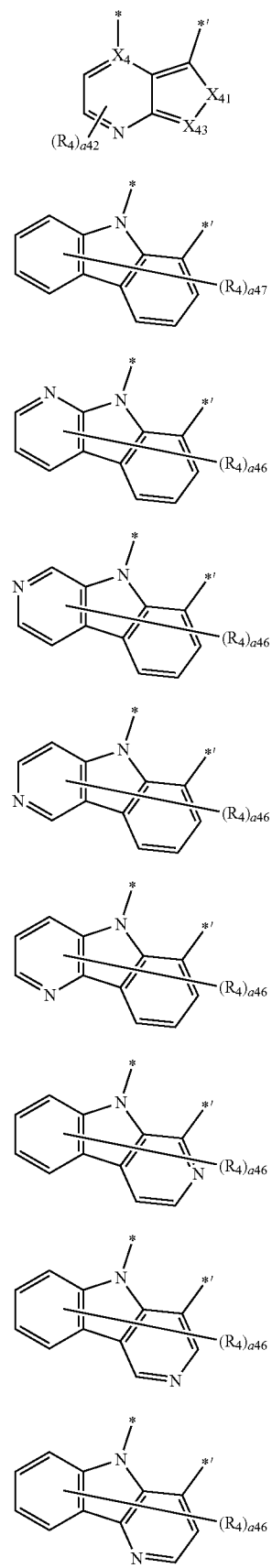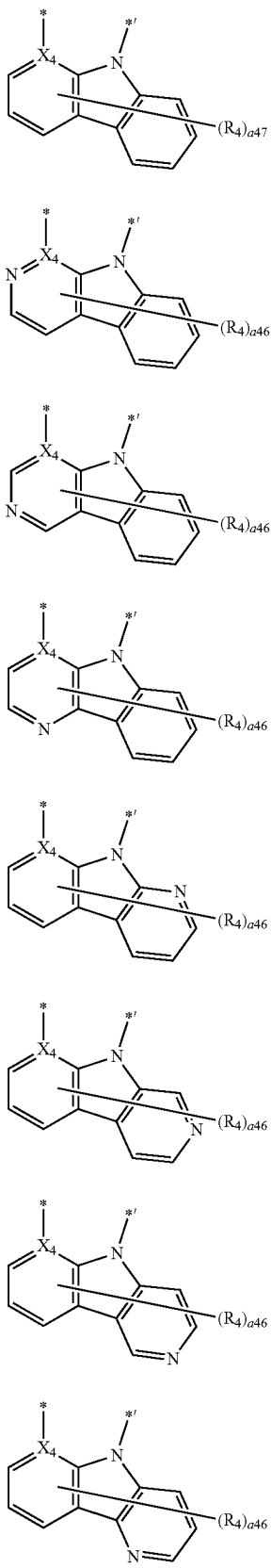

-continued

A14-1
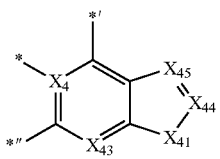

A14-2
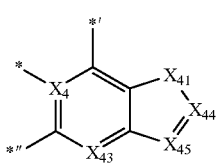

A14-3
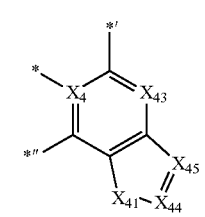

A14-4
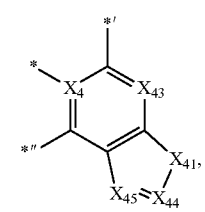

wherein, in Formulae A4-1 to A4-6, A4-1(1) to A4-1(44), A4-2(1) to A4-2(71),
$X_4$ and $R_4$ are respectively the same as described in claim 1,
$X_{41}$ is O, S, N($R_{41}$), C($R_{41}$)($R_{42}$), or Si($R_{41}$)($R_{42}$),
$X_{42}$ is N or C($R_{42}$),
$X_{43}$ is N or C($R_{43}$),
$X_{44}$ is N or C($R_{44}$),
$X_{45}$ is N or C($R_{45}$),
$R_{41}$ to $R_{48}$ are respectively the same as described in connection with $R_4$,
a47 is an integer from 0 to 7,
a46 is an integer from 0 to 6,
a45 is an integer from 0 to 5,
a44 is an integer from 0 to 4,
a43 is an integer from 0 to 3,
a42 is an integer from 0 to 2,
\* indicates a binding site to M in Formula 1,
\*' indicates a binding site to $T_3$ in Formula 1, and
\*" indicates a binding site to $T_4$ in Formula 1.

11. The organometallic compound of claim 10, wherein $T_3$ is a single bond, and a moiety represented by

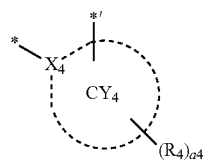

is represented by one selected from Formulae A4-1 to A4-6, A4-1(1) to A4-1(44), and A4-2(1) to A4-2(71).

12. The organometallic compound of claim 1, wherein, in Formula 1,

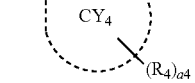

is selected from groups represented by Formulae CY2-1 to CY2-6, a moiety represented by

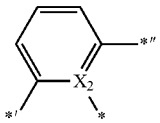

is selected from groups represented by Formulae CY3-1 to CY3-6, and a moiety represented by

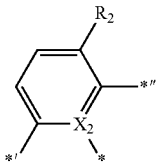

is selected from groups represented by Formulae CY4-1 to CY4-15:

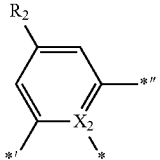
CY2-1

CY2-2

CY2-3

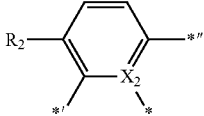
CY2-4

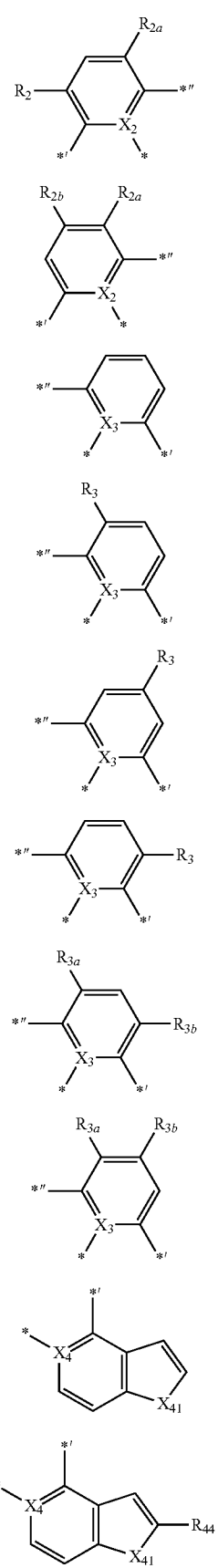
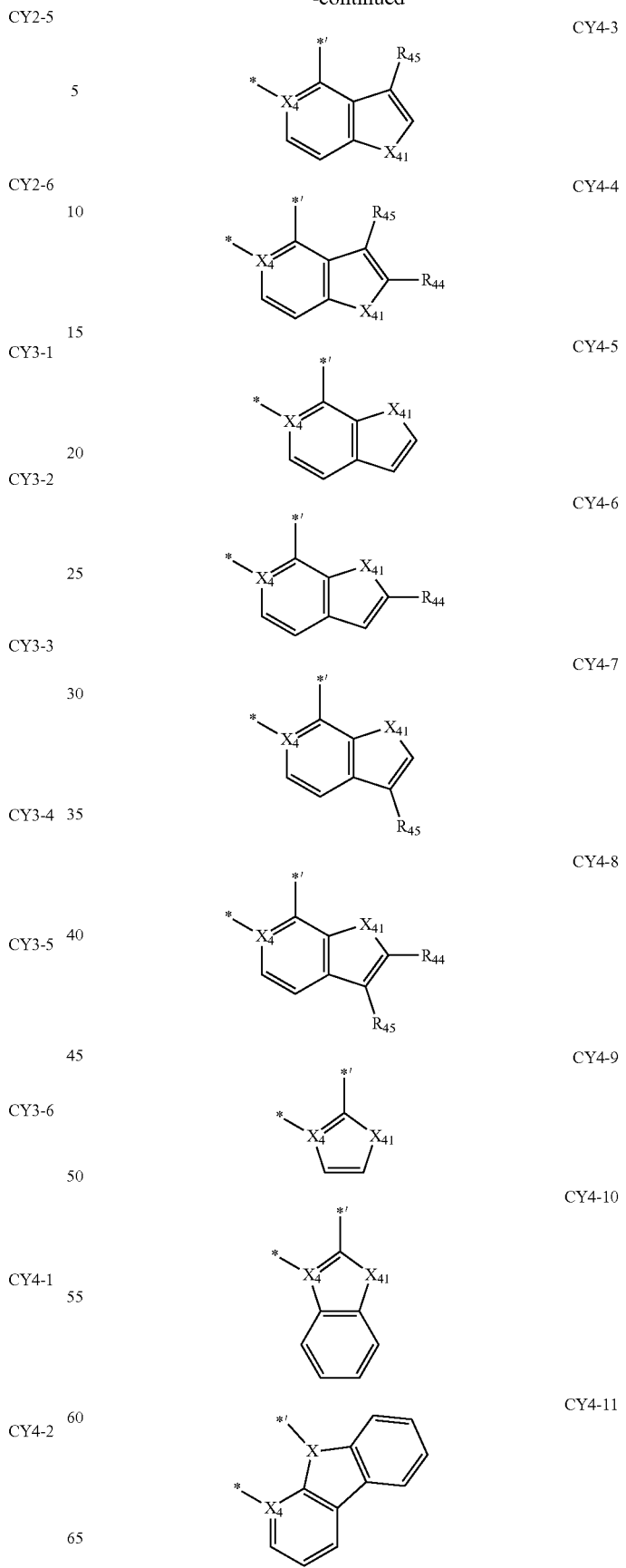

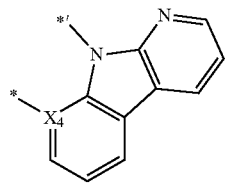

CY4-12

CY4-13

CY4-14

CY4-15 wherein, in Formulae CY2-1 to CY2-6, CY3-1 to CY3-6, and CY4-1 to CY4-15, $X_2$ to $X_4$, $R_2$, and $R_3$, are respectively the same as described in claim 1, $X_{41}$ is O, S, $N(R_{41})$, $C(R_{41})(R_{42})$, or $Si(R_{41})(R_{42})$, $R_{2a}$ and $R_{2b}$ are respectively the same as described in connection with $R_2$ in claim 1, $R_{3a}$ and $R_{3b}$ are respectively the same as described in connection with $R_3$ in claim 1, $R_{41}$, $R_{42}$, $R_{44}$, and $R_{45}$ are respectively the same as described in connection with $R_4$ in claim 1, $R_2$, $R_{2a}$, $R_{2b}$, $R_3$, $R_{3a}$, $R_{3b}$, $R_{41}$, $R_{42}$, $R_{44}$, and $R_{45}$ are not each independently hydrogen, indicates a binding site to M in Formula 1, in Formulae CY2-1 to CY2-6, *' indicates a binding site to $T_1$ in Formula 1, and *'" indicates a binding site to $T_2$ in Formula 1, in Formulae CY3-1 to CY3-6, *' indicates a binding site to $T_3$ in Formula 1, and *'" indicates a binding site to $T_2$ in Formula 1, and in Formulae CY4-1 to CY4-15, *' indicates a binding site to $T_3$ in Formula 1.

13. The organometallic compound of claim 1, wherein the organometallic compound is represented by one selected from Formulae 1(1) to 1(6):

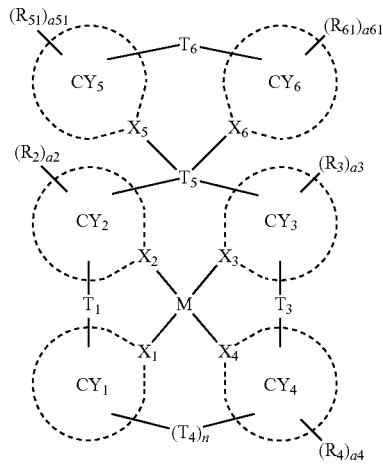

Formula 1(1)

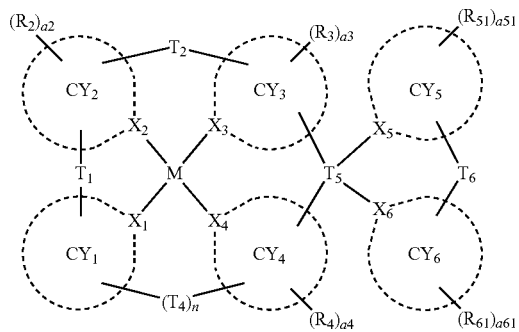

Formula 1(2)

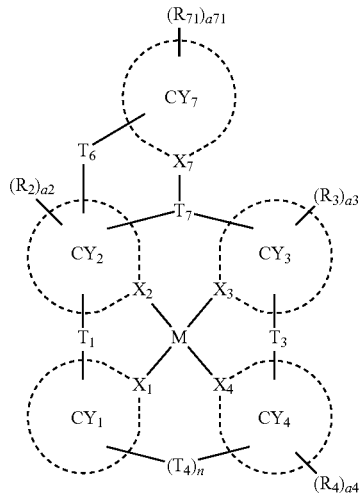

Formula 1(3)

205
-continued

Formula 1(4)

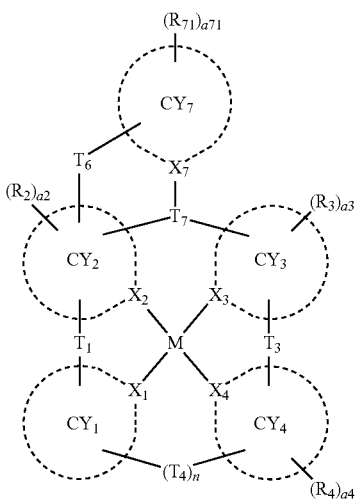

Formula 1(5)

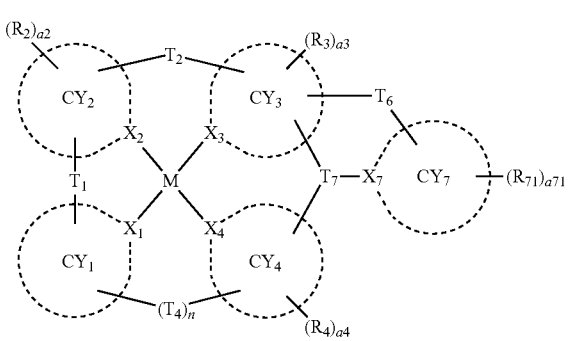

Formula 1(6)

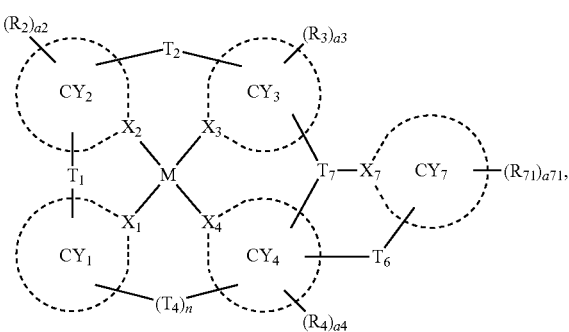

wherein, in Formulae 1(1) to 1(6),

M, $X_1$ to $X_4$, $CY_1$ to $CY_4$, $T_1$ to $T_4$, n, $R_2$ to $R_4$, and a2 to a4 are respectively the same as described in claim 1, $CY_5$ to $CY_7$ are each independently a $C_5$-$C_{30}$ carbocyclic group or a $C_1$-$C_{30}$ heterocyclic group, $X_5$ to $X_7$ are each independently C or N, $R_{51}$, $R_{61}$, and $R_{71}$ are respectively the same as described in connection with $R_2$ in claim 1, a51, a61, and a71 are each independently 0, 1, 2, or 3, $T_5$ is C, Si, or Ge, $T_7$ is B, N, or P, $T_6$ is selected from a single bond, *—N[$(L_7)_{c7}$-$(R_7)$]—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(=O)—*', *—S(=O)—*', *—C($R_7$)=C($R_8$)—*', *—C(=S)—*', and *—C≡C—*', $L_7$ and c7 are respectively the same as described in connection with $L_5$ and c5 in claim 1, and $R_7$ and $R_8$ are respectively the same as described in connection with $R_5$ in claim 1.

14. An organic light-emitting device comprising:

a first electrode;

a second electrode; and an organic layer disposed between the first electrode and the second electrode, wherein the organic layer comprises an emission layer and the organometallic compound of claim 1.

15. The organic light-emitting device of claim 14, wherein the first electrode is an anode, the second electrode is a cathode, the organic layer further comprises a hole transport region disposed between the first electrode and the emission layer and an electron transport region disposed between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

16. The organic light-emitting device of claim 14, wherein the emission layer comprises the organometallic compound.

17. The organic light-emitting device of claim 16, wherein the emission layer further comprises a host, wherein an amount of the host is greater than that of the organometallic compound.

18. A diagnostic composition comprising at least one of the organometallic compound of claim 1.

19. An organometallic compound selected from Compounds 6 to 15:

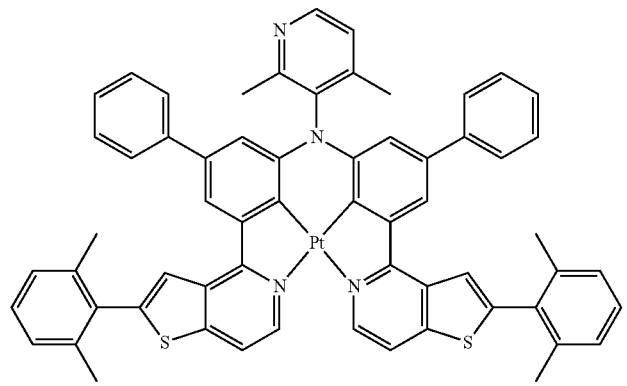
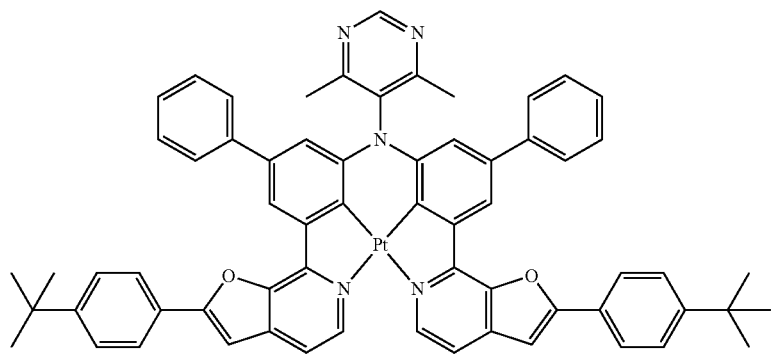
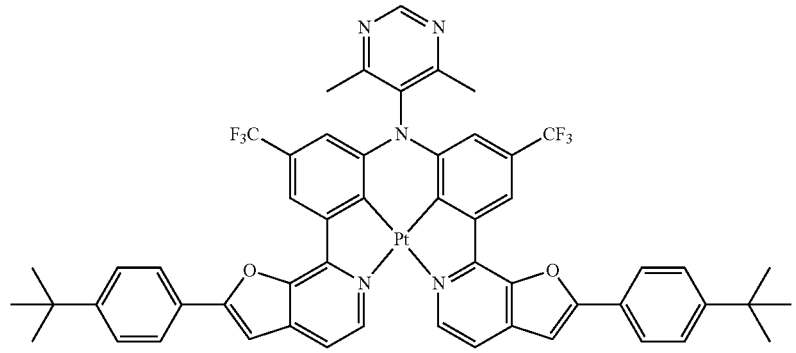
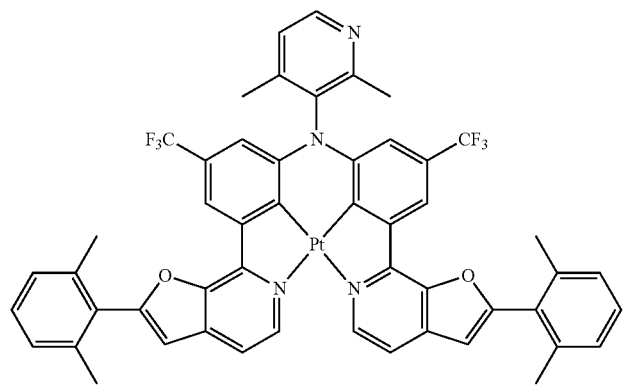

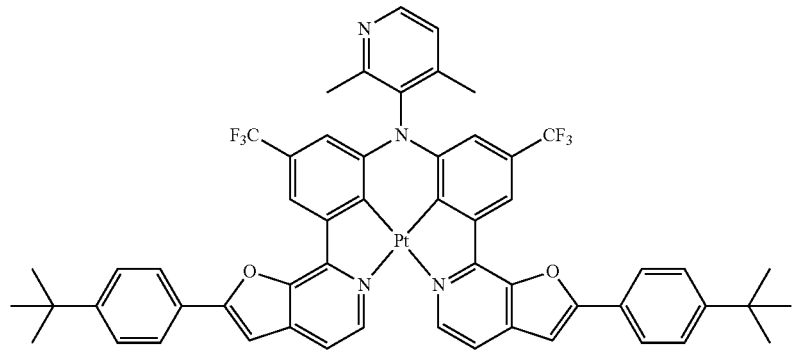
10
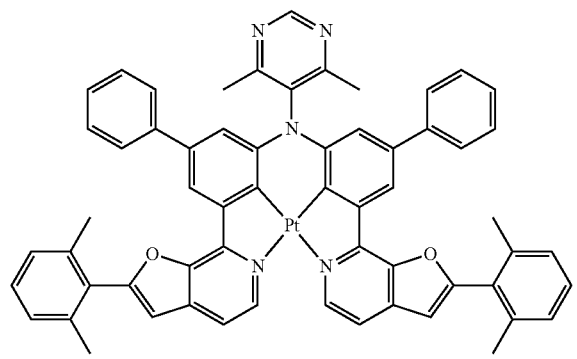
11
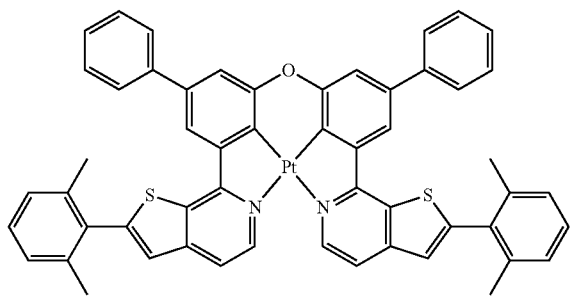
12
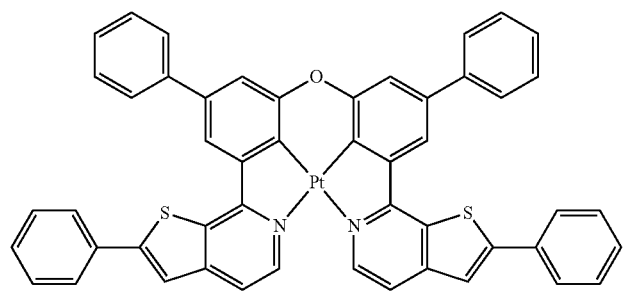
13
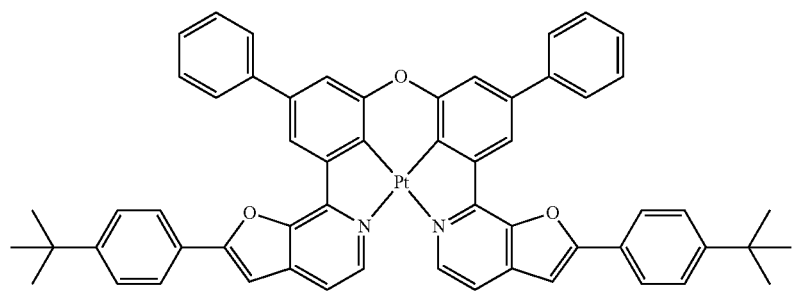
14

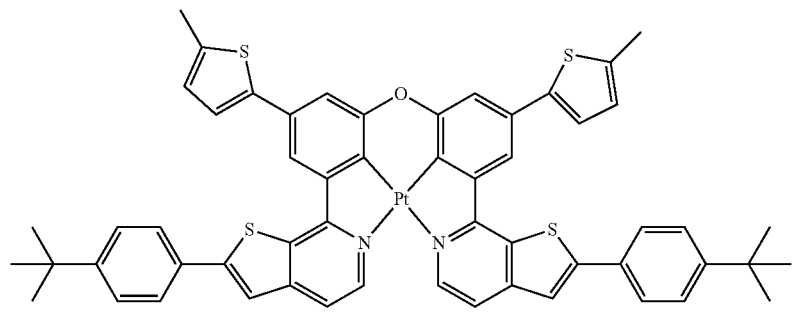
wherein, in Compounds 6 to 15, Ph indicates a phenyl group.
* * * * *